(12) United States Patent
Satou et al.

(10) Patent No.: US 6,992,385 B2
(45) Date of Patent: Jan. 31, 2006

(54) SEMICONDUCTOR DEVICE, A METHOD OF MANUFACTURING THE SAME AND AN ELECTRONIC DEVICE

(75) Inventors: Yukihiro Satou, Takasaki (JP); Takeshi Otani, Takasaki (JP); Hiroyuki Takahashi, Takasaki (JP); Toshiyuki Hata, Maebashi (JP); Ichio Shimizu, Tamamura (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/755,375

(22) Filed: Jan. 13, 2004

(65) Prior Publication Data
US 2004/0169289 A1 Sep. 2, 2004

(30) Foreign Application Priority Data
Feb. 28, 2003 (JP) ........................ 2003-054638

(51) Int. Cl.
*H01L 23/48* (2006.01)

(52) U.S. Cl. .................... 257/735; 257/666; 257/667
(58) Field of Classification Search ............... 257/735, 257/666, 667, 671, 675, 678, 690, 701
See application file for complete search history.

(56) References Cited

U.S. PATENT DOCUMENTS 6,777,800 B2 * 8/2004 Madrid et al. ............... 257/690
2003/0122232 A1 * 7/2003 Hirano et al. ............... 257/678

FOREIGN PATENT DOCUMENTS

JP 11-019431 1/1999

* cited by examiner

*Primary Examiner*—Eddie Lee
*Assistant Examiner*—Douglas W. Owens
(74) *Attorney, Agent, or Firm*—Mattingly, Stanger, Malur & Brundidge, P.C.

(57) ABSTRACT

A novel semiconductor device high in both heat dissipating property and connection reliability in mounting is to be provided. The semiconductor device comprises a semiconductor chip, a resin sealing member for sealing the semiconductor chip, a first conductive member connected to a first electrode formed on a first main surface of the semiconductor chip, and a second conductive member connected to a second electrode formed on a second main surface opposite to the first main surface of the semiconductor chip, the first conductive member being exposed from a first main surface of the resin sealing member, and the second conductive member being exposed from a second main surface opposite to the first main surface of the resin sealing member and also from side faces of the resin sealing member.

22 Claims, 46 Drawing Sheets

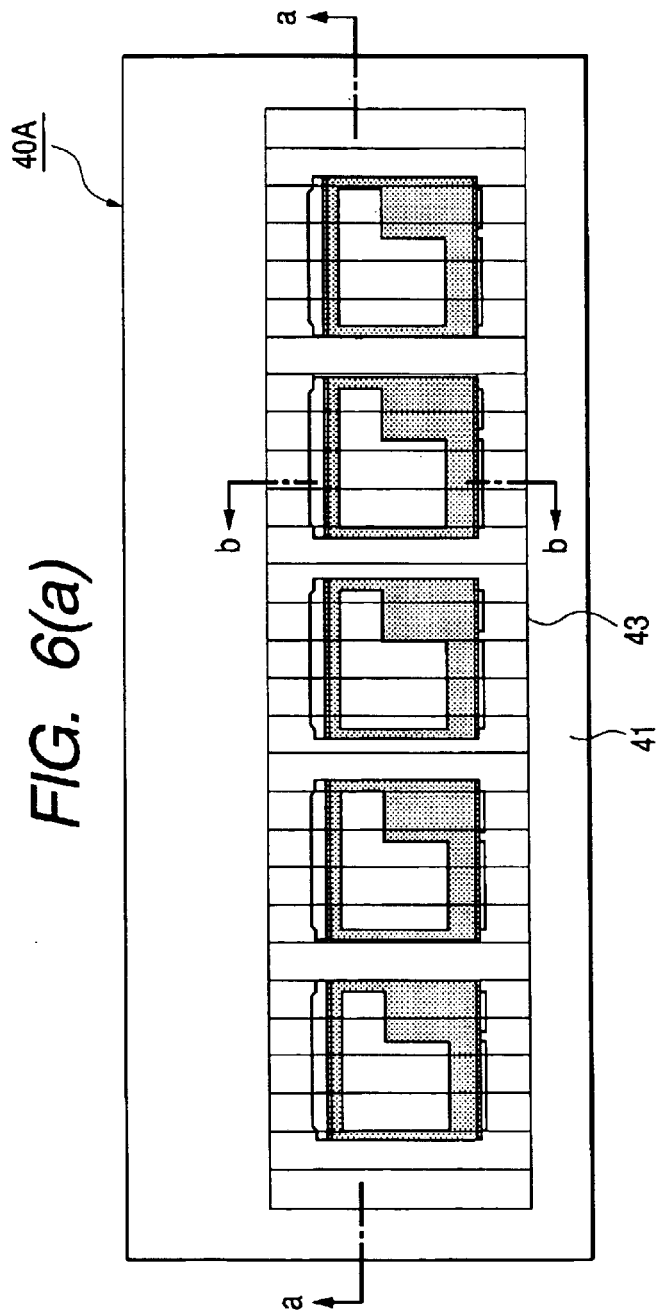
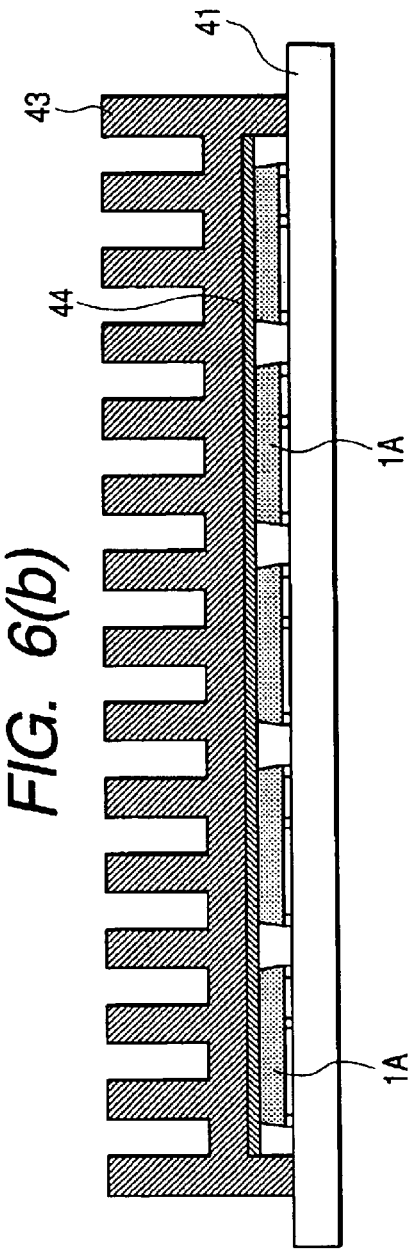

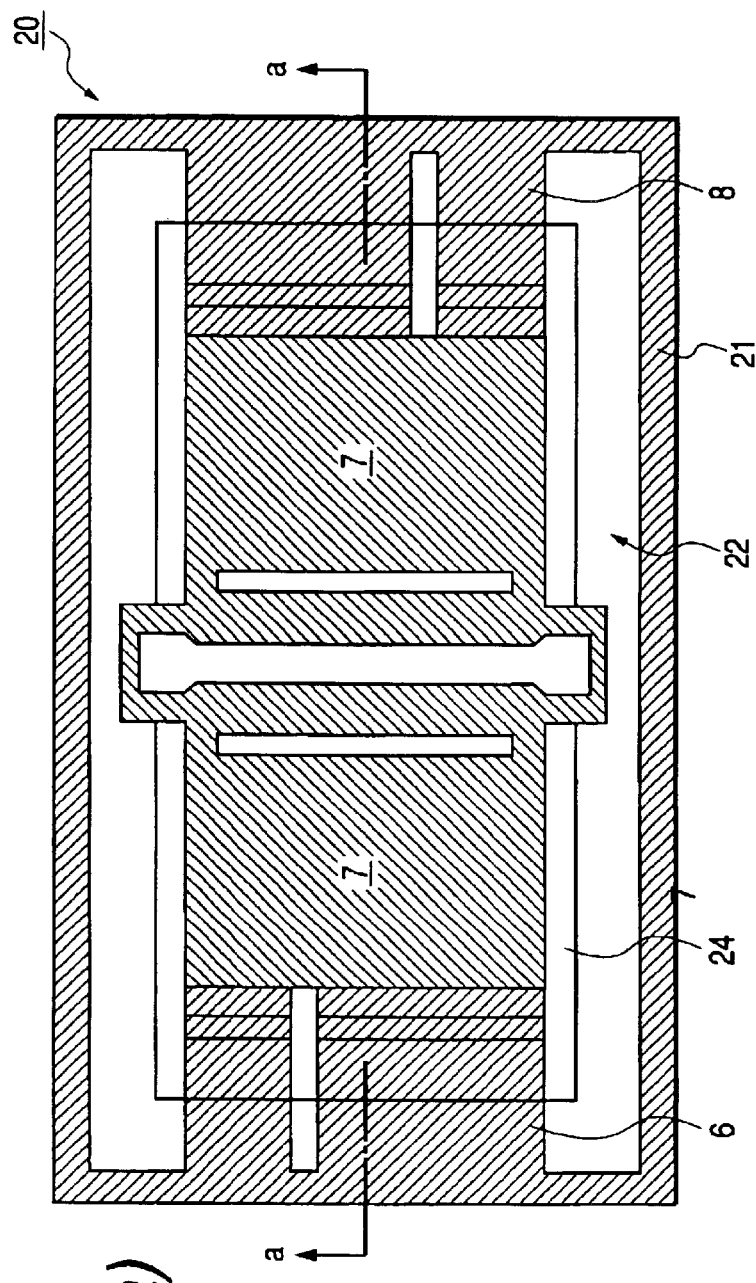
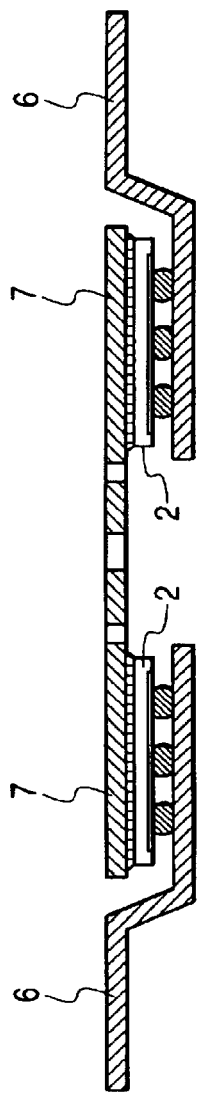
FIG. 18(a)
FIG. 18(b)

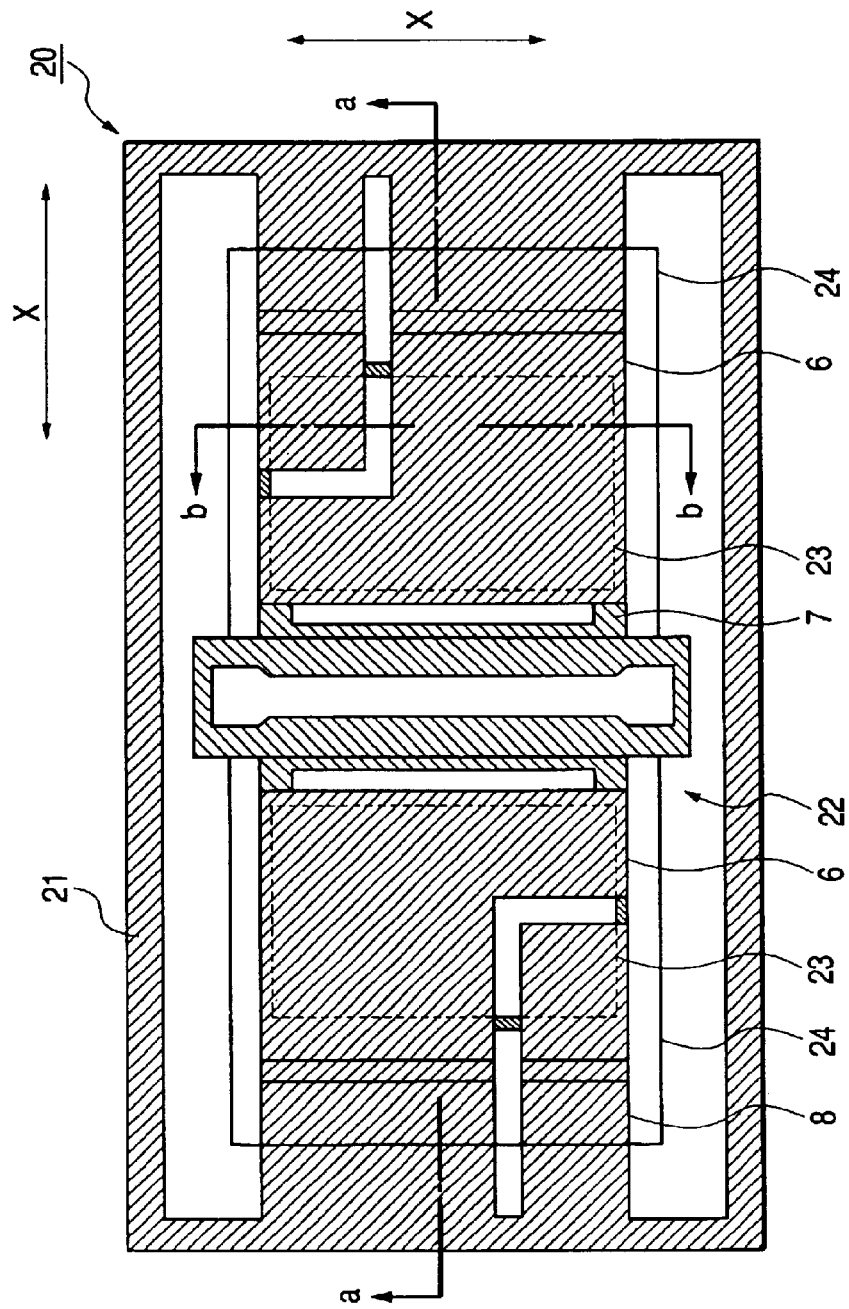

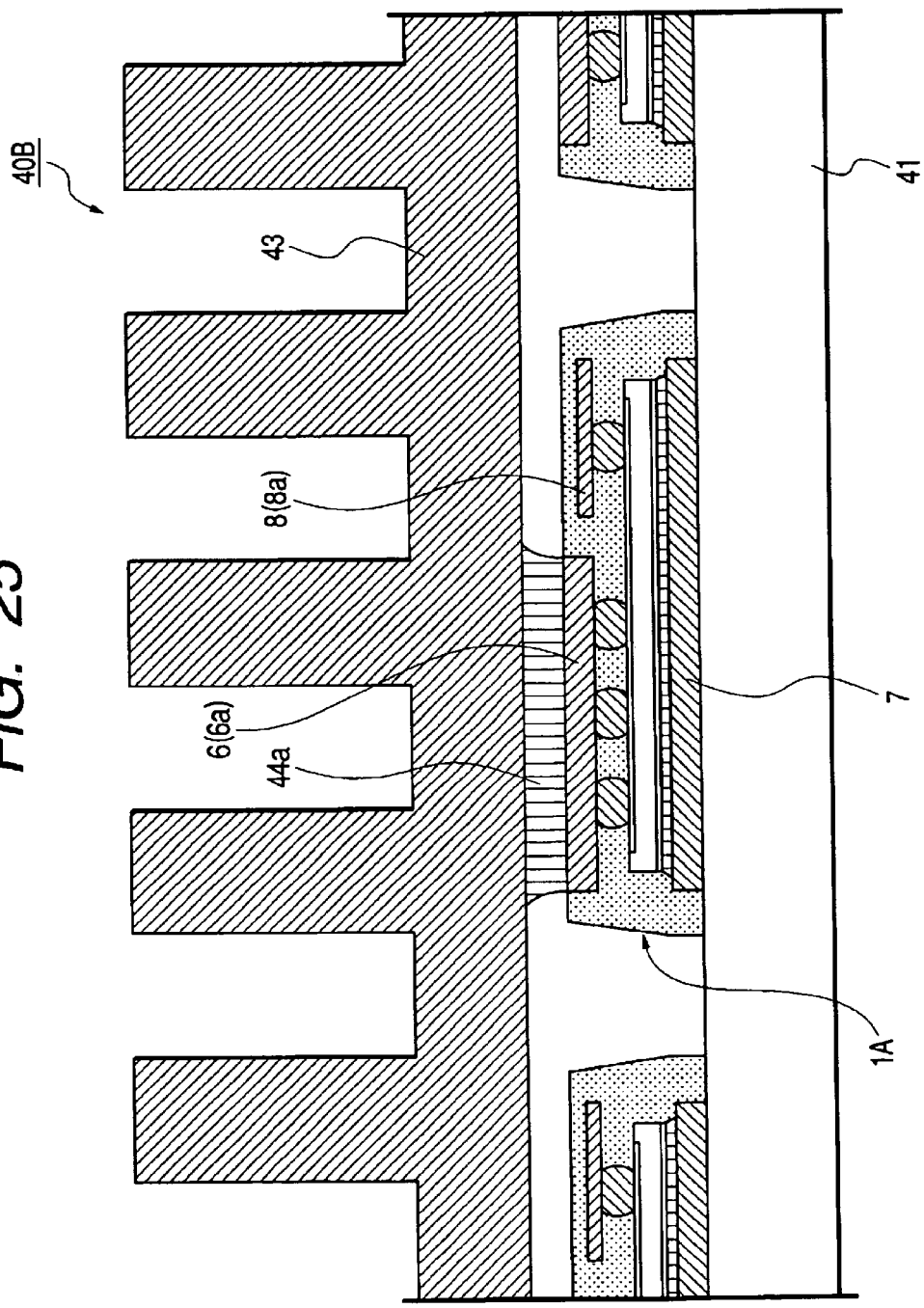

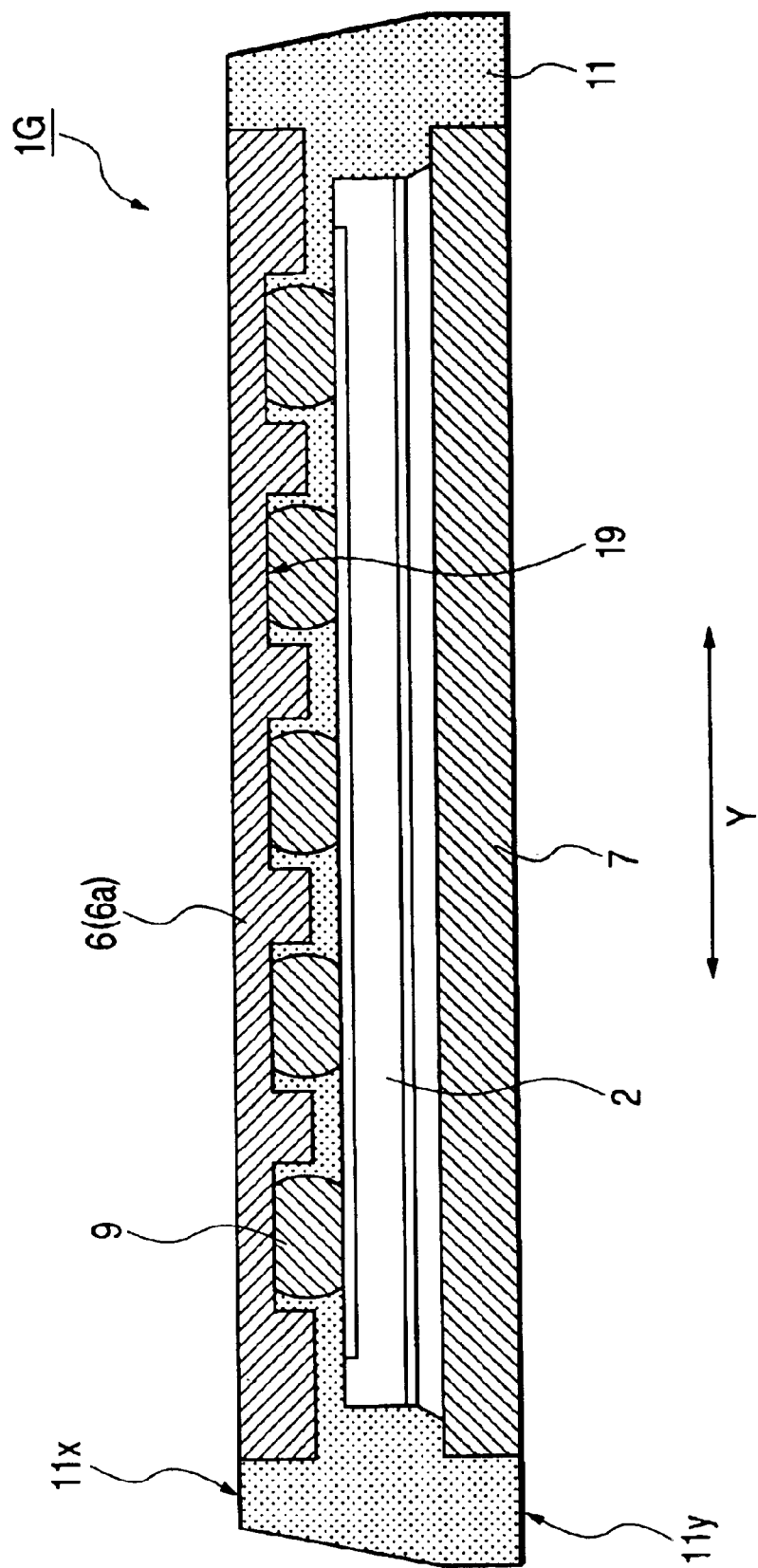

SEMICONDUCTOR DEVICE, A METHOD OF MANUFACTURING THE SAME AND AN ELECTRONIC DEVICE

BACKGROUND OF THE INVENTION

The present invention relates to a packaging technique for a semiconductor device.

As one of semiconductor devices there is known a power transistor used as a switching element in, for example, a power amplifier circuit or a power supply circuit. As to the power transistor, there have been proposed various structures, which have been produced on a commercial basis. For example, in Japanese Published Unexamined Patent Application No. 2000-223634 (Patent Literature 1) there is disclosed a surface-mounted type power transistor. In the same publication (FIG. 17 and paragraphs [0058] and [0059] in the specification) there also is disclosed a technique wherein a portion of lead terminals bonded to electrodes on a main surface of a semiconductor chip are exposed from an upper surface of a resin housing to decrease the heat resistance of a semiconductor package.

[Patent Literature 1]

Japanese Published Unexamined Patent Application No. 2000-223634

SUMMARY OF THE INVENTION

In the power transistor, since the amount of an electric current handled therein is large, it is desired to provide a package structure which is superior in heat dissipating property for releasing heat from a semiconductor chip to the exterior and which is low in cost and high in reliability.

In order to obtain a package structure low in cost and high in reliability, it is effective to seal a semiconductor chip with resin. In this case, however, the heat dissipating property is deteriorated because the resin is low in thermal conductivity.

In a package wherein a semiconductor chip is sealed with resin, it is effective to adopt such a both upper/lower-surface heat dissipating structure as is disclosed in the foregoing Patent Literature 1 wherein a portion of lead terminals connected to electrodes on a main surface of a semiconductor chip are exposed from an upper surface of a resin housing, and die terminals connected to electrodes on a back side opposite to the main surface of the semiconductor chip are exposed from a lower surface opposite to the upper surface of the resin housing.

In the both upper-/lower-surface heat dissipating structure disclosed in the Patent Literature 1, however, since die terminals are not exposed from side faces of the resin housing, it is difficult to form solder fillet which is necessary for improving the connection reliability in soldering at the time of packaging. It is also difficult to judge whether soldering is good or bad by visual inspection.

Besides, since the lead terminals do not have any portion positioned in the interior of the resin housing and the entire upper surface of each lead terminal is exposed from the resin housing, the lead terminals are apt to come off from the resin housing, thus resulting in deterioration of reliability.

It is an object of the present invention to provide a novel semiconductor device high in heat dissipating property and also high in connection reliability in packaging.

It is another object of the present invention to provide a novel semiconductor device high in heat dissipating property and able to judge whether soldering is good or bad by visual inspection at the time of packaging.

It is a further object of the present invention to provide a novel semiconductor device high in both heat dissipating property and reliability.

It is still further object of the present invention to provide a novel semiconductor device high in heat dissipating property.

It is a still further object of the present invention to provide an electronic device high in heat dissipating property.

The above and other objects and novel features of the present invention will become apparent from the following description and the accompanying drawings.

Typical modes of the present invention as disclosed herein will be outlined below.

(1) A semiconductor device comprises:

a semiconductor chip having first and second main surfaces positioned on mutually opposite sides, a first electrode formed over the first main surface, and a second electrode formed over the second main surface;

a resin sealing member sealing the semiconductor chip, and having first and second main surfaces positioned on mutually opposite sides, the first main surface being positioned on the first main surface side of the semiconductor chip, and the second main surface being positioned on the second main surface side of the semiconductor chip;

a first conductive member, in which one end side is positioned over the first electrode of the semiconductor chip and connected to the first electrode of the semiconductor chip through a connecting means, and the other end side opposite to the one end side is positioned on the second main surface side of the resin sealing member relative to the one end side and exposed from the resin sealing member; and a second conductive member connected to the second electrode of the semiconductor chip through a second connecting means, wherein the one end side of the first conductive member is exposed from the first main surface of the resin sealing member, and the second conductive member is exposed from the second main surface and side faces of the resin sealing member.

(2) In the semiconductor device of the above (1), the other end side of the first conductive member is positioned on a first side-face side of the resin sealing member, and the second conductive member is exposed from a second side face opposite to the first side face of the resin sealing member.

(3) In the semiconductor device of the above (1), the first electrode of the semiconductor chip is a source electrode and the second electrode of the semiconductor chip is a drain electrode, or the first electrode of the semiconductor chip is a drain electrode and the second electrode of the semiconductor chip is a source electrode.

(4) A semiconductor device comprises:

a semiconductor chip having first and second main surfaces positioned on mutually opposite sides, a first electrode formed over the first main surface, and a second electrode formed over the second main surface;

a resin sealing member sealing the semiconductor chip and having first and second main surfaces positioned on mutually opposite sides, the first main surface being positioned on the first main surface side of the semiconductor chip, and the second main surface being positioned on the second main surface side of the semiconductor chip;

a first conductive member having a first portion, a second portion, and a third portion, the first portion being positioned over the first electrode of the semiconductor chip, connected to the first electrode of the semiconductor chip through a first connecting means and exposed from the first main surface of the resin sealing member, the second portion being formed integrally with the first portion and positioned in the interior of the resin sealing member, and the third portion being formed integrally with the second portion and exposed from the second main surface of the resin sealing member; and a second conductive member connected to the second electrode of the semiconductor chip through a second connecting means and exposed from the second main surface of the resin sealing member.

(5) In the semiconductor device of the above (4), the third portion of the first conductive member is exposed from a first side face of the resin sealing member, and the second conductive member is exposed from a second side face opposite to the first side face of the resin sealing member.

(6) In the semiconductor device of the above (4), the first electrode of the semiconductor chip is a drain electrode and the second electrode of the semiconductor chip is a source electrode.

(7) A semiconductor comprises:

a semiconductor chip, the semiconductor chip having first and second main surfaces positioned on mutually opposite sides, first and second electrodes formed over the first main surface, and a third electrode formed over the second main surface;

a resin sealing member sealing the semiconductor chip and having first and second main surfaces positioned on mutually opposite sides, the first main surface being positioned on the first main surface side of the semiconductor chip, and the second main surface being positioned on the second main surface side of the semiconductor chip;

a first conductive member having a first portion, a second portion, and a third portion, the first portion being connected to the first electrode of the semiconductor chip through a first connecting means, the second portion being formed integrally with the first portion, and the third portion being formed integrally with the second portion and positioned on the second main surface side of the resin sealing member relative to the first portion;

a second conductive member having a first portion, a second portion, and a third portion, the first portion being connected to the second electrode of the semiconductor chip through a second connecting means, the second portion being formed integrally with the first portion, and the third portion being formed integrally with the second portion and positioned on the second main surface side of the resin sealing member relative to the first portion; and a third conductive member connected to the third electrode of the semiconductor chip through a third connecting means and exposed from the second main surface of the resin sealing member, wherein the first portion of the first conductive member is exposed from the first main surface of the resin sealing member, and the first portion of the second conductive member is positioned in the interior of the resin sealing member.

(8) In the semiconductor device of the above (7), the first portion of the second conductive member is smaller in thickness than the first portion of the first conductive member of the first conductive member.

(9) In the semiconductor device of the above (7), the second portions of the first and second conductive members are positioned in the interior of the resin sealing member, and the third portions of the first and second conductive members are exposed from the second main surface of the resin sealing member.

(10) In the semiconductor device of the above (7), the third portions of the first and second conductive members are exposed from a first side face of the resin sealing member, and the third conductive member is exposed from a second side face opposed to the first side face of the resin sealing member.

(11) In the semiconductor device of the above (7), the first electrode of the semiconductor chip is a source electrode, the second electrode of the semiconductor chip is a gate electrode, and the third electrode of the semiconductor chip is a drain electrode. Alternatively, the first electrode of the semiconductor chip is a drain electrode, the second electrode of the semiconductor chip is a gate electrode, and the third electrode of the semiconductor chip is a source electrode.

(12) A semiconductor device comprises:

a semiconductor chip having first and second main surfaces positioned on mutually opposite sides, first and second electrodes formed over the first main surface, and a third electrode formed over the second main surface;

a resin sealing member sealing the semiconductor chip and having first and second main surfaces positioned on mutually opposite sides, the first main surface being positioned on the first main surface side of the semiconductor chip, and the second main surface being positioned on the second main surface side of the semiconductor chip;

a first conductive member having a first portion, a second portion, and a third portion, the first portion being connected to the first electrode of the semiconductor chip through a first connecting means, the second portion being formed integrally with the first portion, and the third portion being positioned on the second main surface side of the resin sealing member relative to the first portion;

a second conductive member positioned outside the semiconductor chip and on the second main surface side of the resin sealing member relative to the first portion of the first conductive member; and a third conductive member connected to the third electrode of the semiconductor chip through a second connecting means and exposed from the second main surface of the resin sealing member, wherein the first portion of the first conductive member is exposed from the first main surface of the resin sealing member, and the second conductive member is connected electrically to the second electrode of the semiconductor chip through a bonding wire.

(13) In the semiconductor device of the above (12), the second portion of the first conductive member is positioned in the interior of the resin sealing member, and the third portion of the first conductive member and the second conductive member are exposed from the second main surface of the resin sealing member.

(14) A semiconductor device comprises:

a semiconductor chip having first and second main surfaces positioned on mutually opposite sides, a first electrode formed over the first main surface, and a second electrode formed over the second main surface;

a resin sealing member sealing the semiconductor chip, and having first and second main surfaces positioned on mutually opposite sides, the first main surface being positioned on the first main surface side of the semiconductor chip, and the second main surface being positioned on the second main surface side of the semiconductor chip;

a first conductive member having a first portion, a second portion, and a third portion, the first portion being connected to the first electrode of the semiconductor chip through a first connecting means, the second portion being formed integrally with the first portion, and the third portion being formed integrally with the second portion and positioned on the second main surface side of the resin sealing member relative to the first portion; and a second conductive member having a first portion connected to the second electrode of the semiconductor chip through a second connecting means and a second portion formed integrally with the first portion and larger in thickness than the first portion, wherein the first portion of the second conductive member is exposed from the second main surface of the resin sealing member, and the second portion of the second conductive member is exposed from the first and second main surfaces of the resin sealing member.

(15) In the semiconductor device of the above (14), the second portion of the second conductive member is exposed from side faces of the resin sealing member.

(16) In the semiconductor device of the above (14), the first electrode of the semiconductor chip is a source electrode and the second electrode of the semiconductor chip is a drain electrode. Alternatively, the first electrode of the semiconductor chip is a drain electrode and the second electrode of the semiconductor chip is a source electrode.

(17) A semiconductor device comprises:

a semiconductor chip having first and second main surfaces positioned on mutually opposite sides, a first electrode formed over the first main surface, and a second electrode formed over the second main surface;

a resin sealing member sealing the semiconductor chip and having first and second main surfaces positioned on mutually opposite sides, the first main surface being positioned on the first main surface side of the semiconductor chip, and the second main surface being positioned on the second main surface side of the semiconductor chip;

a first conductive member having a first portion connected to the first electrode of the semiconductor chip through a first connecting means and a second portion formed integrally with the first portion and smaller in thickness than the first portion; and a second conductive member having a first portion connected to the second electrode of the semiconductor chip through a second connecting means and a second portion formed integrally with the first portion and larger in thickness than the first portion, wherein the first and second portions of the first conductive member are exposed from the first main surface of the resin sealing member, the second portion of the first conductive member is exposed from the second main surface of the resin sealing member, the first portion of the second conductive member is positioned in the interior of the resin sealing member, and the second portion of the second conductive member is exposed from the second main surface of the resin sealing member.

(18) In the semiconductor device of the above (17), the second portion of the first conductive member is exposed from side faces of the resin sealing member.

(19) In the semiconductor device of the above (17), the first electrode of the semiconductor chip is a drain electrode and the second electrode of the semiconductor chip is a source electrode. Alternatively, the first electrode of the semiconductor chip is a source electrode and the second electrode of the semiconductor chip is a drain electrode.

(20) An electronic device comprises a wiring substrate, a semiconductor device mounted over the wiring substrate, and a heat dissipating member disposed over the semiconductor device, the semiconductor device comprising:

a semiconductor chip having first and second main surfaces positioned on mutually opposite sides, first and second electrodes formed over the first main surface, and a third electrode formed over the second main surface;

a resin sealing member sealing the semiconductor chip and having first and second main surfaces positioned on mutually opposite sides, the first main surface being positioned on the first main surface side of the semiconductor chip, and the second main surface being positioned on the second main surface side of the semiconductor chip;

a first conductive member having a first portion, a second portion, and a third portion, the first portion being connected to the first electrode of the semiconductor chip through the first connecting means and exposed from the first main surface of the resin sealing member, the second portion being formed integrally with the first portion, and the third portion being formed integrally with the second portion and exposed from the second main surface of the resin sealing member;

a second conductive member having a first portion, a second portion, and a third portion, the first portion being connected to the second electrode of the semiconductor chip through a second connecting means and positioned in the interior of the resin sealing member, the second portion being formed integrally with the first portion, and the third portion being exposed from the second main surface of the resin sealing member; and a third conductive member connected to the third electrode of the semiconductor chip through a third connecting means and exposed from the second main surface of the resin sealing member, wherein the third portions of the first and second conductive members, as well as the third conductive member, are soldered to electrodes formed over the wiring substrate, and the first portion of the first conductive member is connected to the heat dissipating member through a heat conducting member.

BRIEF DESCRIPTION OF THE DRAWINGS

FIGS. 6(a) and 6(b) illustrate a schematic construction of a regulator (electronic device) with the power transistor incorporated therein, in which FIG. 6(a) is a plan view and FIG. 6(b) is a sectional view taken along line a—a in FIG. 6(a);

FIGS. 11(a) and 11(b) are partially enlarged views of the lead frame of FIG. 10, in which FIG. 11(a) is a plan view and FIG. 11(b) is a sectional view taken along line a—a in FIG. 11(a);

FIGS. 16(a) to 16(d) illustrate dicing steps for dicing the semiconductor wafer into individual semiconductor chips in manufacturing the power transistor of the first embodiment, in which FIGS. 16(a) to 16(d) are sectional views;

FIGS. 17(a) and 17(b) illustrate a manufacturing step in manufacturing the power transistor of the first embodiment, in which FIG. 17(a) is a plan view and FIG. 17(b) is a sectional view taken along line a—a in FIG. 17(a);

FIGS. 18(a) and 18(b) illustrate a manufacturing step in manufacturing the power transistor of the first embodiment, in which FIG. 18(a) is a plan view and FIG. 18(b) is a sectional view taken along line a—a in FIG. 18(a);

FIG. 20 is a plan view illustrating a manufacturing step in manufacturing the power transistor of the first embodiment;

FIGS. 21(a) and 21(b) illustrate a manufacturing step in manufacturing the power transistor of the first embodiment, in which FIG. 21(a) is a sectional view taken at a position corresponding to line a—a in FIG. 20 and FIG. 21(b) is a sectional view taken at a position corresponding to line b—b in FIG. 20;

FIGS. 22(a) and 22(b) illustrate a manufacturing step in manufacturing the power transistor of the first embodiment, in which FIG. 22(a) is a sectional view taken at a position corresponding to line a—a in FIG. 20 and FIG. 22(b) is a sectional view taken at a position corresponding to line b—b in FIG. 20;

FIGS. 24(a) and 24(b) illustrate a manufacturing step in manufacturing the power transistor of the first embodiment, in which FIG. 24(a) is a plan view and FIG. 24(b) is a sectional view taken along line a—a in FIG. 24(a);

FIG. 25 is a sectional view of a principal portion, showing a schematic construction of a regulator according to a first modification of the first embodiment;

FIGS. 26(a) and 26(b) illustrate an internal structure of a power transistor according to a second modification of the first embodiment, in which FIG. 26(a) is a plan view and FIG. 26(b) is a sectional view taken along line a—a in FIG. 26(a);

FIGS. 27(a) and 27(b) illustrate an internal structure of a power transistor according to a third modification of the first embodiment, in which FIG. 27(a) is a plan view and FIG. 27(b) is a sectional view taken along a—a in FIG. 27(a);

FIGS. 28(a) and 28(b) illustrate an internal structure of a power transistor according to a fourth modification of the first embodiment, in which FIG. 28(a) is a plan view and FIG. 28(b) is a sectional view taken along line a—a in FIG. 28(a);

FIGS. 29(a) and 29(b) illustrates an internal structure of a power transistor according to a fifth modification of the first embodiment, in which FIG. 29(a) is a plan view and FIG. 29(b) is a sectional view taken along line a—a in FIG. 29(a);

FIG. 31 is a sectional view illustrating an internal structure of a power transistor according to a seventh modification of the first embodiment;

FIGS. 32(a) and 32(b) illustrate appearance of a power transistor according to a second embodiment of the present invention, in which FIG. 32(a) is a plan view (top view) and FIG. 32(b) is a bottom view (underside view);

FIGS. 44(a) and 44(b) illustrate an internal structure of the power transistor of the fifth embodiment, in which FIG. 44(a) is a sectional view taken along line a—a in FIG. 43 and FIG. 44(b) is a sectional view taken along line b—b in FIG. 43;

FIGS. 47(a) and 47(b) illustrates an internal structure of the power transistor of the sixth embodiment, in which FIG. 47(a) is a sectional view taken along line a—a in FIG. 45 and FIG. 47(b) is a sectional view taken along line b—b in FIG. 45.

DETAILED DESCRIPTION OF PREFERRED EMBODIMENTS

Figure 1:
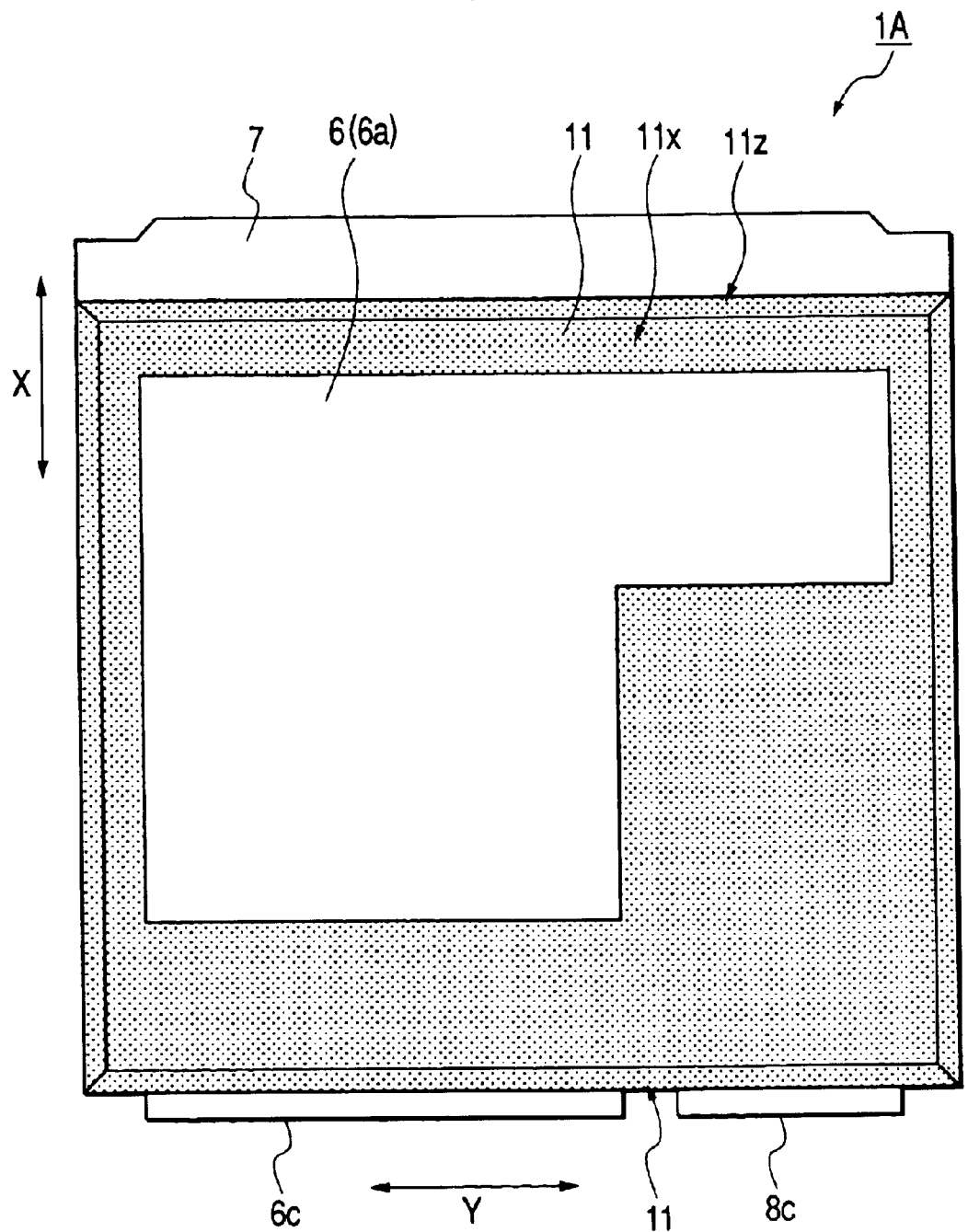
FIG. 1 is a plan view (top view) showing an appearance of a power transistor according to a first embodiment of the present invention.

Embodiments of the present invention will be described in detail hereinunder with reference to the accompanying drawings. In all of the drawings for illustrating the embodiments, components having the same functions are identified by the same reference numerals in principle, and repeated explanations thereof will be omitted. Further, for making the drawings easier to see, hatchings which represent sections are partially omitted.

(First Embodiment)

Figure 2:
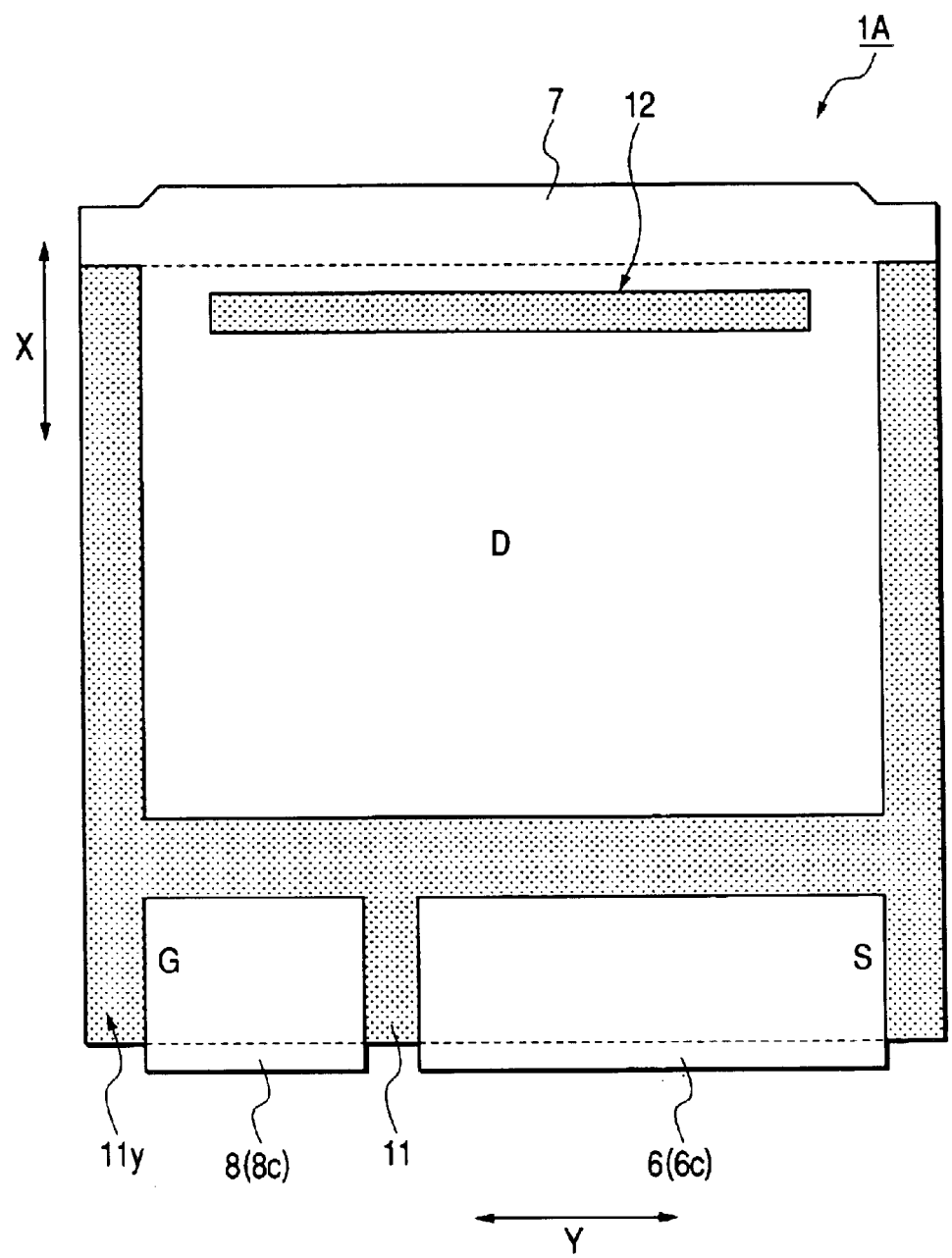
FIG. 2 is a bottom view (underside view) showing an appearance of the power transistor (semiconductor device) of the first embodiment.
Figure 3:
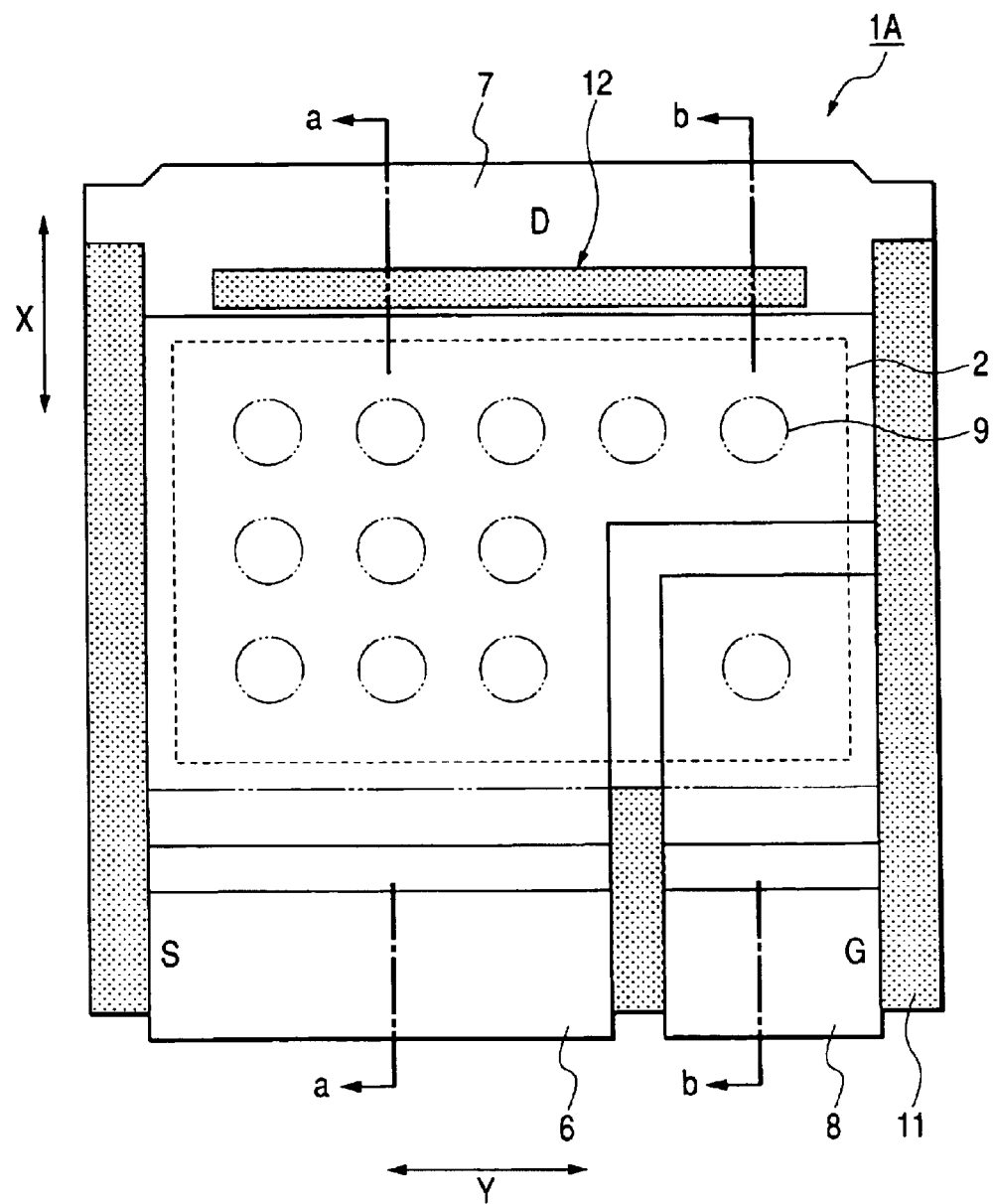
FIG. 3 is a plan view showing an internal structure of the power transistor of the first embodiment.
Figure 4:
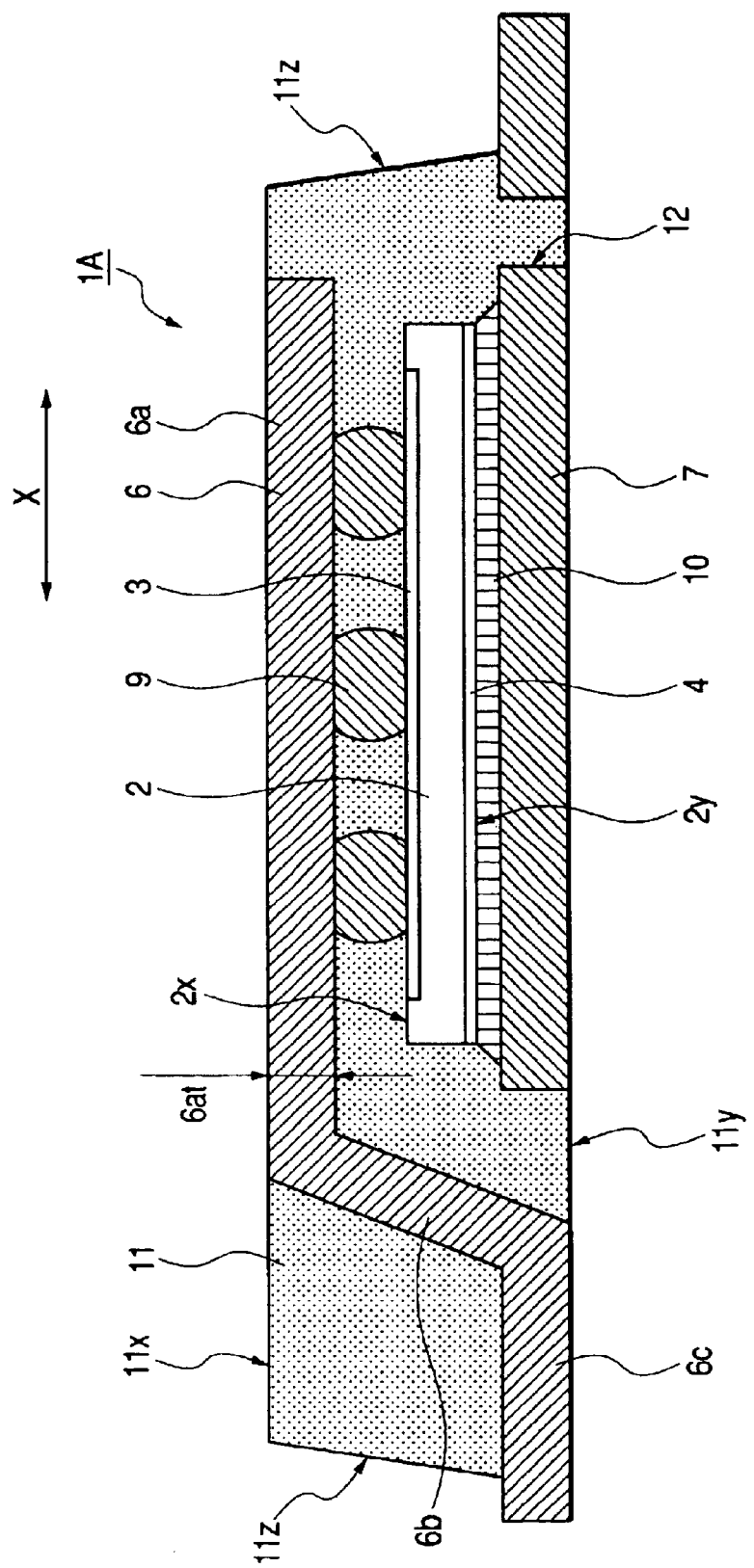
FIG. 4 is an enlarged sectional view taken along line a—a in FIG. 3.
Figure 5:
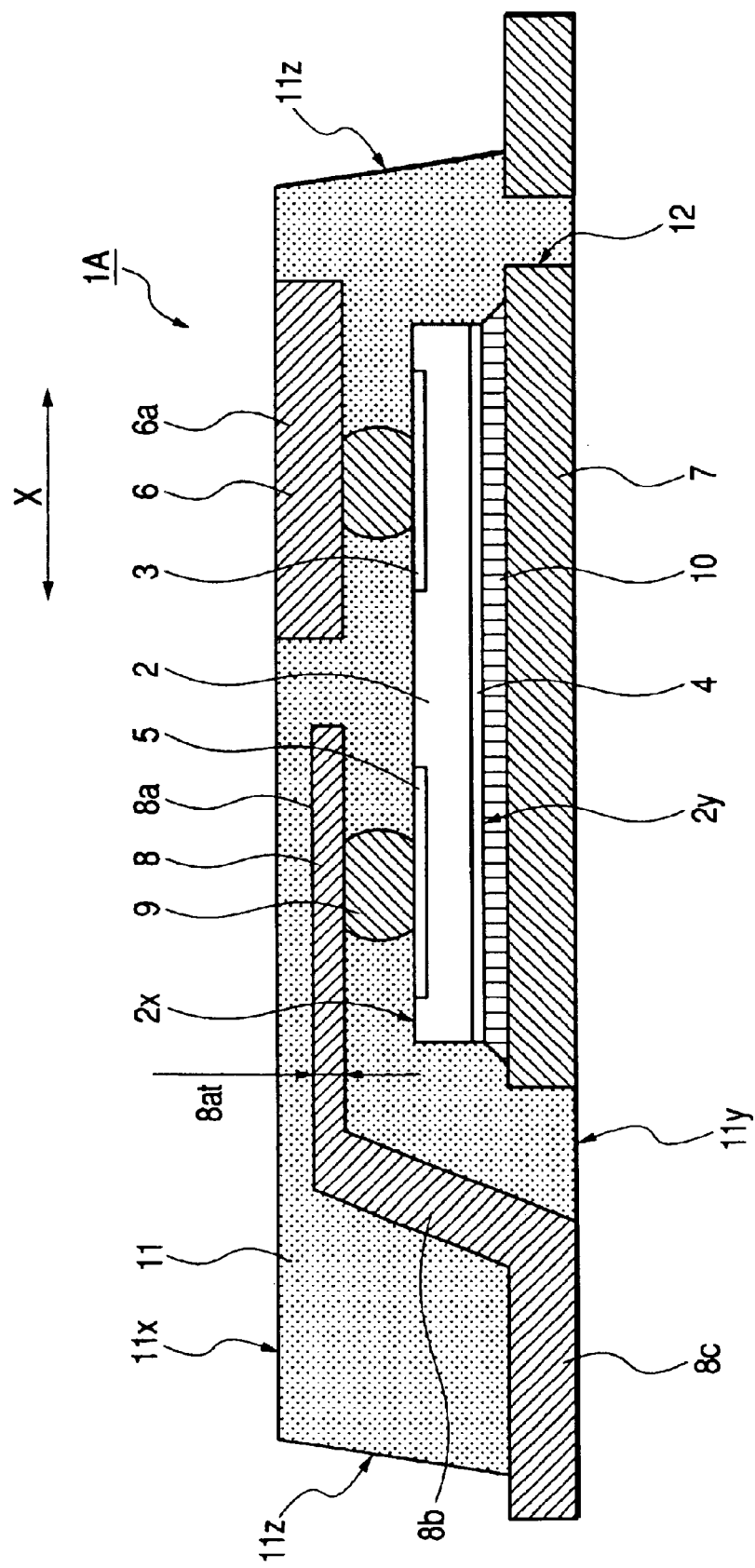
FIG. 5 is an enlarged sectional view taken along line b—b in FIG. 3.

FIG. 1 is a plan view (top view) showing an appearance of a power transistor according to a first embodiment of the present invention, FIG. 2 is a bottom view (underside view) showing an appearance of the power transistor (semiconductor device) of the first embodiment, FIG. 3 is a plan view showing an internal structure of the power transistor of the first embodiment, FIG. 4 is an enlarged sectional view taken along line a—a in FIG. 3, and FIG. 5 is an enlarged sectional view taken along line b—b in FIG. 3.

As shown in FIGS. 1 to 5, a power transistor 1A according to this first embodiment comprises a semiconductor chip 2, a resin sealing member 11 for sealing the semiconductor chip 2, leads (6, 8) as conductive members, and a header 7.

As shown in FIGS. 3 to 5, the semiconductor chip 2 is quadrangular in a planar shape thereof perpendicular to its thickness direction. Further, the semiconductor chip 2 has a main surface 2x and a back surface 2y which are positioned on mutually opposite sides in the thickness direction of the semiconductor chip. On the main surface 2x are formed a source electrode 3 and a gate electrode 5, while on the back surface 2y is formed a drain electrode 4.

The semiconductor chip 2 is composed principally of a semiconductor substrate formed of a single crystal silicon for example. On the main surface of the semiconductor substrate there is formed a MISFET (Metal Insulator Semiconductor Field Effect Transistor) of a vertical structure for example. In the vertical MISFET, a plurality of fine transistor cells are connected in parallel in order to obtain a large electric power.

The semiconductor chip 2 is sealed with a resin sealing member 11. As shown in FIGS. 1, 2, and 4, the resin sealing member 11 is quadrangular in a planar shape thereof perpendicular to its thickness direction. Further, the resin sealing member has a main surface (upper surface) 11x and a back surface (lower surface, mounting surface) 11y which are positioned on mutually opposite sides in the thickness direction of the semiconductor chip. The main surface 11x is positioned on the main surface 2x side of the semiconductor chip 2, while the back surface 11y is positioned on the back surface 2y side of the semiconductor chip 2.

For the purpose of reducing a stress, the resin sealing member 11 is formed using, for example, an epoxy-based thermosetting resin with a phenolic curing agent, silicone rubber and filler incorporated therein. The resin sealing member 11 is formed by a transfer molding method which is suitable for mass production. According to the transfer molding method, there is used a molding die provided with pot, runner, resin pouring gate, and cavity, and a thermosetting resin is injected from the pot into the cavity through the runner and the resin pouring gate to form a resin sealing member.

As shown in FIGS. 3 and 4, the lead 6 is formed by bending and has a first portion 6a, a second portion 6b, and a third portion 6c. A part of the first portion 6a is positioned above the source electrode 3 of the semiconductor chip 2 and another part thereof projects to the outside of the semiconductor chip 2 across a first side out of first and second sides of the main surface 2x of the semiconductor chip 2 which first and second sides are positioned on mutually opposite sides in a first direction (X direction). The second portion 6b is formed integrally with the first portion 6a and is bent from the first portion 6a toward the back surface 11y of the resin sealing member 11. The third portion 6c is formed integrally with the second portion 6b and extends in the same direction (away from the semiconductor chip 2) as the projecting direction of the first portion 6a from the second portion 6b.

The first portion 6a of the lead 6 is connected electrically and mechanically to the source electrode 3 of the semiconductor chip 2 through, for example, a plurality of salient electrodes 9 as connecting means. The second portion 6b of the lead 6 is an offset portion for spacing the first portion 6a and the third portion 6c from each other. The third portion 6c of the lead 6 is positioned on the back surface 11y side of the resin sealing member 11 relative to the first portion 6a through the second portion 6b.

As shown in FIGS. 1 and 4, the first portion 6a of the lead 6 is exposed from the main surface 11x of the resin sealing member 11. As shown in FIGS. 2 and 3, the third portion 6c of the lead 6 is exposed from the back surface 11y of the resin sealing member 11 and is further exposed from a first side face 11z out of first and second side faces 11z of the resin sealing member 11 which first and second side faces are positioned on mutually opposite sides in X direction. That is, one end side of the lead 6 is positioned above the source electrode 3 of the semiconductor chip 2, is connected to the source electrode 3 of the semiconductor chip 2 through salient electrodes (connecting means) 9, and is exposed from the main surface 11x of the resin sealing member 11, while the other end side opposite to the one end side is positioned on the back surface side of the resin sealing member 11 relative to the one end side and is exposed from both back surface 11y and first side face 11z of the resin sealing member.

Like the lead 6, the lead 8 is also formed by bending and has a first portion 8a, a second portion 8b, and a third portion 8c. A part of the first portion 8a is positioned above the gate electrode 5 of the semiconductor chip 2, while another part thereof, like that of the lead 6, projects to the outside of the semiconductor chip 2 across the first side of the main surface 2x of the semiconductor chip. The second portion 8b is formed integrally with the first portion 8a and is bent from the first portion 8a toward the back surface 11y of the resin sealing member 11. The third portion 8c is formed integrally with the second portion 8b and extends in the same direction (away from the semiconductor chip 2) as the projecting direction of the first portion 8a from the second portion 8b.

The first portion 8a of the lead 8 is connected electrically and mechanically to the gate electrode 5 of the semiconductor chip 2 through, for example, a salient electrode 9 as connecting means. The second portion 8b of the lead 8 is an offset portion for spacing the first portion 8a and the third portion 8c from each other in the thickness direction of the resin sealing member 11. The third portion 8c of the lead 8 is positioned on the back surface 11y side of the resin sealing member 11 relative to the first portion 8a through the second portion 8b.

As shown in FIGS. 1 and 5, the first portion 8a of the lead 8 is positioned in the interior of the resin sealing member 11. As shown in FIGS. 2 and 5, the third portion 8c of the lead 8 is exposed from the back surface 11y of the resin sealing member 11 and is further exposed, like the lead 6, from the first side face 11z of the resin sealing member 11. That is, one end side of the lead 8 is positioned above the second gate electrode 5 of the semiconductor chip 2, is connected to the gate electrode 5 of the semiconductor chip 2 through a salient electrode (connecting means) 9, and is positioned in the interior of the resin sealing member 11, while the other end side thereof opposite to the one end side is positioned on the back surface side of the resin sealing member 1 relative to the one end side and is exposed from the back surface 11y and the first side face 11z of the resin sealing member 11.

For example, as shown in FIGS. 3 and 4, plural salient electrodes 9 are interposed between and fixed to the source electrode 3 of the semiconductor chip 2 and the first portion 6a of the lead 6.

For example, as shown in FIGS. 3 and 5, one salient electrode 9 is interposed between and fixed to the gate electrode 5 of the semiconductor chip 2 and the first portion 8a of the lead 8.

As the salient electrode(s) there is used, for example, a stud bump formed of gold (Au) though there is made no limitation thereto. For example, the stud bump is formed by forming a ball at the tip of Au wire, then thermocompression-bonding the ball to an electrode on the chip under ultrasonic oscillation, and subsequently cutting off the Au wire from the ball. In case of using a stud bump as the salient electrode 9, the electrode-lead connection on the semiconductor chip is performed by thermocompression bonding.

As shown in FIGS. 4 and 5, the header 7 is connected electrically and mechanically to the drain electrode 4 on the back side 2y of the semiconductor chip 2 through, for example, an electrically conductive adhesive as connecting means. As shown in FIGS. 2, 4, and 5, the header 7 is exposed from the back surface 11y of the resin sealing member 11 and, as shown in FIGS. 1, 2, 4, and 5, is further exposed from the second side face 11z opposite to the first side face 11z of the resin sealing member 11 from which the first portions (6c, 8c) of the leads (6, 8) are exposed. In this first embodiment, the header 7 projects from the second side face 11z of the resin sealing member 11. The third portions (6c, 8c) of the leads (6, 8) also project from the first side face 11z of the resin sealing member 11.

In the header 7, as shown in FIGS. 2 and 5, there is formed a slit 12 extending through an upper surface (chip-connected surface) of the header and further through a lower surface thereof (exposed surface from the resin sealing member). The slit 12 is formed in the other portion than the area where the semiconductor chip 2 is connected, and the interior of the slit 12 is filled with the resin sealing member 11. That is, the slit 12 is provided for preventing dislodgment of the header 7 from the resin sealing member 11.

As shown in FIGS. 1, 4, and 5, the second portions (6b, 8b) of the leads 6 and 8 are positioned in the interior of the resin sealing member 11. The thickness 8at (see FIG. 5) of the first portion 8a of the lead 8 is larger than the thickness 6at (see FIG. 4) of the first portion 6a of the lead 6 so that the first portion 8a is positioned in the interior of the resin sealing member 11.

As shown in FIG. 3, the width of the lead 6 (the width in the second direction (Y direction) perpendicular to the first direction (X direction) in the same plane) is larger than the width of the lead 8 (the width in the second direction (Y direction) perpendicular to the first direction (X direction) in the same plane). Further, the area of the first portion 6a of the lead 6 opposed to the main surface 2x of the semiconductor chip 2 is larger than the area of the first portion 8a of the lead 8 opposed to the main surface 2x of the semiconductor chip.

The power transistor 1A thus constructed is soldered, together with other components, onto the wiring substrate in the electronic device. The third portions (6c, 8c) of the leads 6 and 8, as well as the header 7, are connected electrically and mechanically to electrodes on the wiring substrate through an electrically conductive adhesive (e.g., a lead-free solder material). That is, the power transistor 1A of this first embodiment is of a surface-mounted type structure wherein the third portion 6c of the lead 6, the third portion 8c of the lead 8, and the header 7, which function as external connection terminals soldered at the time of packaging, are arranged on the back surface 11y of the resin sealing member 11.

As shown in FIGS. 1 to 5, the power transistor 1A is of a both upper-/lowr-surface heat dissipating structure wherein the first portion 6a of the lead 6 is exposed from the main surface 11x of the resin sealing member 11, and the header 7 is exposed from the back surface 11y opposite to the main surface 11x of the resin sealing member 11. With such a structure, heat generated from the semiconductor chip 2 is released to the exterior efficiently from the first portion 6a of the lead 6 which has a wide area, and is further released to the exterior from the header 7 of a wide area, so that the heat dissipating property of the power transistor 1A is enhanced.

According to the structure of the power transistor 1A, the second portion 6b of the lead 6 is positioned in the interior of the resin sealing member 11. With such a structure, even if the first portion 6a of the lead 6 is exposed from the main surface (upper surface) of the resin sealing member 11 for the purpose of improving the heat dissipating property of the power transistor, it is possible to prevent dislodgment of the lead 6 from the resin sealing member 11, so that the reliability of the power transistor 1A is enhanced.

According to the structure of the power transistor 1A, the first portion 6a of the lead 6 is connected electrically and mechanically to the source electrode 3 of the semiconductor chip 2 through salient electrodes 9, while the first portion 8a of the lead 8 is connected electrically and mechanically to the gate electrode 5 of the semiconductor chip 2 through a salient electrode 9. With such a structure, a conduction path between the leads and the electrodes on the semiconductor chip becomes shorter and hence the ON resistance of the power transistor 1A becomes lower in comparison with the structure wherein leads and electrodes on a semiconductor chip are connected together electrically through bonding wires. Besides, the thickness of the power transistor 1A can be reduced because the resin thickness of the resin sealing member 11 on the main surface of the semiconductor chip 2 becomes smaller.

According to the structure of the power transistor 1A, the semiconductor chip 2 is resin-sealed with the resin sealing member 11, whereby the reliability of the power transistor 1A is enhanced in comparison with the structure wherein the resin sealing member 2 is not sealed with resin.

Further, according to the structure of the power transistor 1A, the first portion 6a of the lead 6 is exposed from the main surface 11x of the resin sealing member 11 and the first portion 8a of the lead 8 is positioned in the interior of the resin sealing member 11. With such a structure, even in the event an electrically conductive foreign matter should adhere for some reason or other to the main surface 11x of the resin sealing member 11, it is possible to prevent shorting of the lead 6 with the lead 8 caused by that foreign matter and hence possible to enhance the reliability of the power transistor 1A in comparison with the case where the first portions (6a, 8a) of the leads 6 and 8 are exposed from the main surface 11x of the resin sealing member 11.

Figure 7:
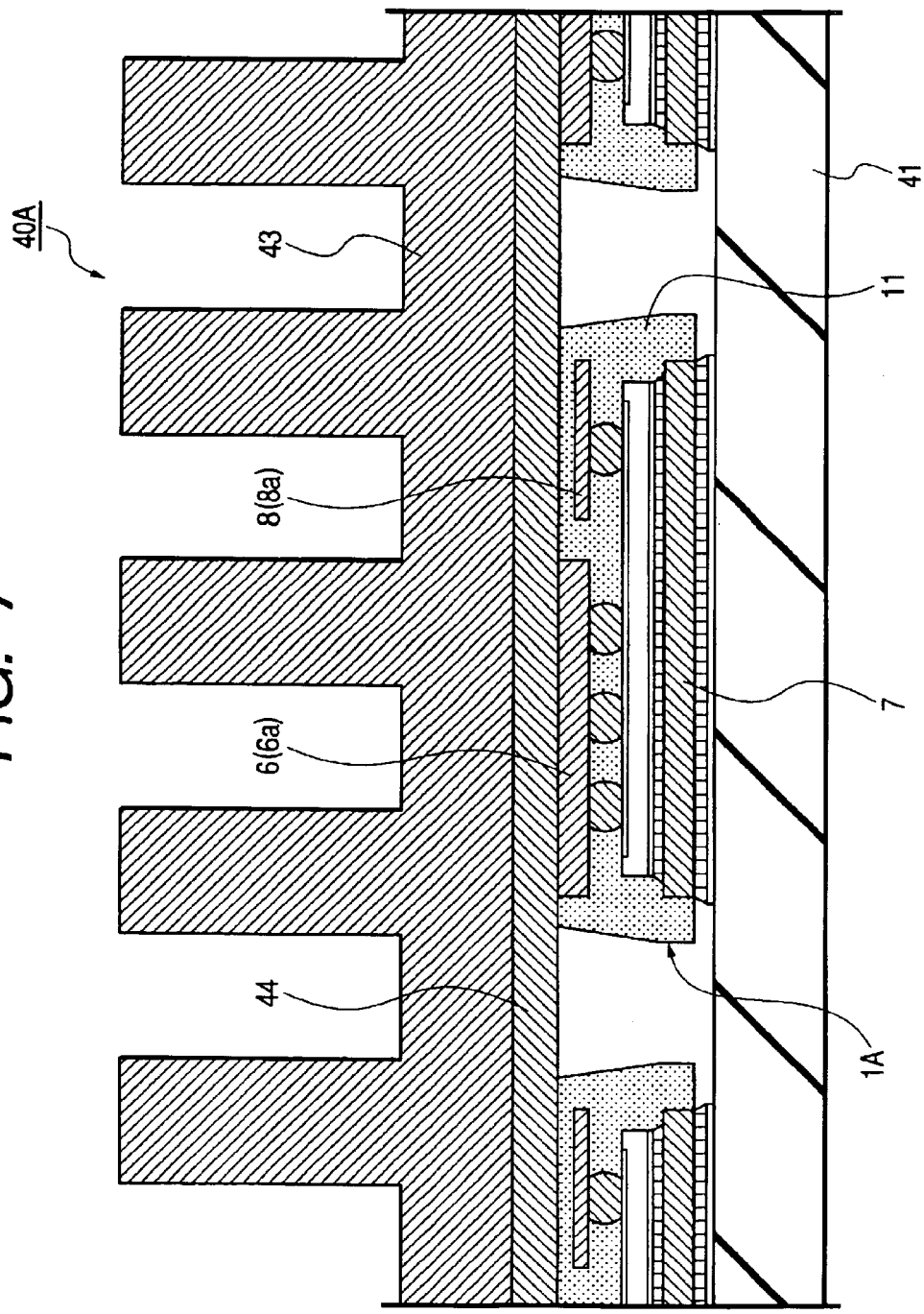
FIG. 7 is a partially enlarged sectional view of FIG. 6(b)
Figure 8:
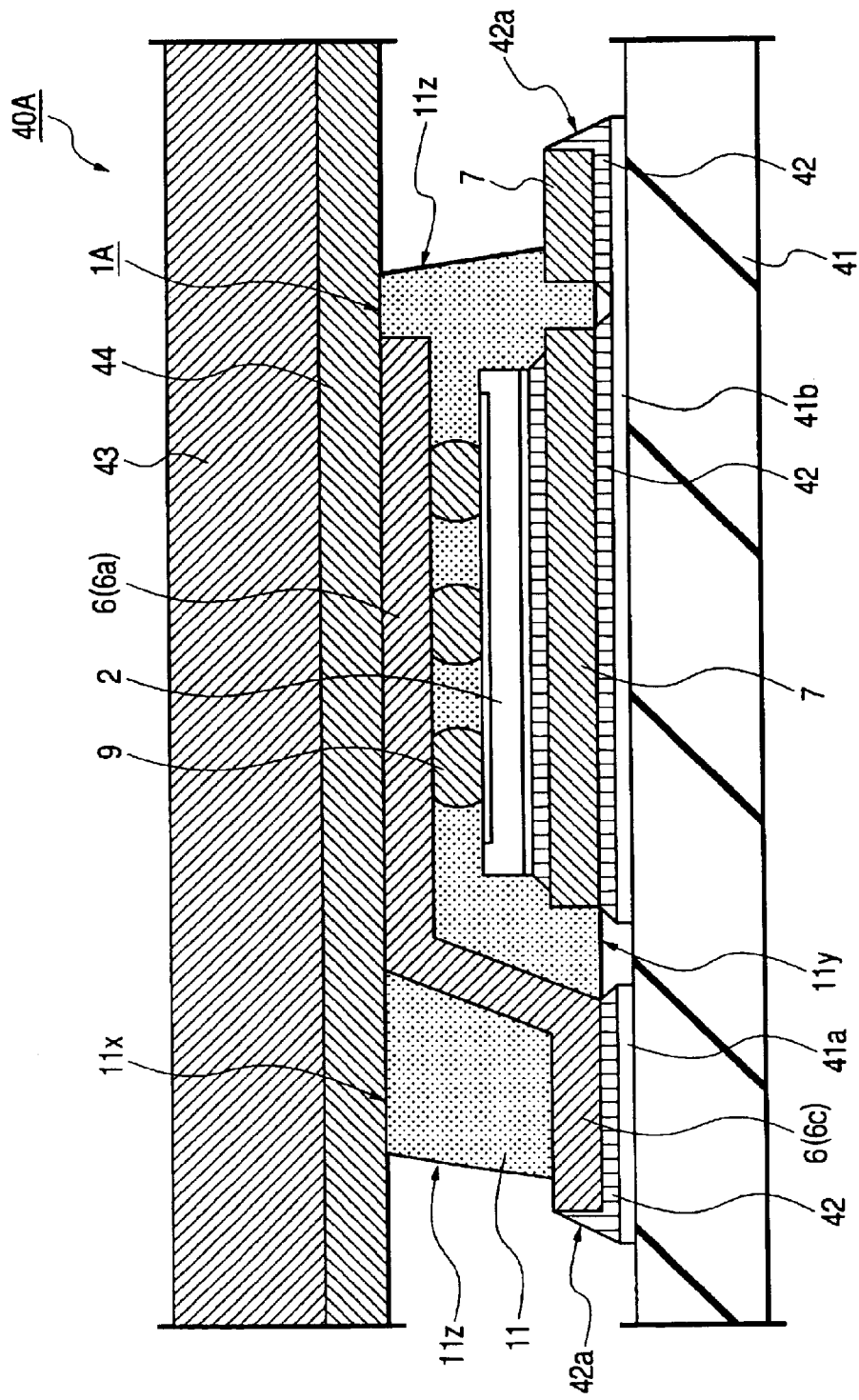
FIG. 8 is an enlarged sectional view taken along line b—b in FIG. 6(a)
Figure 9:
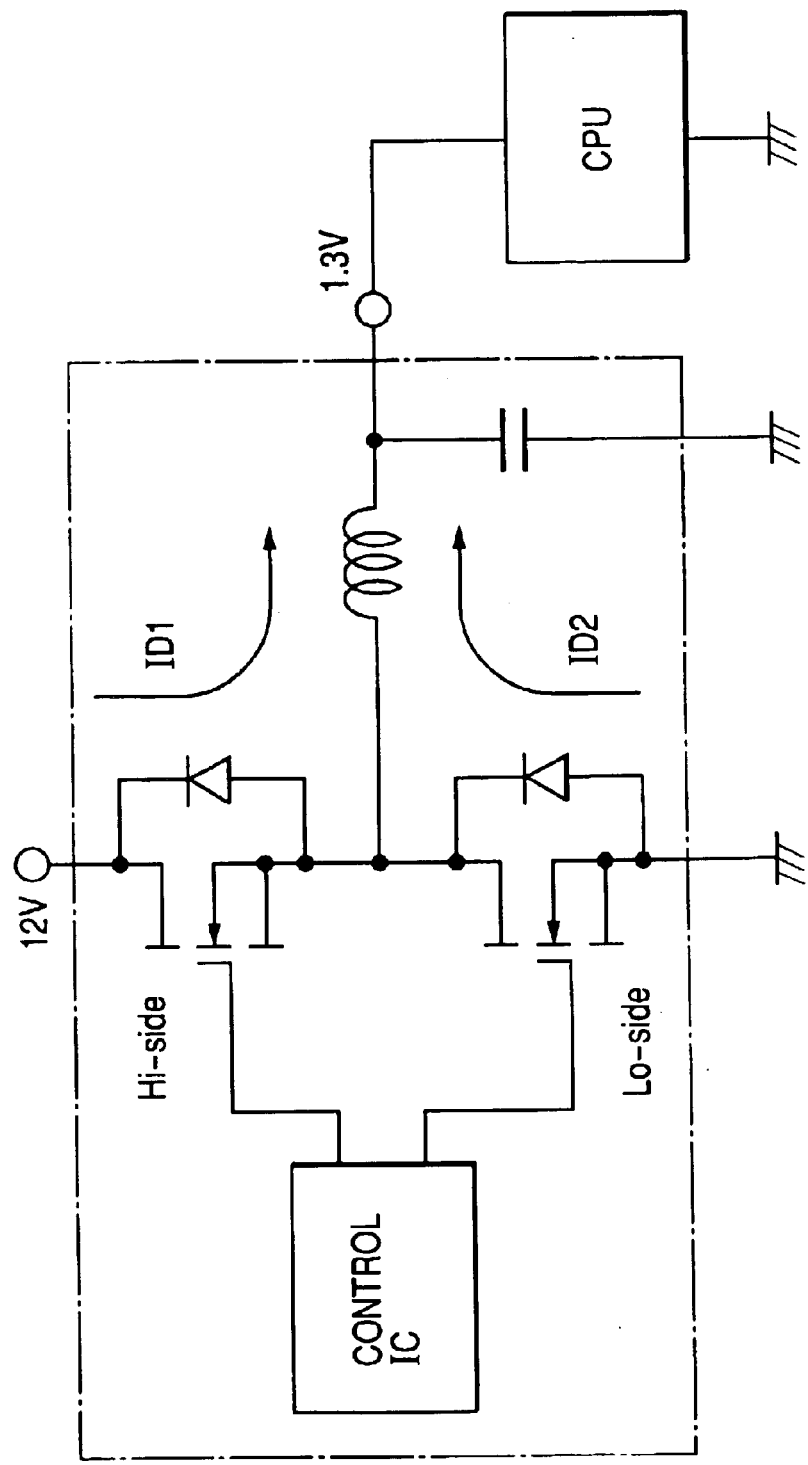
FIG. 9 is an equivalent circuit diagram showing a schematic construction of the regulator of FIG. 6.

FIG. 6 illustrates a schematic construction of a regulator (electronic device) with the power transistor 1A of FIG. 1 incorporated therein, in which FIG. 6(a) is a plan view and FIG. 6(b) is a sectional view taken along line a—a in FIG. 6(a), FIG. 7 is a partially enlarged sectional view of FIG. 6(b), FIG. 8 is an enlarged sectional view taken along line b—b in FIG. 6(a), and FIG. 9 is an equivalent circuit diagram showing a schematic construction of the regulator of FIG. 6.

As shown in FIG. 9, a regulator 40A is basically provided with a high-side power transistor 1A and a low-side power transistor 1A, in which a DC voltage applied to an input terminal is reduced by voltage conversion and a low DC voltage is outputted from an output terminal. For example, a DC voltage of 12V applied to an input terminal is reduced to a DC voltage of 1.3V, which is outputted from an output terminal. In operation, a current ID1 flows when the high-side power transistor 1A is ON and the low-side power transistor 1A is OFF, while when the high-side power transistor 1A is OFF and the low-side power transistor 1A is ON, there flows a current ID2 by virtue of a counter-electromotive force of coil. ON-OFF of the high- and low-side power transistors 1A is controlled by a control IC. For example, the regulator 40A is used in a power supply section which supplies a server's CPU with a predetermined voltage.

As shown in FIG. 6, the regulator 40A comprises a wiring substrate 41, plural power transistors 1A mounted on the wiring substrate 41, and a heat dissipating member 43 disposed on the plural power transistors 1A so as to cover the power transistors.

The power transistors 1A are mounted on the wiring substrate 41 by soldering for example. As shown in FIG. 8, the first portion 6a of the lead 6 is connected electrically and mechanically to an electrode 41a on the wiring substrate 41 through an electrically conductive adhesive (e.g., a lead-free solder material) 42. The first portion 8a of the lead 8, though not shown, is connected electrically and mechanically to a corresponding electrode on the wiring substrate 41 through the electrically conductive adhesive 42. The header 7 is connected electrically and mechanically to an electrode 41b on the wiring substrate 41 through the adhesive 42.

Mounting of the power transistor 1A is carried out, for example, by applying a pasty adhesive onto electrodes formed on the wiring substrate by a screen printing method as an example, thereafter disposing the third portion 6c of the lead 6, the third portion 8c of the lead 8, and the header 7 onto corresponding electrodes on the wiring substrate 41 through the adhesive, then conveying the wiring substrate 41 into an infrared reflow furnace, and thereafter melting and curing the adhesive, although no limitation is made to this method.

In the mounting step of the power transistors 1A, the third portions (6c, 8c) of the leads 6 and 8 are exposed from the first side face 11z of the resin sealing member 11, so that there is formed a good fillet 42a having a large thickness of the adhesive 42 in such a manner as to cover side faces of the tips of the third portions (6c, 8c). Also as to the header 7, since it is exposed from the second side face 11z of the resin sealing member 11, there is formed a good fillet 42a having a large thickness of the adhesive 42 in such a manner as to cover side faces of the header 7 exposed from the second side face 11z of the resin sealing member.

Thus, by allowing the third portions (6c, 8c) of the leads 6 and 8 to be exposed from the first side face 11z of the resin sealing member 11 and allowing the header 7 to be exposed from the second side face 11z of the resin sealing member, a good fillet 42 is formed on side faces of the tips of the third portions (6c, 8c) of the leads 6 and 8 and also on side faces of the header 7 exposed from the second side face 11z of the resin sealing member 11, so that the connection reliability in the mounting step is enhanced. Besides, whether the third portions (6c, 8c) of the leads 6 and 8, as well as the header 7, are soldered in a satisfactory state or not can be checked visually.

The third portions (6c, 8c) of the leads 6 and 8 are projected from the first side face 11z of the resin sealing member 11, and the header 7 is projected from the second side face 11z of the resin sealing member 11. With such a structure, fillet 42a is formed on three side faces of the third portions (6c, 8c) of the leads (6, 8) projecting from the first side face 11z of the resin sealing member 11, and fillet 42a is formed on three side faces of the header 7 projecting from the second side face 11z of the resin sealing member 11. Consequently, the connection reliability in the mounting step is further enhanced. Moreover, whether the soldering is satisfactory or not can be checked visually.

In each power transistor 1A, as shown in FIGS. 7 and 8, the first portion 6a of the lead 6 is exposed from the main surface 11x of the resin sealing member 11 and is connected to the heat dissipating member 43 through a heat conducting member 44. With such a structure, heat generated from the semiconductor chip 2 is transmitted efficiently from the first portion 6a of the lead 6 to the heat dissipating member 43 through the heat conducting member 44, so that it is possible to prevent malfunction of each power transistor 1A caused by heat and hence the reliability of the regulator 40A becomes higher.

Figure 10:
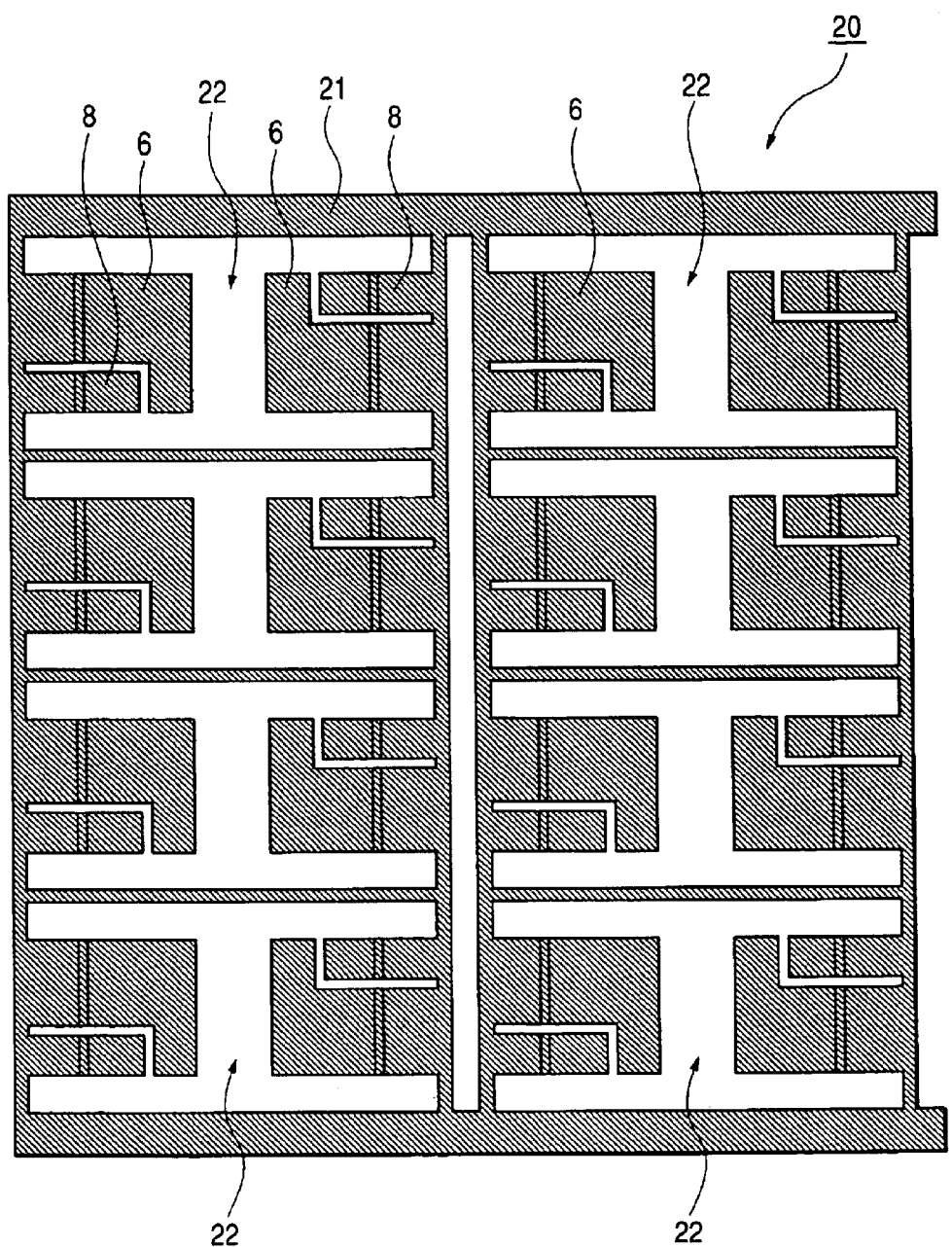
FIG. 10 is a plan view showing a part of a lead frame used in manufacturing the power transistor of the first embodiment.
Figure 11A:
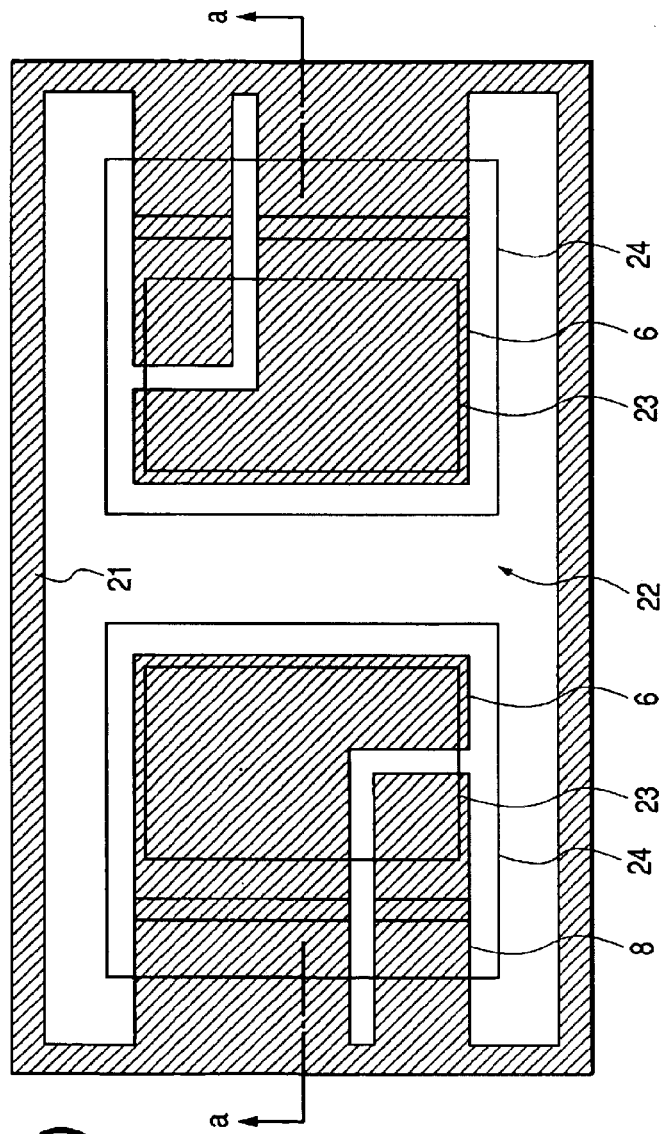
Figure 11B:
Figure 12:
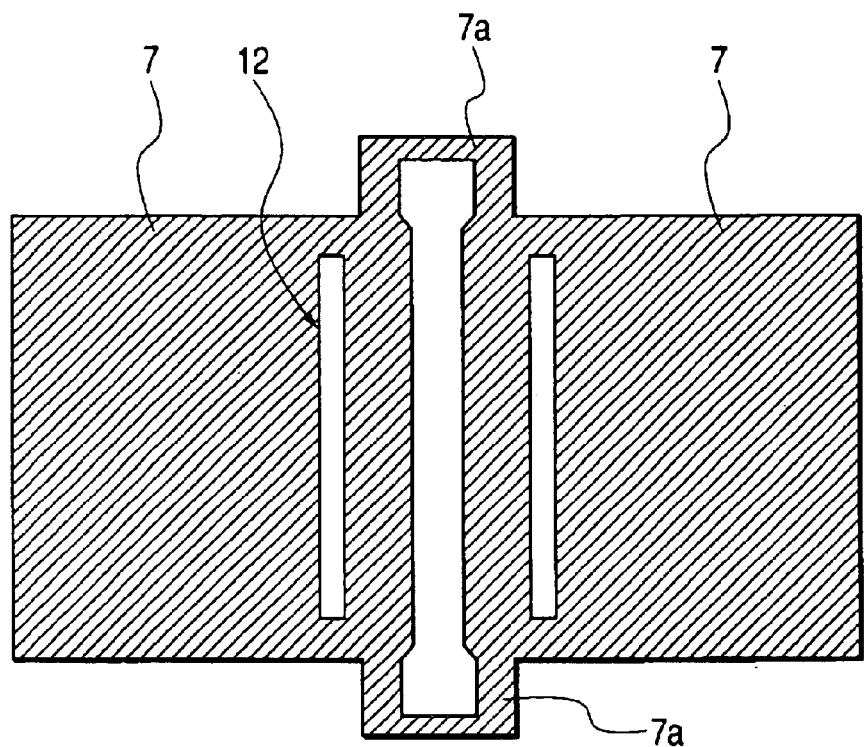
FIG. 12 is a plan view of a header used in manufacturing the power transistor of the first embodiment.

FIG. 10 is a plan view showing a part of a lead frame which is used in manufacturing the power transistor of FIG. 1, FIGS. 11(a) and 11(b) are partially enlarged views of the lead frame of FIG. 10, in which FIG. 11(a) is a plan view and FIG. 11(b) is a sectional view taken along line a—a in FIG. 11(a), and FIG. 12 is a plan view of a header used in manufacturing the power transistor of FIG. 1.

As shown in FIGS. 10 and 11, a lead frame 20 has a plurality of product-forming areas 22 partitioned by a frame body 21 and arranged in a matrix shape. In each product-forming area 22 there are arranged two sets of leads 6 and 8 so that two products for example can be formed therein. The leads 6 and 8 are formed by bending in advance and each have a first portion (6a or 8a), a second portion (6b or 8b), and a third portion (6c or 8c). The leads 6 and 8 are formed integrally with the frame body 21 and the respective third portions (6c, 8c) are connected to the frame body 21.

The lead frame 20 is formed by etching or pressing, for example, a metallic plate formed of copper (Cu) or a copper-based alloy to form predetermined lead patterns and thereafter bending the leads.

In FIG. 11(a), the numeral 23 denotes an area where the semiconductor chip 2 is to be mounted, and numeral 24 denotes an area where the resin sealing member 11 is to be formed.

As shown in FIG. 12, the header 7 before subjected to the manufacturing process is integral with another header 7 through a connection 7a which is to be removed in a cutting step. The number of headers 7 thus interconnected corresponds to the number of products to be obtained in each product-forming area 22. In this embodiment, two headers 7 are interconnected as an example. Each header 7 is formed, for example, by etching or pressing a metallic plate of Cu or a Cu-based alloy.

Figure 13:
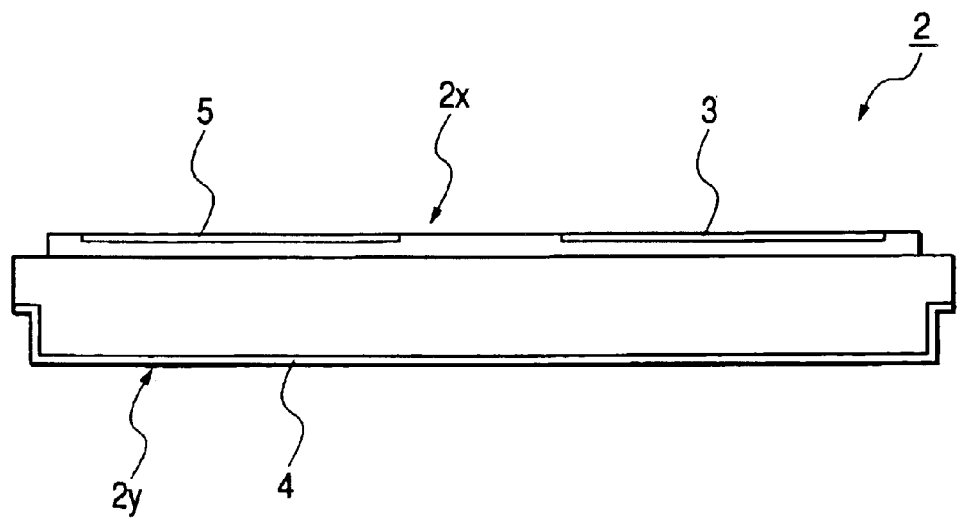
FIG. 13 is a sectional view of a semiconductor chip used in manufacturing the power transistor of the first embodiment.
Figure 14:
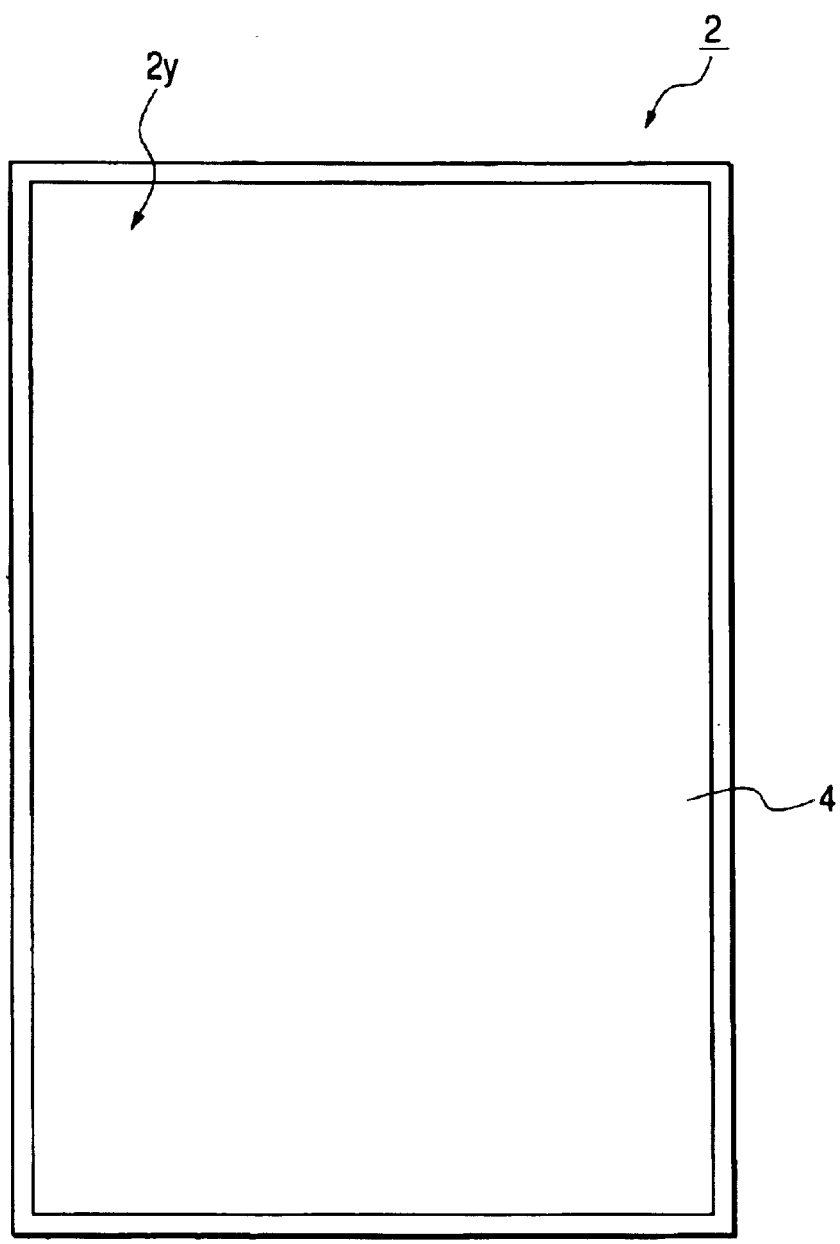
FIG. 14 is a bottom view (underside view) of the semiconductor chip shown in FIG. 13.

FIG. 13 is a sectional view of a semiconductor chip used in manufacturing the power transistor of FIG. 1, and FIG. 14 is a bottom view (underside view) of the semiconductor chip of FIG. 13.

Figure 15:
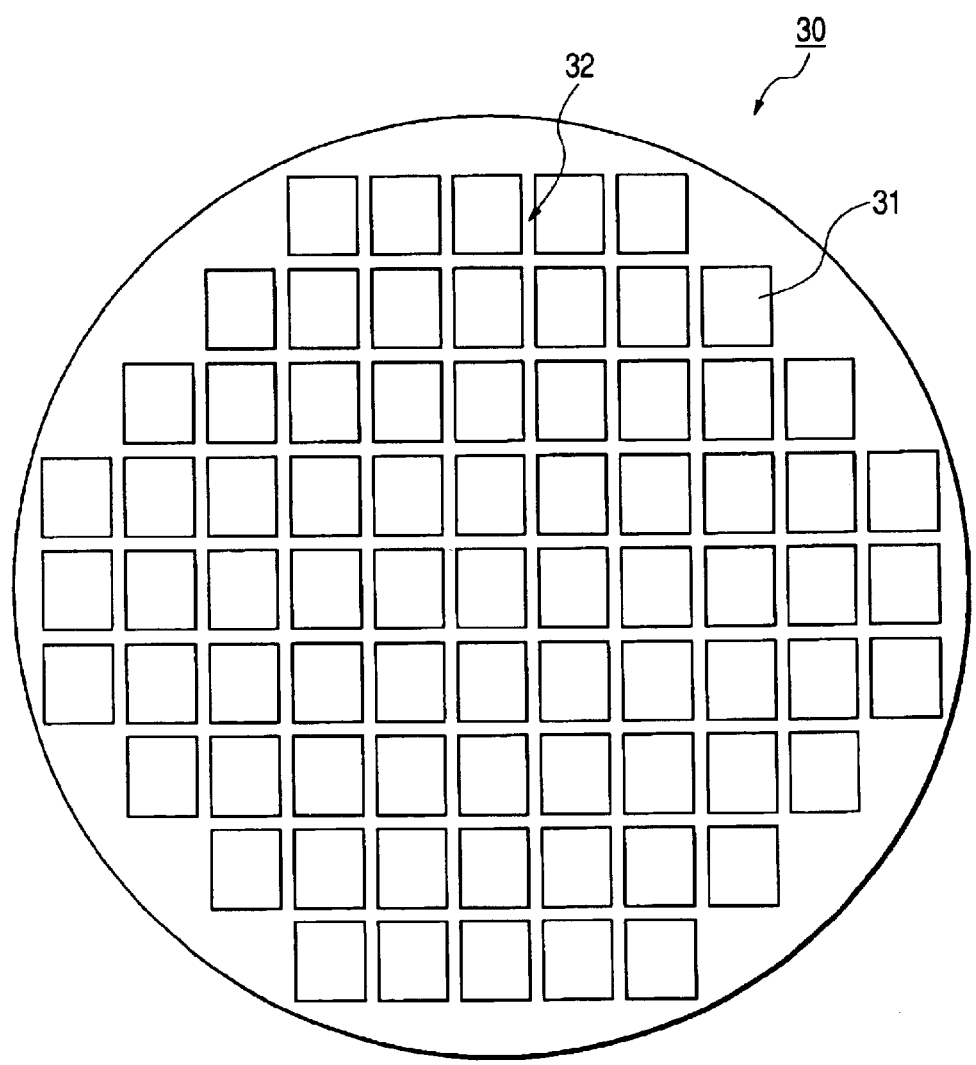
FIG. 15 is a plan view of a semiconductor wafer used in manufacturing the power transistor of the first embodiment.

As shown in FIGS. 13 and 14, a semiconductor chip 2 has a source electrode 3 and a gate electrode 4 on a main surface 2x thereof and further has a drain electrode 4 on a back surface 2y thereof opposite to the main surface 2x. The drain electrode 4 is formed continuously so as to cover the back side 2y of the semiconductor chip 2 and peripheral edges of the back side 2y and extend toward side faces of the chip. That is, the back side 2y of the semiconductor chip 2 and a part of side faces of the chip are covered with a conductive film which constitutes the drain electrode 4. Such a semiconductor chip 2 can be formed by carrying out dicing in two stages which dicing is for division from a state of a semiconductor wafer into a state of individual semiconductor chips. How to fabricate the semiconductor chip 2 will be described below with reference to FIGS. 15 and 16. FIG. 15 is a plan view of a semiconductor wafer used in manufacturing the power transistor of FIG. 1, and FIGS. 16(a) to 16(d) illustrate steps for dicing the semiconductor wafer into individual semiconductor chips in manufacturing the power transistor of FIG. 1, FIGS. 16(a) to 16(d) being sectional views.

Figure 16A:
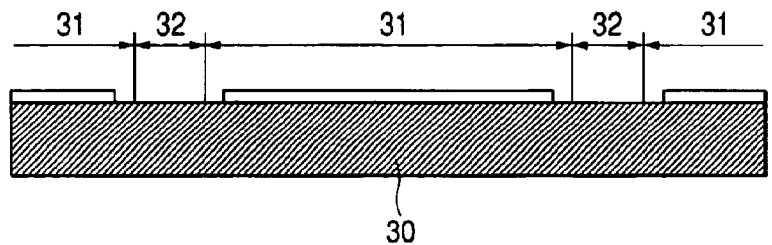

First, as shown in FIGS. 15 and 16(a), a plurality of chip-forming areas 31 partitioned by dicing areas 32 are formed in a matrix shape on a main surface of a semiconductor wafer 30. The chip-forming areas 31 are each formed by forming transistor, conductive film, and insulating film.

Figure 16B:
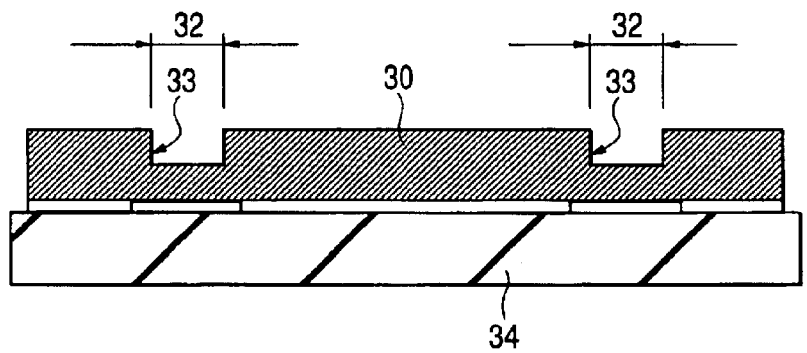

Next, as shown in FIG. 16(b), the semiconductor wafer 30 is affixed to a dicing sheet 34 in a state in which the main surface of the semiconductor wafer 30 confronts the dicing sheet 34. Thereafter, with use of a dicing blade of a first width, the dicing areas 32 are cut from a back surface of the semiconductor wafer 32 at such a depth as does not cause separation of the chip-forming areas 31, to form grooves 33.

Figure 16C:
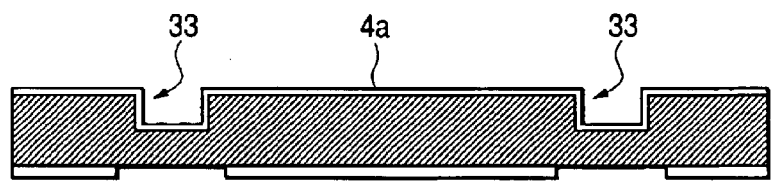
Figure 16D:
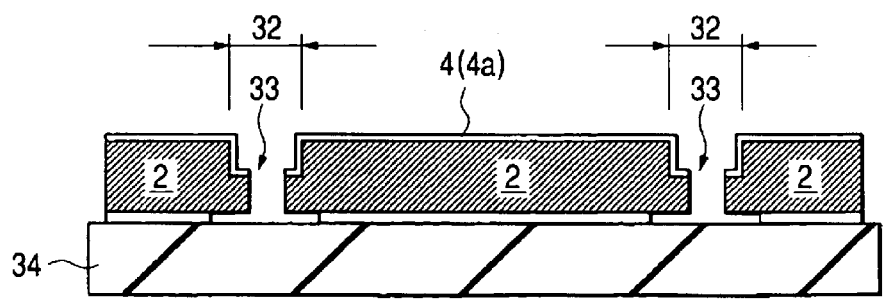

Next, as shown in FIG. 16(c), a conductive film 4a such as, for example, Ti/Ni/Au film or Ti/Ni/Ag film is formed throughout the entire back surface of the semiconductor wafer 30 including the interiors of the grooves 33, thereafter, as shown in FIG. 16(d), the semiconductor wafer 30 is affixed to the dicing sheet 34 in a state in which the main surface of the semiconductor wafer confronts the dicing sheet 34, then with use of a dicing blade of a second width smaller than the first width, bottoms of the grooves 33 are cut for separation into individual chip-forming areas 31. In this way, as shown in FIG. 16(d), there are formed semiconductor chips 2 each having a drain electrode 4 which is formed continuously so as to cover not only the back surface 2y of each semiconductor chip 2 but also a part of side faces of the chip.

Next, how to manufacture the power transistor of FIG. 1 will be described below with reference to FIGS. 17 to 24.

Figure 17A:
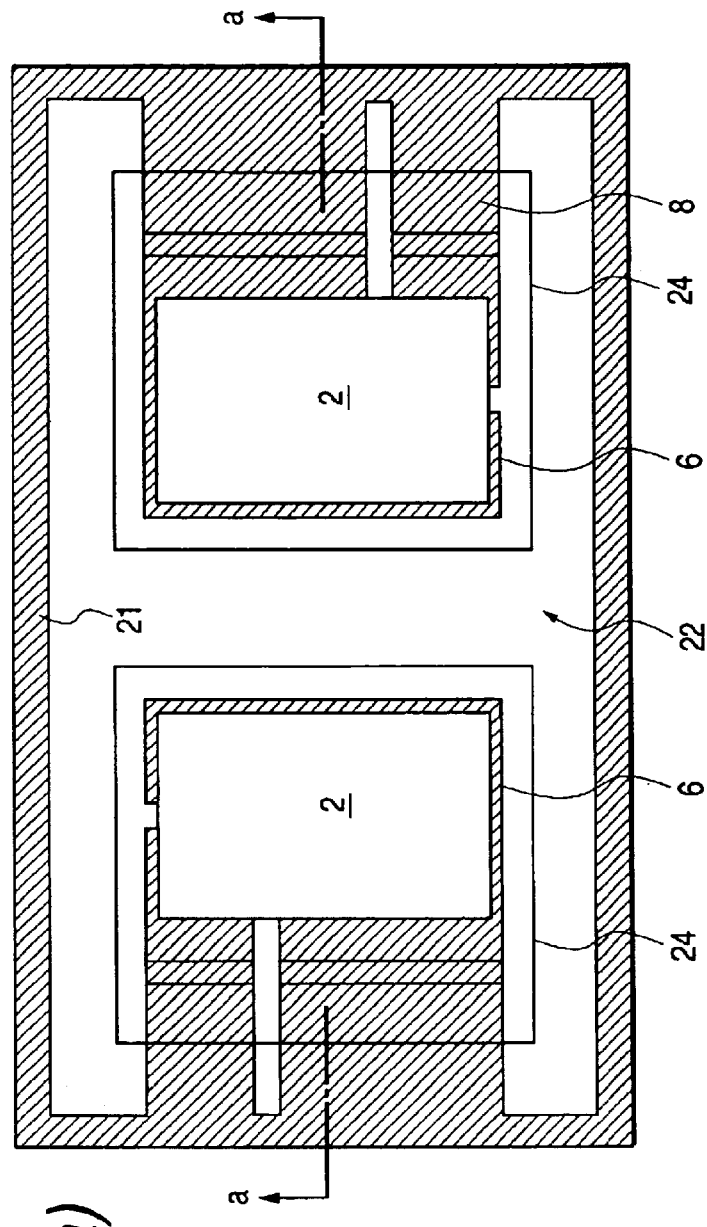
Figure 17B:
Figure 19:
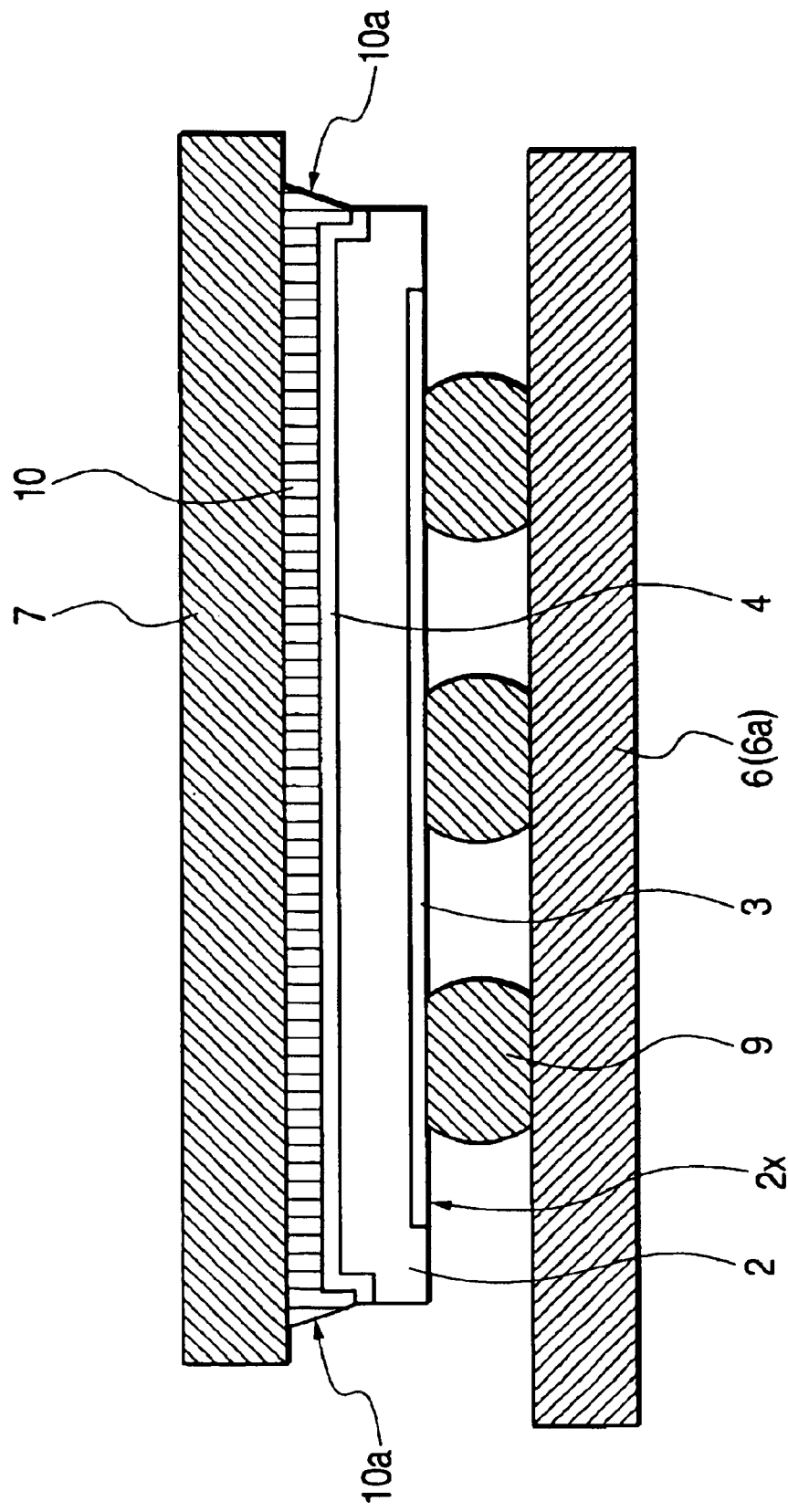
FIG. 19 is a partially enlarged sectional view of FIG. 18(b)
Figure 21A:
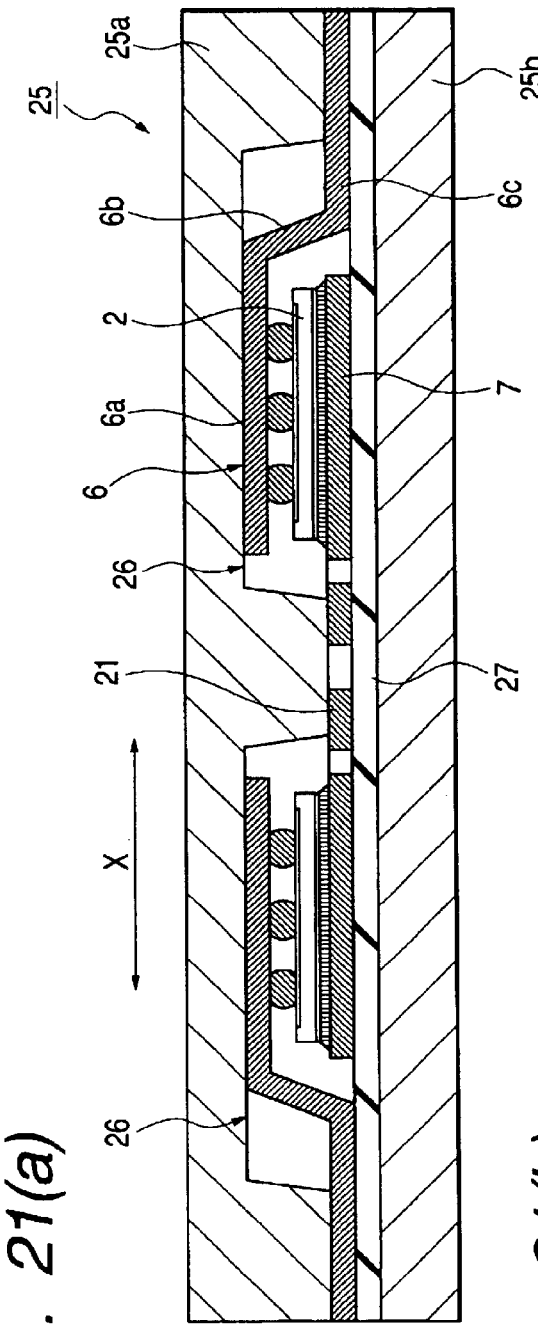
Figure 21B:
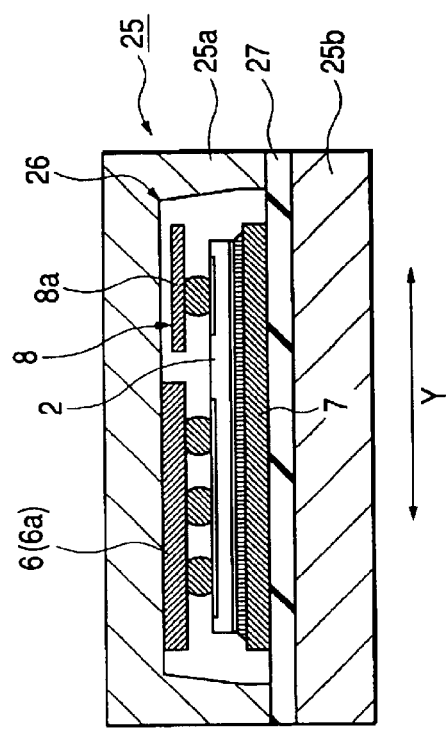
Figure 22A:
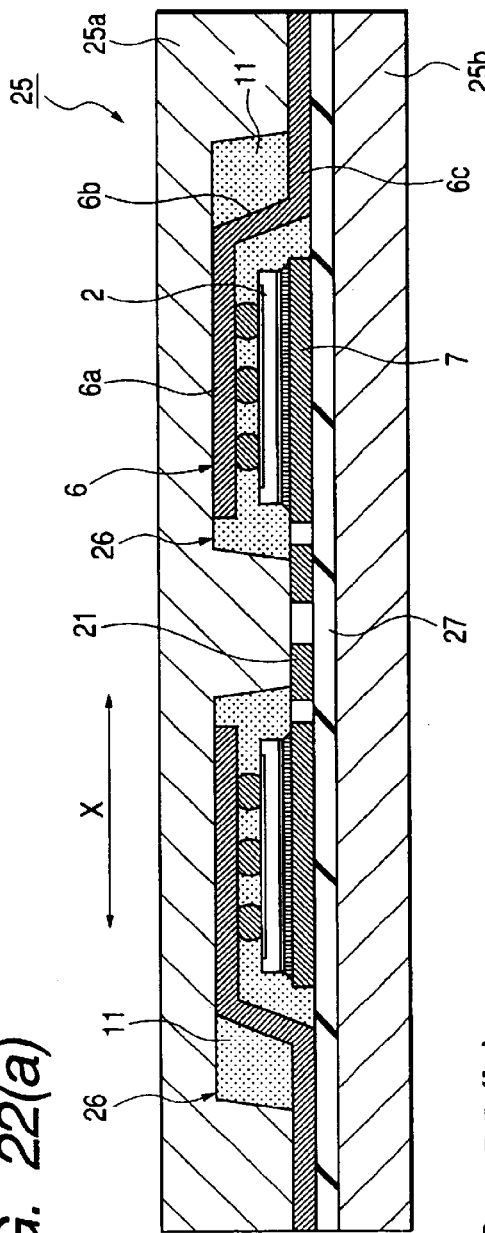
Figure 22B:
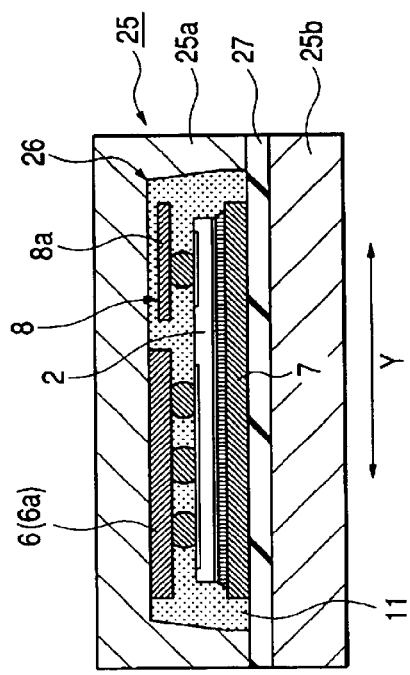
Figure 23:
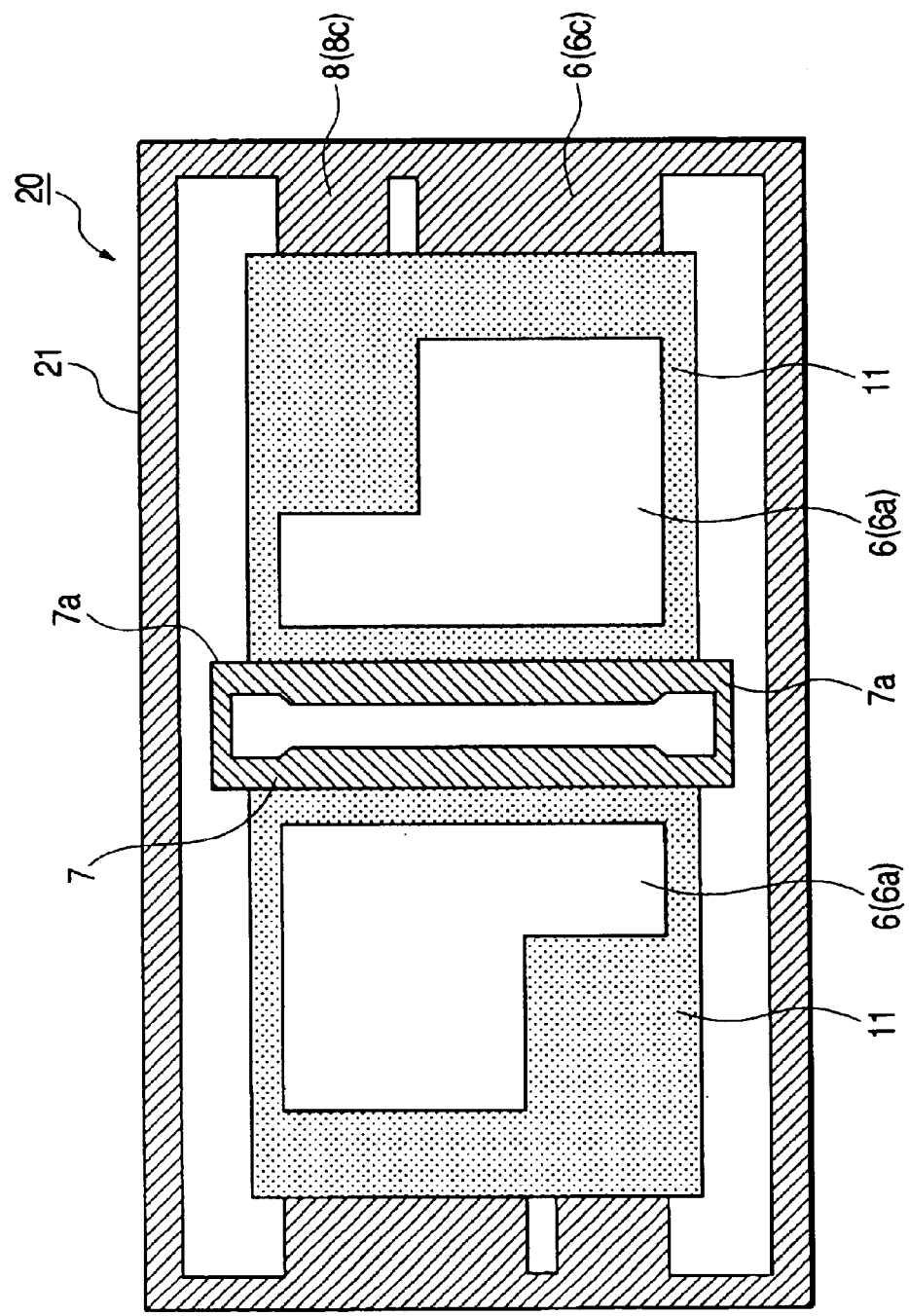
FIG. 23 is a plan view illustrating a manufacturing step in manufacturing the power transistor of the first embodiment.
Figure 24A:
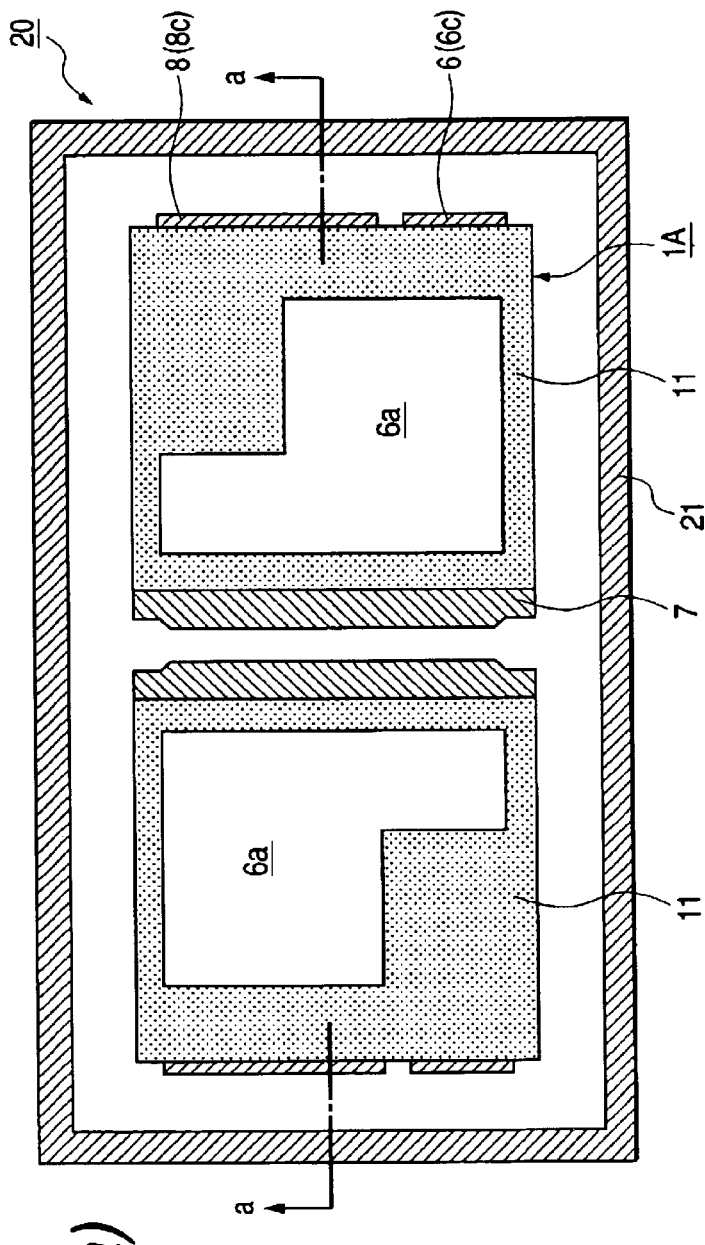
Figure 24B:
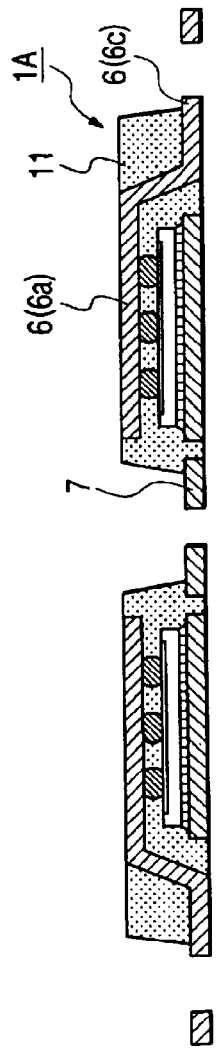

FIGS. 17(a) and 17(b) illustrate a manufacturing step in manufacturing the power transistor, in which FIG. 17(a) is a plan view and FIG. 17(b) is a sectional view taken along line a—a in FIG. 17(a), FIGS. 18(a) and 18(b) illustrates a manufacturing step in manufacturing the power transistor, in which FIG. 18(a) is a plan view and FIG. 18(b) is a sectional view taken along line a—a in FIG. 18(a), FIG. 19 is a partially enlarged sectional view of FIG. 18(b), FIG. 20 is a plan view illustrating a manufacturing step in manufacturing the power transistor, FIGS. 21(a) and 21(b) illustrate a manufacturing step in manufacturing the power transistor, in which FIG. 21(a) is a sectional view at a position corresponding to line a—a in FIG. 20 and FIG. 21(b) is a sectional view at a position corresponding to line b—b in FIG. 20, FIGS. 22(a) and 22(b) illustrate a manufacturing step in manufacturing the power transistor, in which FIG. 22(a) is a sectional view at a position corresponding to line a—a in FIG. 20 and FIG. 22(b) is a sectional view at a position corresponding to line b—b in FIG. 20, FIG. 23 is a plan view illustrating a manufacturing step in manufacturing the power transistor, and FIGS. 24(a) and 24(b) illustrate a manufacturing step in manufacturing the power transistor, in which FIG. 24(a) is a plan view and FIG. 24(b) is a sectional view taken along line a—a in FIG. 24(a).

First, the semiconductor chip 2 shown in FIGS. 13 and 14, the lead frame 20 shown in FIGS. 10 and 11, and the header 7 shown in FIG. 12, are provided. Though not shown, salient electrodes 9 are formed on the source electrode 3 and gate electrode 5 of the semiconductor chip 2. It is preferable that the formation of the salient electrodes 9 be done before dividing the semiconductor wafer into individual semiconductor chips 2, namely, in the stage of semiconductor wafer.

Next, the upper and lower surfaces of the lead frame 20 are inverted so that in the thickness direction of the frame body 21 there is made a change from such a state as shown in FIG. 11 wherein the first portion 6a of the lead 6 lies in an upper position than the third portion 6c to such a state as shown in FIG. 17 wherein the first portion 6a of the lead 6 lies in a lower position than the third portion 6c. Thereafter, as shown in FIG. 17, the semiconductor chip 2 is mounted on the first portions (6a, 8a) of the leads 6 and 8. The mounting of the semiconductor chip 2 is carried out by positioning the main surface 2x of the semiconductor chip 2 so as to confront the firs portions (6a, 8a) of the leads 6 and 8 and by subsequent thermocompression bonding. Further, the mounting of the semiconductor chip 2 is carried out in such a manner that the back surface 2y of the semiconductor chip 2 and the third portions (6c, 8c) of the leads 6 and 8 are positioned on the same side.

Next, a pasty conductive adhesive (e.g., a lead-free solder paste) is applied onto the drain electrode 4 formed on the back surface 2y of the semiconductor chip 2, then the header 7 is positioned on the drain electrode 4 through the adhesive, and subsequently the adhesive 10 is melted and cured to connect the header 7 to the drain electrode 4 electrically and mechanically.

In this step, the drain electrode 4 is formed continuously so as to cover the back surface 2y of the semiconductor chip 2 and also a part of side faces of the chip, so that a fillet 10a of the adhesive 10 is formed to cover a part of side faces of the semiconductor chip 2. As a result, the strength of connection between the semiconductor chip 2 and the header 7 is improved and the reliability against heat is enhanced.

Next, the upper and lower surfaces of the lead frame 20 are inverted from the state of FIG. 18 to the state of FIG. 11. Thereafter, as shown in FIG. 21, the lead frame 20 is positioned between an upper half 25a and a lower half 25b of a molding die 25. The positioning of the lead frame 20 is performed in the presence of an insulating sheet 27 between the lead frame 20, as well as the header 7, and the lower half 25b. The positioning of the lead frame 20 is performed in a state in which the semiconductor chip 2, the leads (6, 8) and the header 7 are positioned in the interior of a cavity 26 formed in the molding die 25. Further, the positioning of the lead frame 20 is performed in a state in which the first portion 6a of the lead 6 is in contact with an inner surface of the cavity 26 which confronts the first lead. In this step, the first portion 8a of the lead 8 is smaller in thickness than the first portion 6a of the lead 6, and an upper surface of the first portion 8a of the lead 8 is positioned closer to the main surface 2x of the semiconductor chip 2 than an upper surface of the first portion 6a of the lead 6, so that a gap is formed between the first portion 8a of the lead 8 and the inner surface of the cavity 26.

Next, a thermosetting resin is injected under pressure from a pot of the molding die 25 into the cavity 26 through a runner and a resin pouring gate to form a resin sealing member 11 as shown in FIG. 22. In this step the semiconductor chip 2 is sealed with the resin sealing member 11. The first portion 6a of the lead 6 is exposed from a main surface 11x of the resin sealing member 11, as shown in FIG. 23. The third portions (6c, 8c) of the leads 6 and 8, as well as the header 7, are exposed from the back surface 11y of the resin sealing member 11. Further, as shown in FIG. 23, the third portions (6c, 8c) of the leads 6 and 8 project from a first side face 11z of the resin sealing member 11, while the header 7 projects from a second side face 11z of the resin sealing member.

Next, as shown in FIG. 24, the connection 7a between two headers 7 is cut off and the third portions (6c, 8c) of the leads 6 and 8 are cut off from the lead frame body 21, whereby the power transistor of this first embodiment is nearly completed. The cutting of the leads 6 and 8 is performed in a projected state of the third portions (6c, 8c) of the leads 6 and 8 from the first side face 11z of the resin sealing member 11.

As set forth above, the following effects are obtained by this first embodiment.

It is possible to provide a novel power transistor 1A which exhibits a high heat dissipating property and high connection reliability during mounting.

It is possible to provide a novel power transistor 1A which is high in heat dissipating property and permits visual inspection of whether soldering is good or bad at the time of mounting.

It is possible to provide a novel power transistor high in both heat dissipating property and reliability.

It is possible to provide a novel power transistor 1A high in heat dissipating property and suitable for the reduction of thickness.

It is possible to provide a novel power transistor 1A high in heat dissipating property and suitable for the reduction of size.

It is possible to provide a novel regulator 40A having a high reliability against heat.

(First Modification of the First Embodiment)

FIG. 25 is a sectional view of a principal portion, showing a schematic construction of a regulator according to a first modification of the first embodiment.

In a regulator 40A of this first modification, as shown in FIG. 25, for example a solder material 44a is used as a heat conducting member, and the first portion 6a of the lead exposed from the main surface 11x of the resin sealing member 11 in the power transistor 1A is fixed to the heat dissipating member 43 through the solder material 44a.

At the time of thus connecting the first portion 6a of the lead 6 to the heat dissipating member 43 through the solder material 44a, it is not necessary to use a mask because the first portion 8a of the lead 8 is positioned in the interior of the resin sealing member 11. Consequently, it is possible to reduce the manufacturing cost of the regulator 40B.

(Second Modification of the First Embodiment)

Figure 26A:
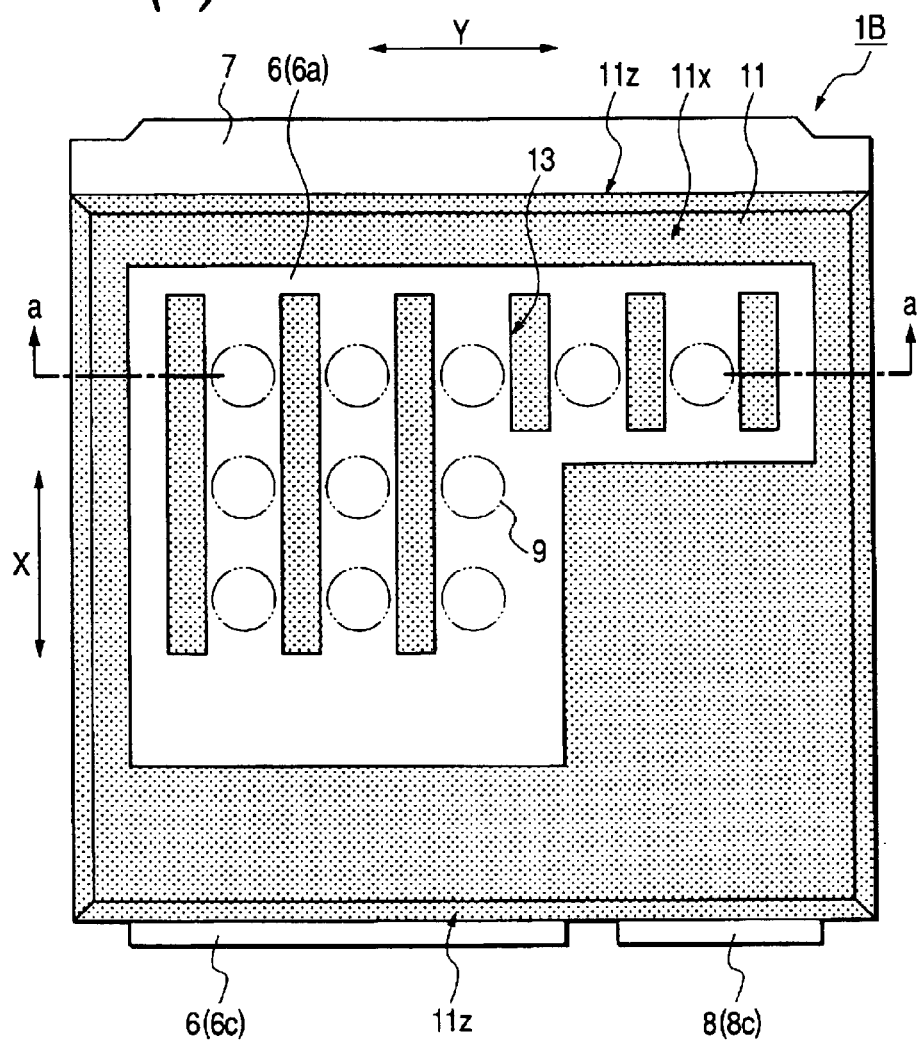
Figure 26B:
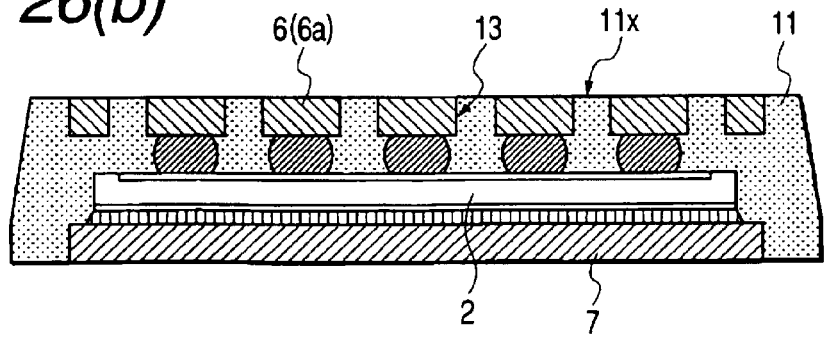

FIGS. 26(a) and 26(b) show an internal structure of a power transistor according to a second modification of the first embodiment, in which FIG. 26(a) is a plan view and FIG. 26(b) is a sectional view taken along line a—a in FIG. 26(a).

In a power transistor 1B of this second modification, as shown in FIG. 26, slits 13 are formed through the first portion 6a of the lead 6 so as to extend from an upper surface of the first portion 6a to an opposite lower surface thereof. The slits 13 are formed in the other portion than the area where salient electrodes 9 are formed. In this second modification, a plurality of stripe-like slits 13 extend in X direction.

With such a concentration, it is possible to suppress a stress on bumps which stress is caused by a difference in thermal expansion coefficient between the semiconductor chip 2 and the lead 6, so that it is possible to enhance the reliability of the power transistor 1B. Particularly, since the first portion 6a of the lead 6 is formed at as wide an area as possible for the purpose of improving the heat dissipating property, it is important that the slits 13 be formed for relaxing the stress concentrated on the salient electrodes 9.

However, since the formation of the slits 13 leads to deterioration of the heat dissipating property, it is necessary that the number and size of the slits 13 be determined taking the stress concentrated on the salient electrodes 9 and heat dissipating property into account.

Further, at the time of forming the resin sealing member 11, resin is apt to get in between the main surface of the semiconductor chip 2 and the first portion 6a of the lead 6, so it is possible to suppress the formation of voids.

Although the slits 13 formed in this second modification extends in X direction, the extending direction of the slits 13 is not limited thereto, but slits extending for example in Y direction, or slits extending obliquely relative to X and Y directions, will also do. What is important is to form the slits 13 so as to be each positioned between adjacent salient electrodes 7. It is preferable that the number of slits 13 be determined according to the number of salient electrodes 9. As the case may be, only one slit may be formed.

(Third Modification of the First Embodiment)

Figure 27A:
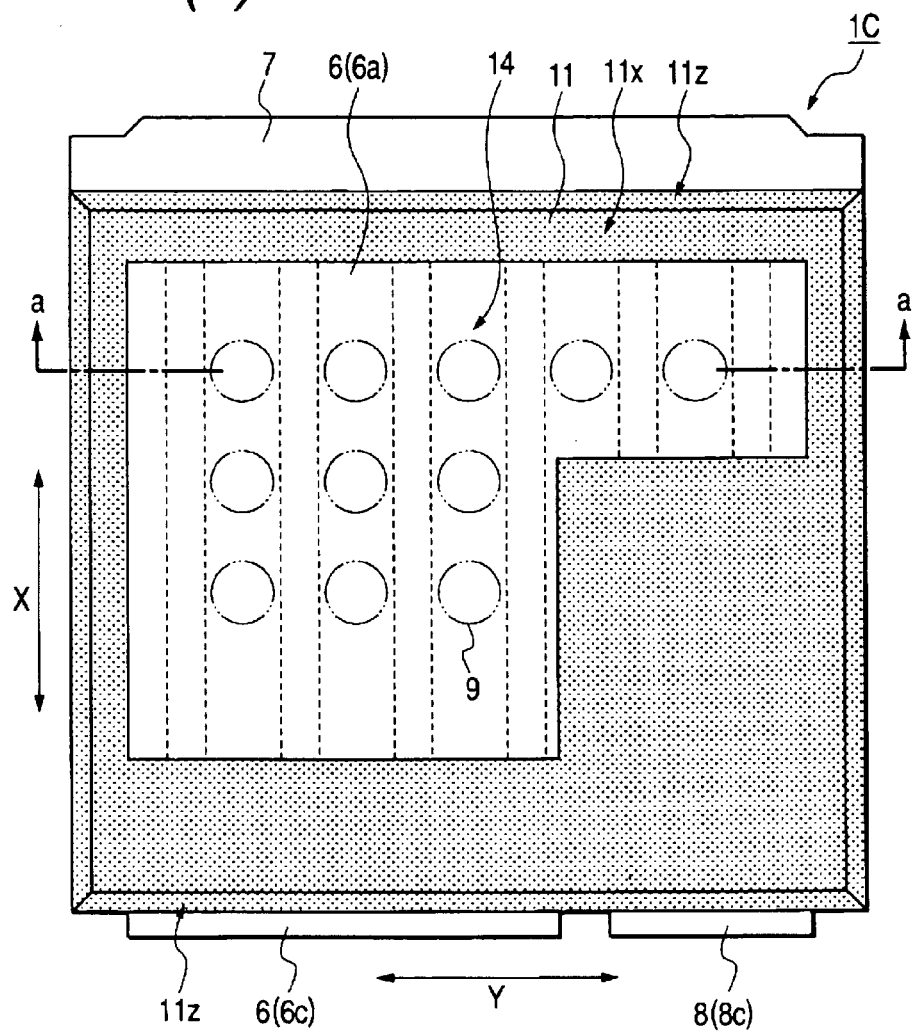
Figure 27B:
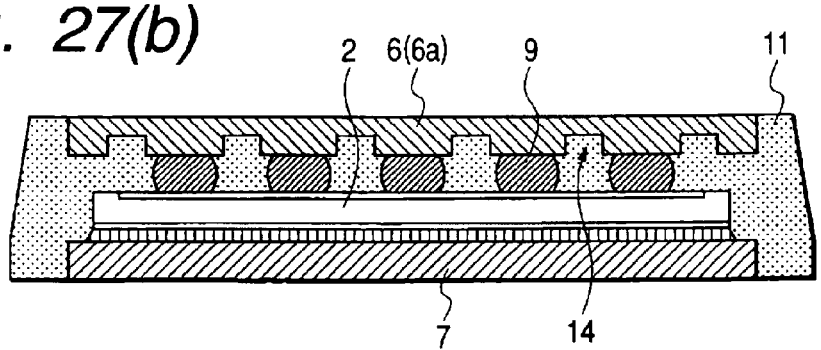

FIGS. 27(a) and 27(b) illustrate an internal structure of a power transistor according to a third modification of the first embodiment, in which FIG. 27(a) is a plan view and FIG. 27(b) is a sectional view taken along line a—a in FIG. 27(a).

In a power transistor 1C of this third modification, grooves 14 are formed in the first portion 6a of the lead 6. The grooves 14 are recessed from the lower surface (the surface which confronts the chip) of the first portion 6a of the lead 6 toward the opposite upper surface thereof and are formed in the other portion than the area where bumps 9 are formed. In this third modification there are formed a plurality of stripe-like grooves 14 extending in X direction.

According to such a construction, it is possible to suppress a stress concentration on the salient electrodes 9 without causing a great deterioration of heat dissipating property. Besides, as in the previous second modification, it is possible to suppress the formation of voids.

Although the grooves 14 formed in this third modification extend in X direction, the extending direction of the grooves 14 is not limited thereto. For example, grooves extending in Y direction, or grooves extending obliquely relative to both X and Y directions, will also do. What is important is to form the grooves 14 so as to be positioned between adjacent salient electrodes 9. As to the number of grooves 14, it is preferably determined according to the number of salient electrodes 9. As the case may be, it may be unity.

(Fourth Modification of the First Embodiment)

Figure 28A:
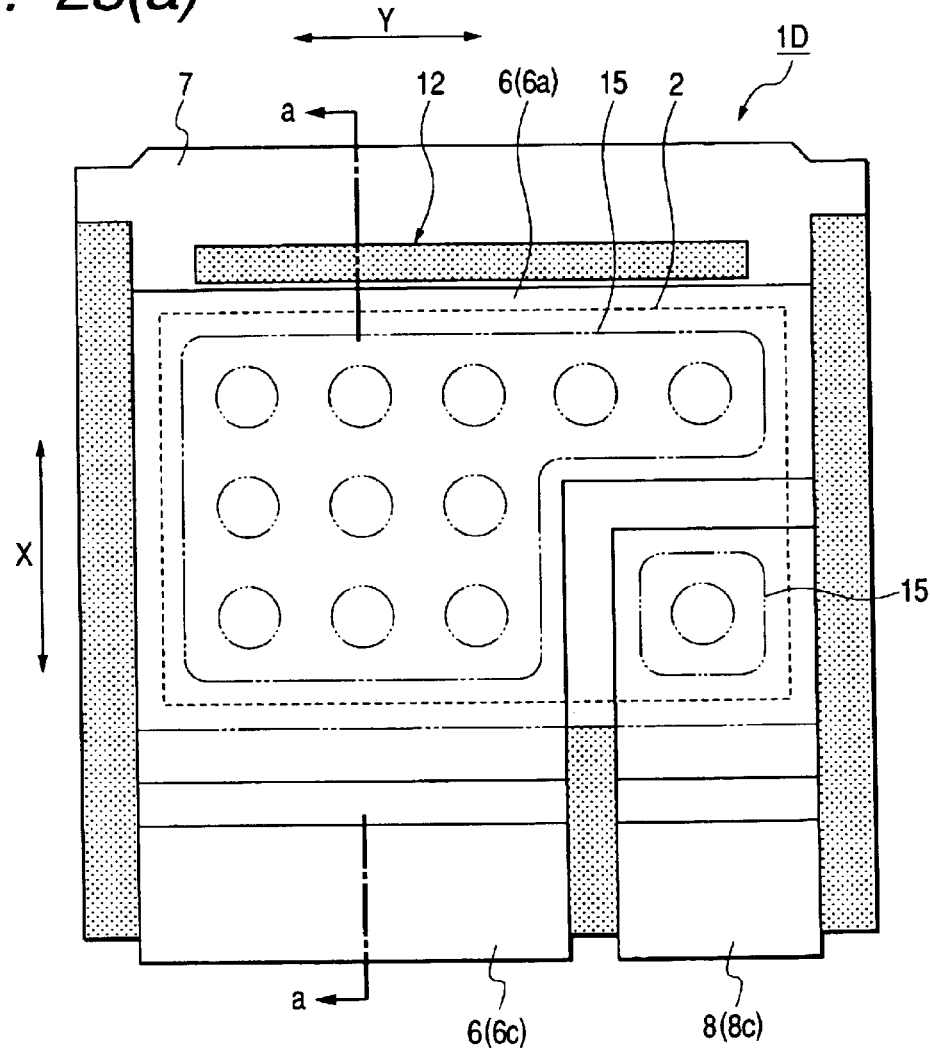
Figure 28B:
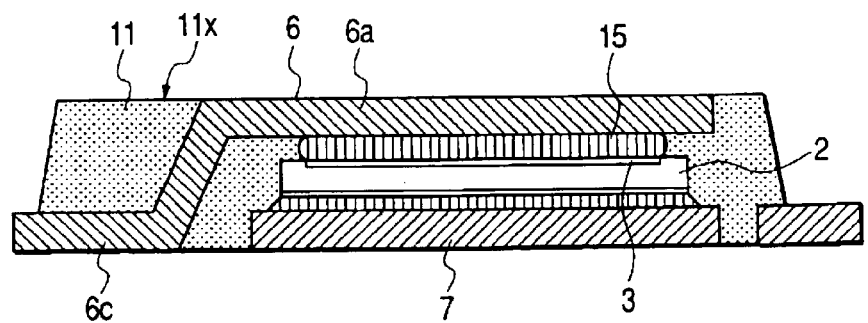

FIGS. 28(a) and 28(b) illustrate an internal structure of a power transistor according to a fourth modification of the first embodiment, in which FIG. 28(a) is a plan view and FIG. 28(b) is a sectional view taken along line a—a in FIG. 28(a).

A power transistor 1D of this fourth embodiment uses an electrically conductive adhesive 15 (e.g., a solder material) as connecting means for connection between the source electrode 3 of the semiconductor chip 2 and the first portion 6a of the lead 6. According to this construction, the amount of resin of the resin sealing member 11 interposed between the source electrode 3 of the semiconductor chip 2 and the first portion 6a of the lead 6 becomes smaller, so that the heat dissipating property can be further enhanced.

(Fifth Modification of the First Embodiment)

Figure 29A:
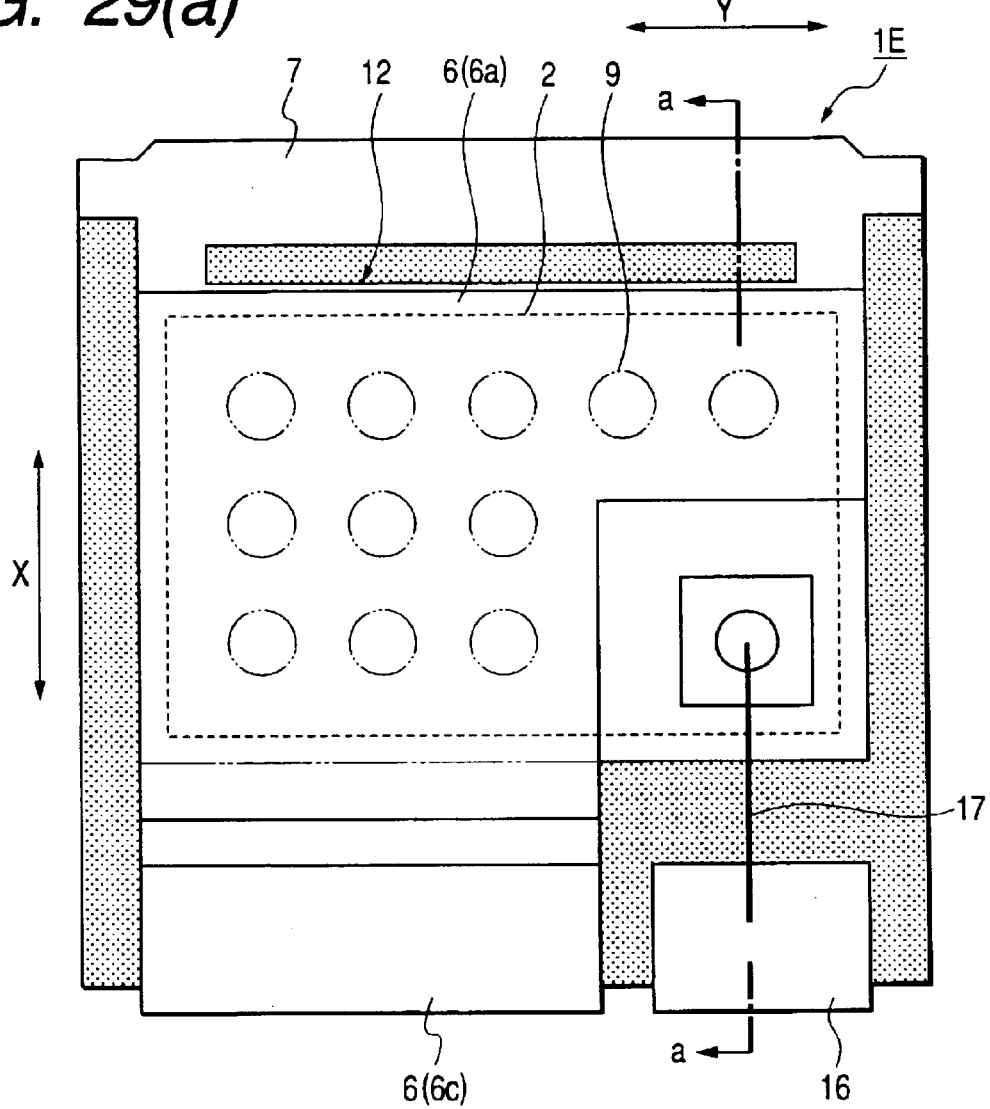
Figure 29B:
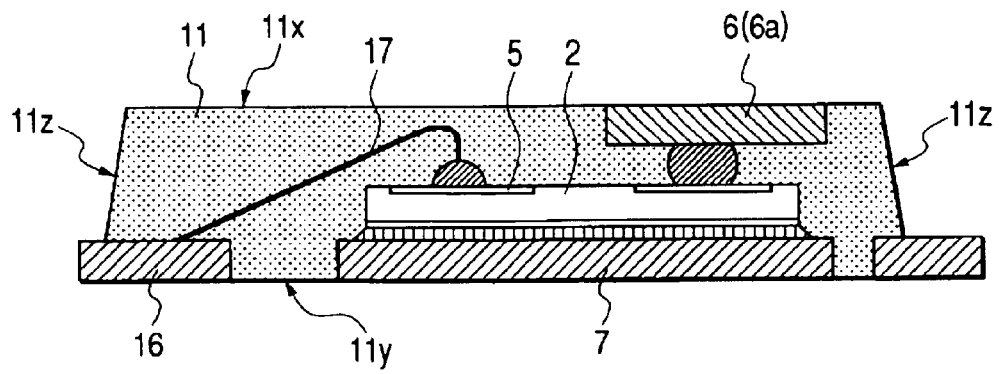

FIGS. 29(a) and 29(b) illustrates an internal structure of a power transistor according to a fifth modification of the first embodiment, in which FIG. 29(a) is a plan view and FIG. 29(b) is a sectional view taken along line a—a in FIG. 29(a).

In a power transistor 1E of this fifth embodiment, a lead 16 is positioned outside the semiconductor chip 2 and an electric connection between the gate electrode 5 of the semiconductor chip 2 and the lead 16 is effected through a bonding wire 17.

The lead 16 is positioned on the back surface 11y side relative to the main surface 11x of the resin sealing member 11 and its surface side to which the wire is connected is covered with the resin of the resin sealing member 11. Like the third portion 6c of the lead 6, the lead 16 is exposed from both back surface 11y and first side face 11z of the resin sealing member 11.

Also in this fifth modification there are obtained the same effects as in the first embodiment.

(Sixth Modification of the First Embodiment)

Figure 30:
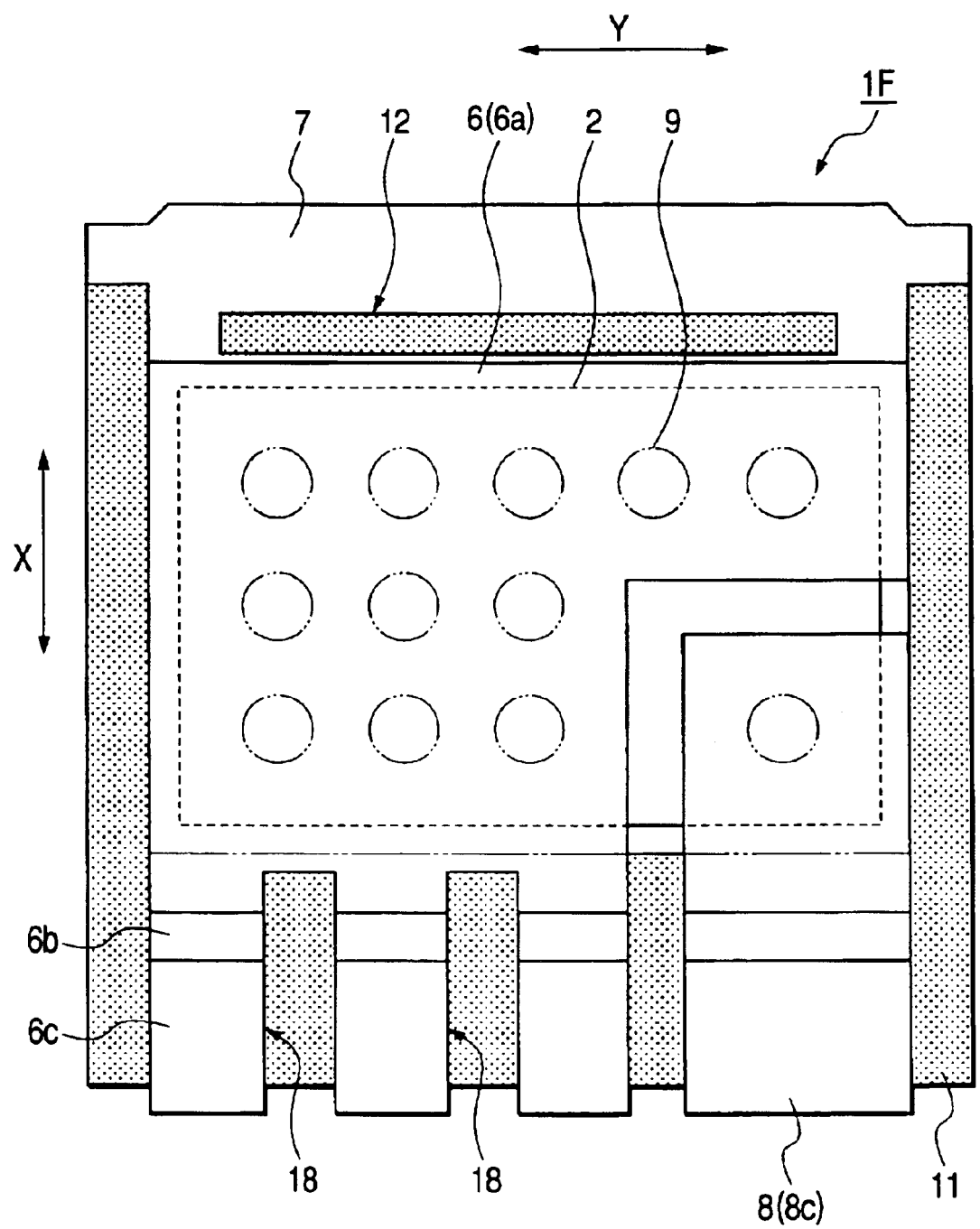
FIG. 30 is a plan view illustrating an internal structure of a power transistor according to a sixth modification of the first embodiment.

FIG. 30 is a plan view illustrating an internal structure of a power transistor according to a sixth modification of the first embodiment.

In a power transistor 1F of this sixth modification, slits 18 extending from the tip of the third portion 6c of the lead 6 toward the first portion 6a of the lead are formed in the lead 6. In this sixth modification, two such slits 18 are provided, extending from the tip of the third portion 6c up to the first portion 6a.

According to this construction, even if the width of the lead 6 is increased for attaining a low ON resistance and improving the heat dissipating property, it is possible to make the bending work for the lead 6 less difficult, so that it is possible to increase the productivity in the lead bending work.

(Seventh Modification of the First Embodiment)

FIG. 31 is a sectional view illustrating an internal structure of a power transistor according to a seventh modification of the first embodiment.

In a power transistor 1G of this seventh modification, as shown in FIG. 31, grooves 19 are formed in the first portion 6a of the lead 6. The grooves 19 are recessed from the lower surface (the surface which confronts the chip) of the first portion 6a of the lead 6 toward the opposite upper surface and are formed in the area to which the salient electrodes 9 are connected.

Also in this seventh modification there are obtained the same effects as in the third modification. Besides, since the height of each salient electrode 9 can be offset by each groove 19, it is possible to thin the power transistor 1G.

(Second Embodiment)

Figure 32A:
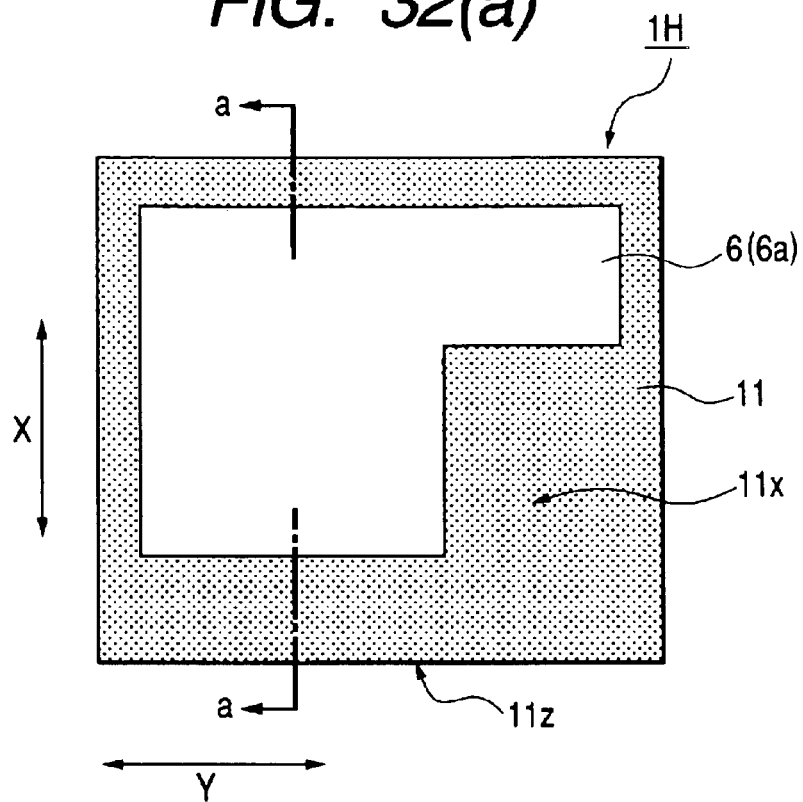
Figure 32B:
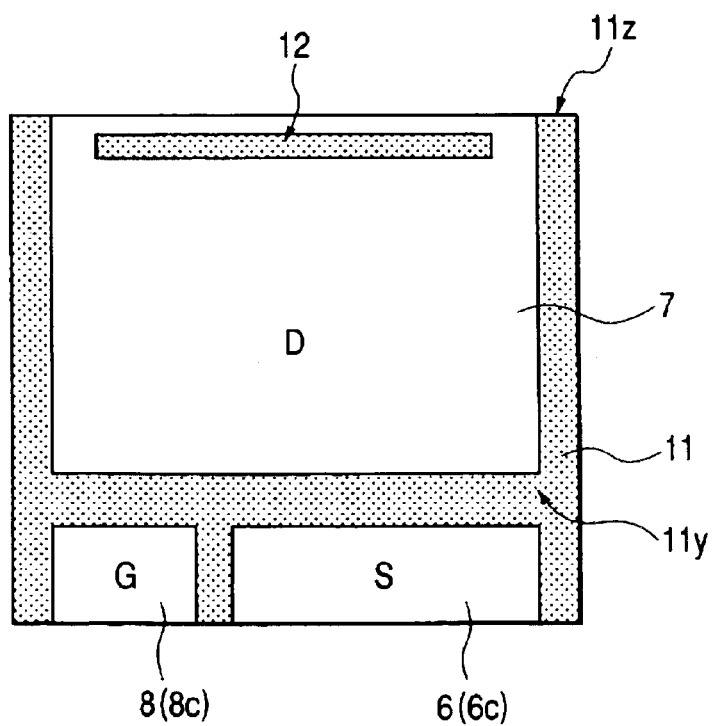
Figure 33:
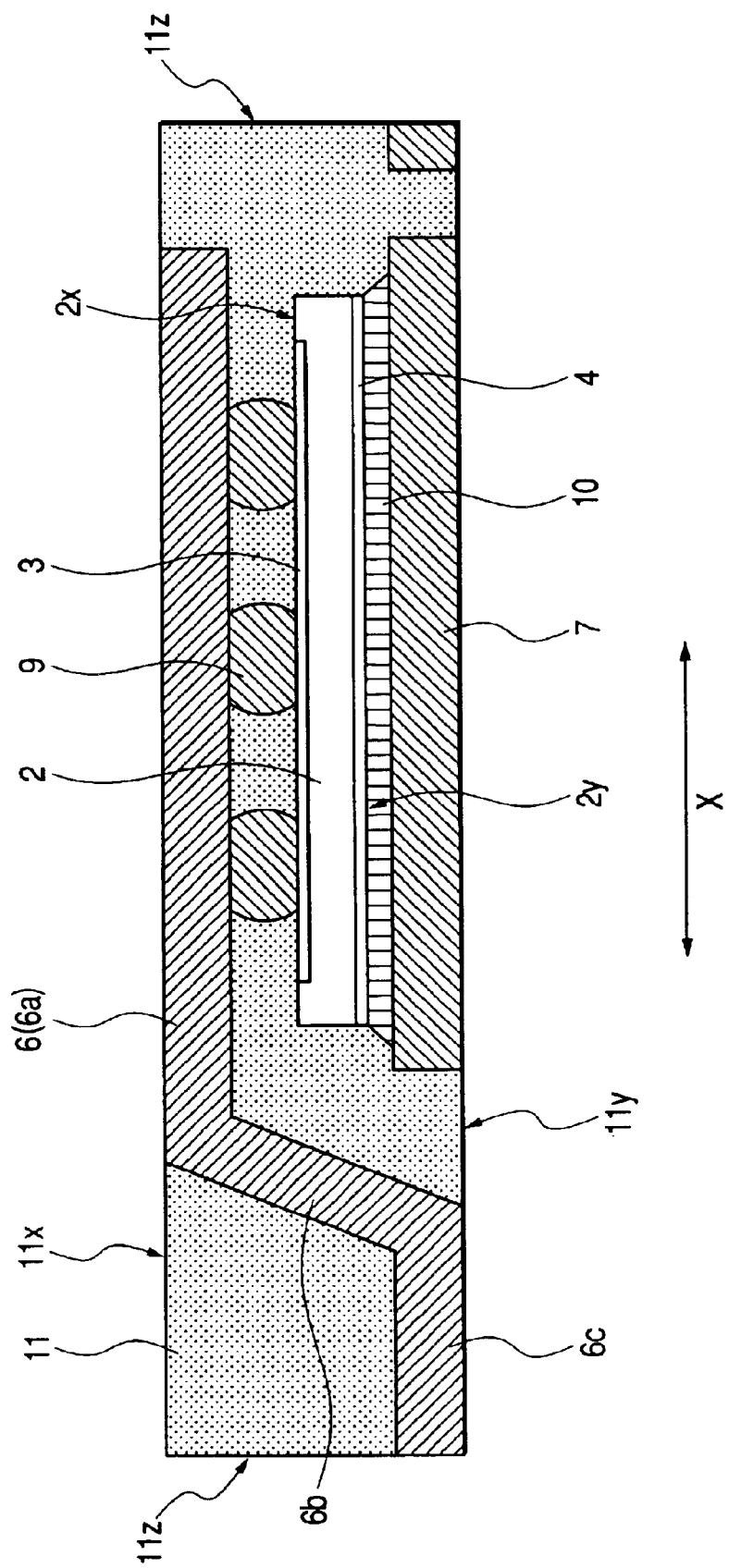
FIG. 33 is a sectional view taken along line a—a in FIG. 32(a)

FIGS. 32(a) and 32(b) illustrate appearance of a power transistor according to a second embodiment of the present invention, in which FIG. 32(a) is a plan view (top view) and FIG. 32(b) is a bottom view (underside view), and FIG. 33 is a sectional view taken along line a—a in FIG. 32(a).

In a power transistor 1H of this second embodiment, as shown in FIGS. 32 and 33, a main surface 11x of a resin sealing member 11 and a back surface 11y thereof are approximately the same in size and shape and side faces 11z of the resin sealing member 11 are approximately perpendicular to the main surface 11x and back surface 11y. Such a power transistor 1H can be formed by sealing all of plural semiconductor chips 2 with one resin sealing member and by subsequently dicing the resin sealing member, lead frame and header into individual semiconductor chips 2. Also in this case, as shown in FIGS. 32 and 33, the first portion 6a of the lead 6 is exposed from the main surface (upper surface) 11x of the resin sealing member 11, the third portions (6c, 8c) of the leads 6 and 8 are exposed from the back surface (lower surface, mounting surface) 11y and first side face 11z of the resin sealing member 11, and the header 7 is exposed from the back surface 11y and second side face 11z of the resin sealing member 11.

Also in such a power transistor 1H constructed as above of this second embodiment, the present invention is applicable and there are obtained the same effects as in the first embodiment.

(Third Embodiment)

Figure 34:
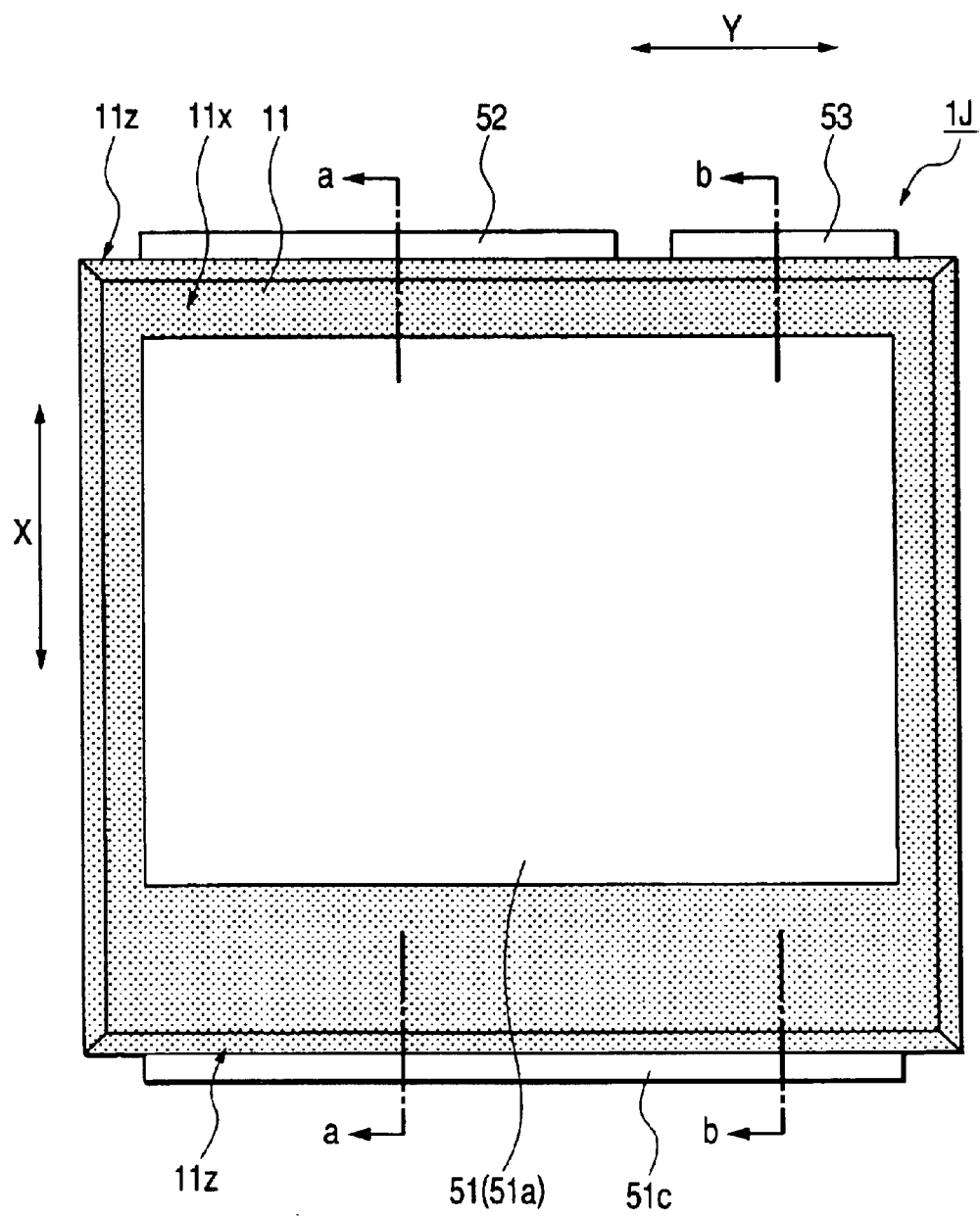
FIG. 34 is a plan view (top view) showing an appearance of a power transistor according to a third embodiment of the present invention.
Figure 35:
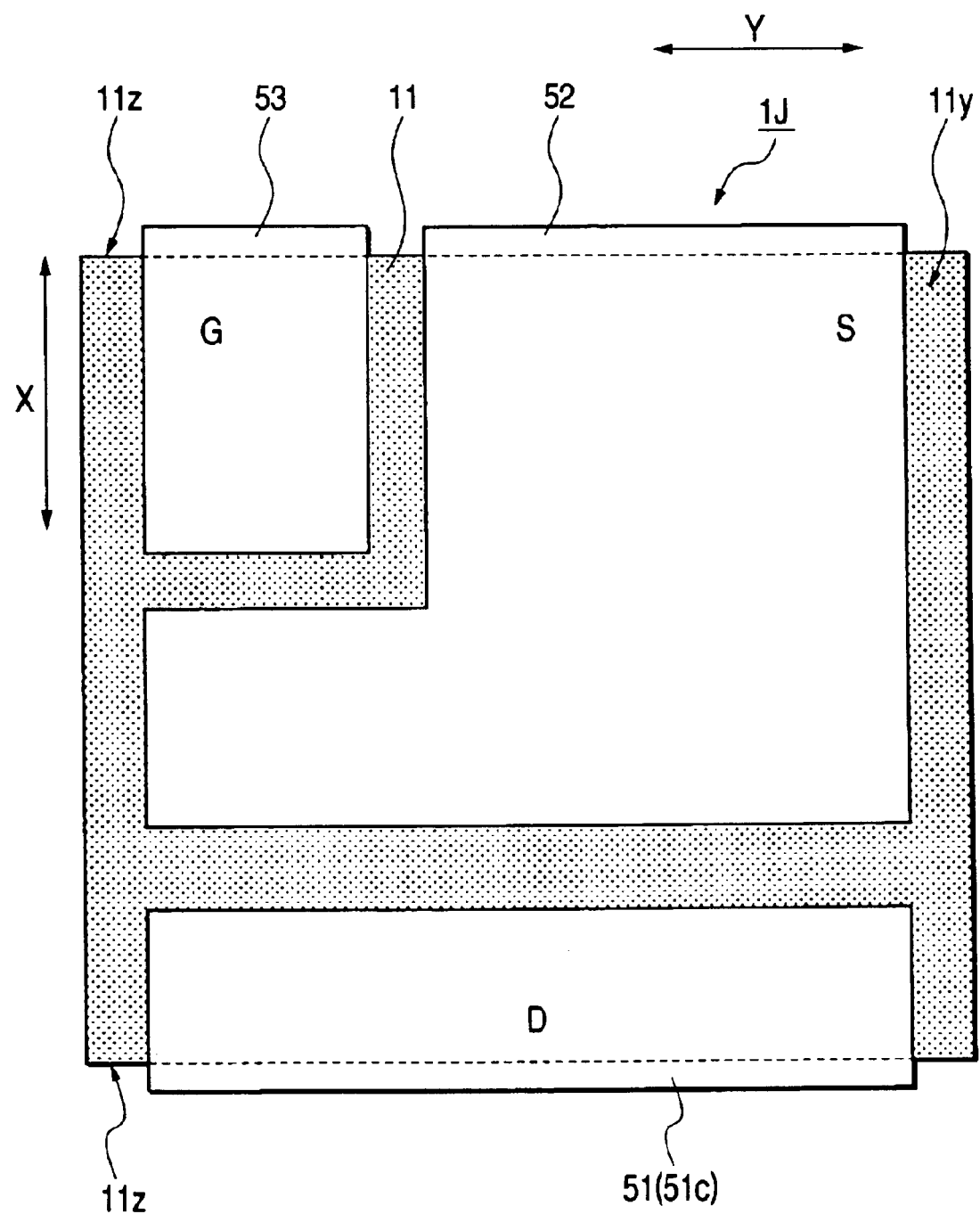
FIG. 35 is a bottom view (underside view) showing an appearance of the power transistor of the third embodiment.
Figure 36:
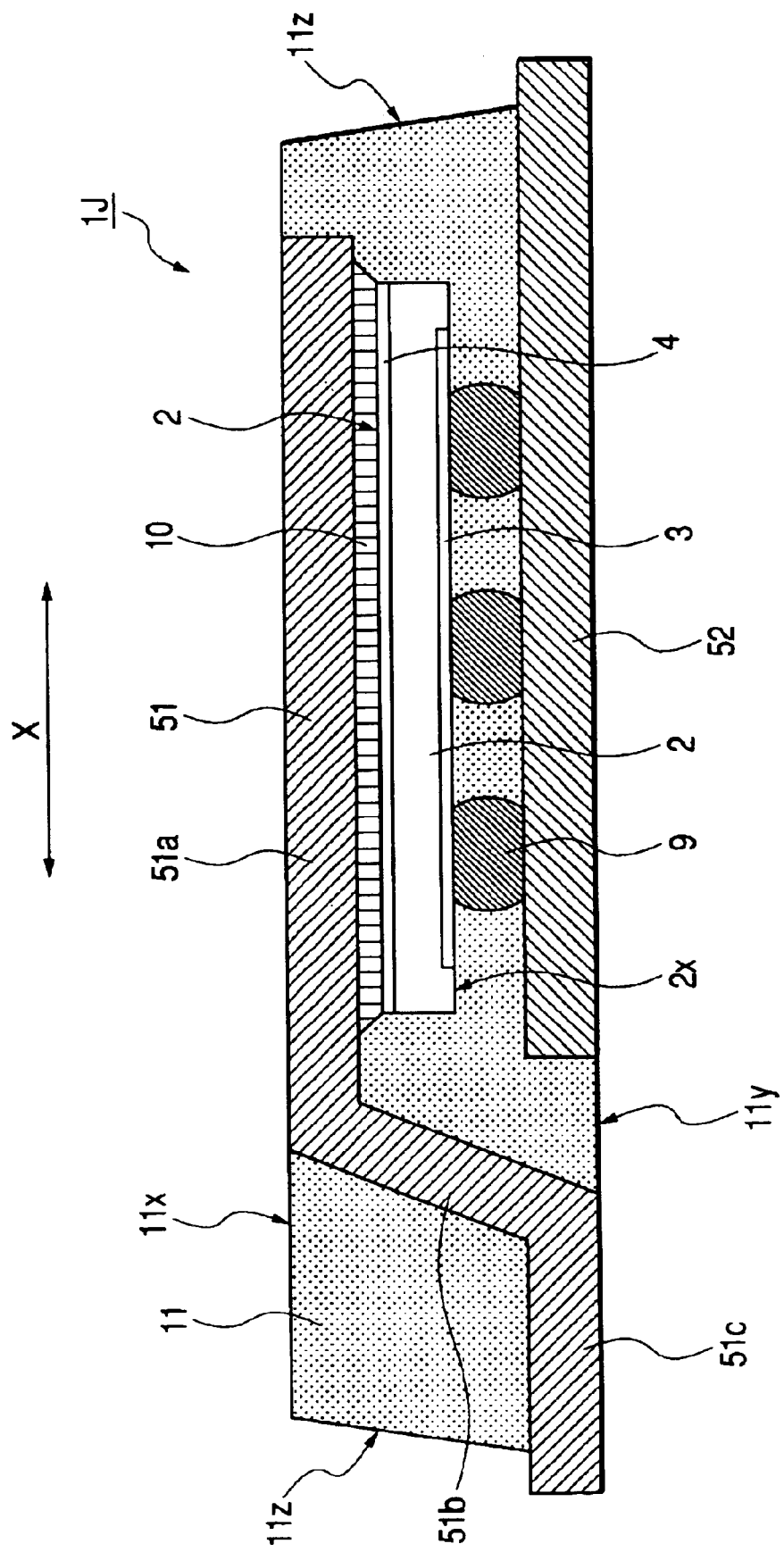
FIG. 36 is an enlarged sectional view taken along line a—a in FIG. 35.
Figure 37:
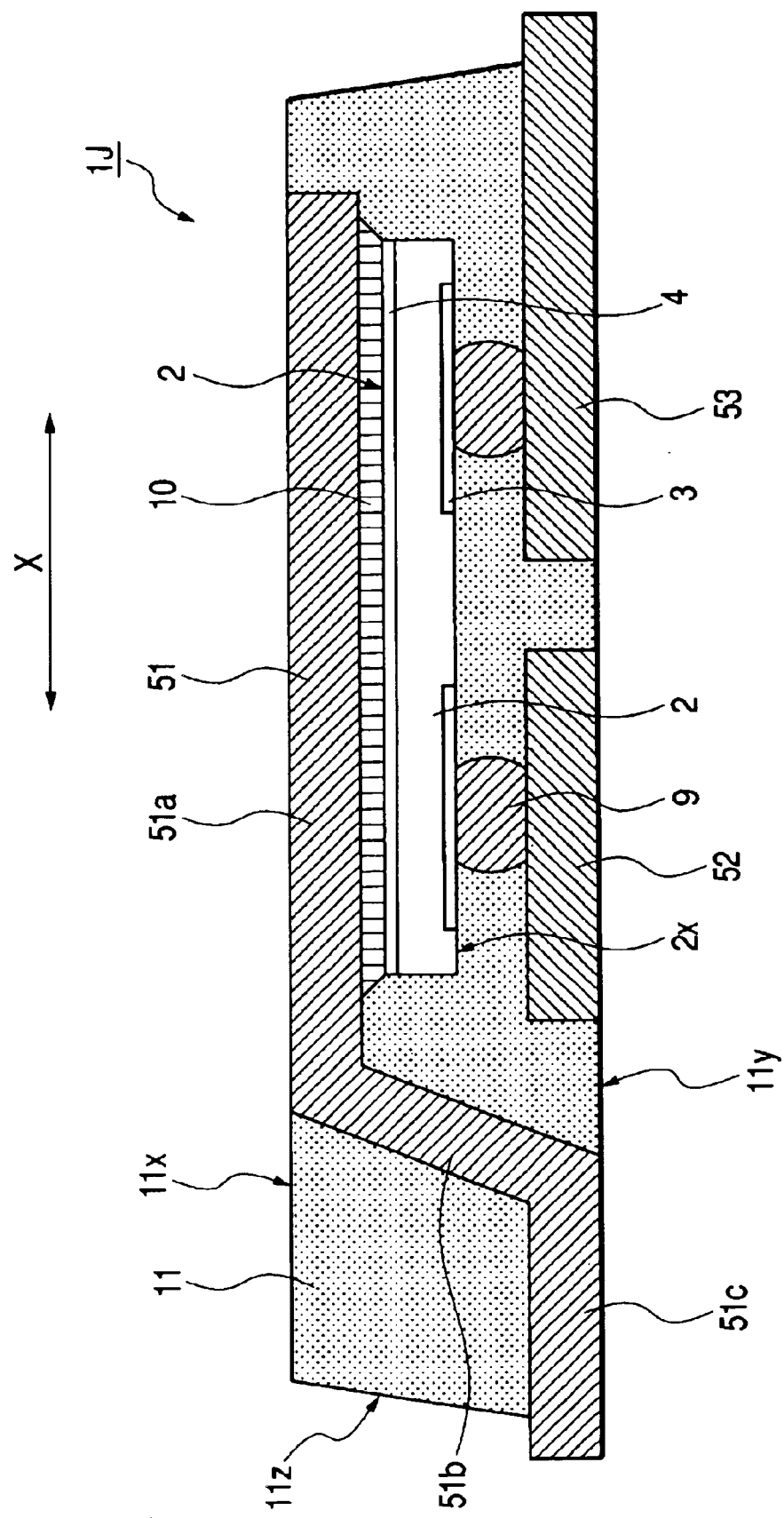
FIG. 37 is an enlarged sectional view taken along line b—b in FIG. 35.

FIG. 34 is a plan view (top view) showing an appearance of a power transistor according to a third embodiment of the present invention, FIG. 35 is a bottom view (underside view) showing an appearance of the power transistor of the third embodiment, FIG. 36 is an enlarged sectional view taken along line a—a in FIG. 34, and FIG. 37 is an enlarged sectional view taken along line b—b in FIG. 34.

In a power transistor 1J of this third embodiment, as shown in FIGS. 34 to 37, upper and lower surfaces of the semiconductor chip 2 are inverted. More specifically, the main surface 2x of the semiconductor chip 2 is positioned on the back surface 11y side of the resin sealing member 11, while the back surface 2y of the semiconductor chip is positioned on the main surface 11x side of the resin sealing member.

Like the lead 6 used in the first embodiment, a lead 51 is formed by bending and is provided with a first portion 51a, a second portion 51b, and a third portion 51c.

The first portion 51a of the lead 51 is connected electrically and mechanically to the drain electrode 4 on the back surface 2y of the semiconductor chip 2 through adhesive 10 and is exposed from the main surface 11x of the resin sealing member 11. The third portion 51c of the lead 51 is exposed from the back surface 11y and first side face 11z of the resin sealing member 11.

A lead 52 is connected to the source electrode 3 on the main surface 2x of the semiconductor chip 2 through salient electrode 9 and is exposed from the back surface 11y and second side face 11z of the resin sealing member 11.

A lead 53 is connected to the gate electrode 5 on the main surface 2x of the semiconductor chip 2 through salient electrode 9 and is exposed from the back surface 11y and second side face of the resin sealing member 11.

Also by the power transistor 1J of this third embodiment there are obtained the same effects as in the first embodiment.

Moreover, the surface side formed with source and gate regions as substantially active regions faces down and the whole surface of the chip is covered with the lead 51. This structure is strong against an external electromagnetic noises.

(Fourth Embodiment)

Figure 38:
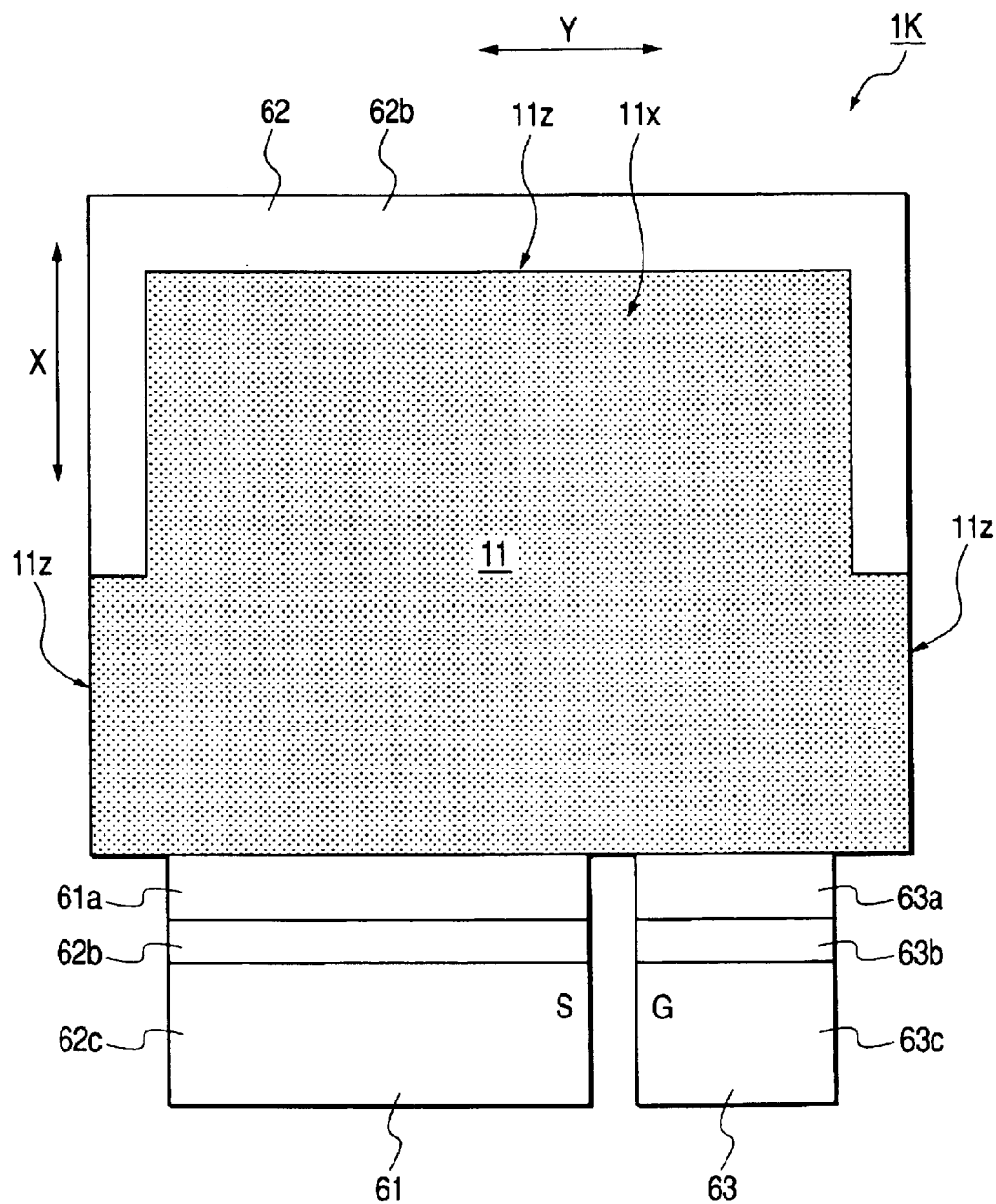
FIG. 38 is a plan view (top view) showing an appearance of a power transistor according to a fourth embodiment of the present invention.
Figure 39:
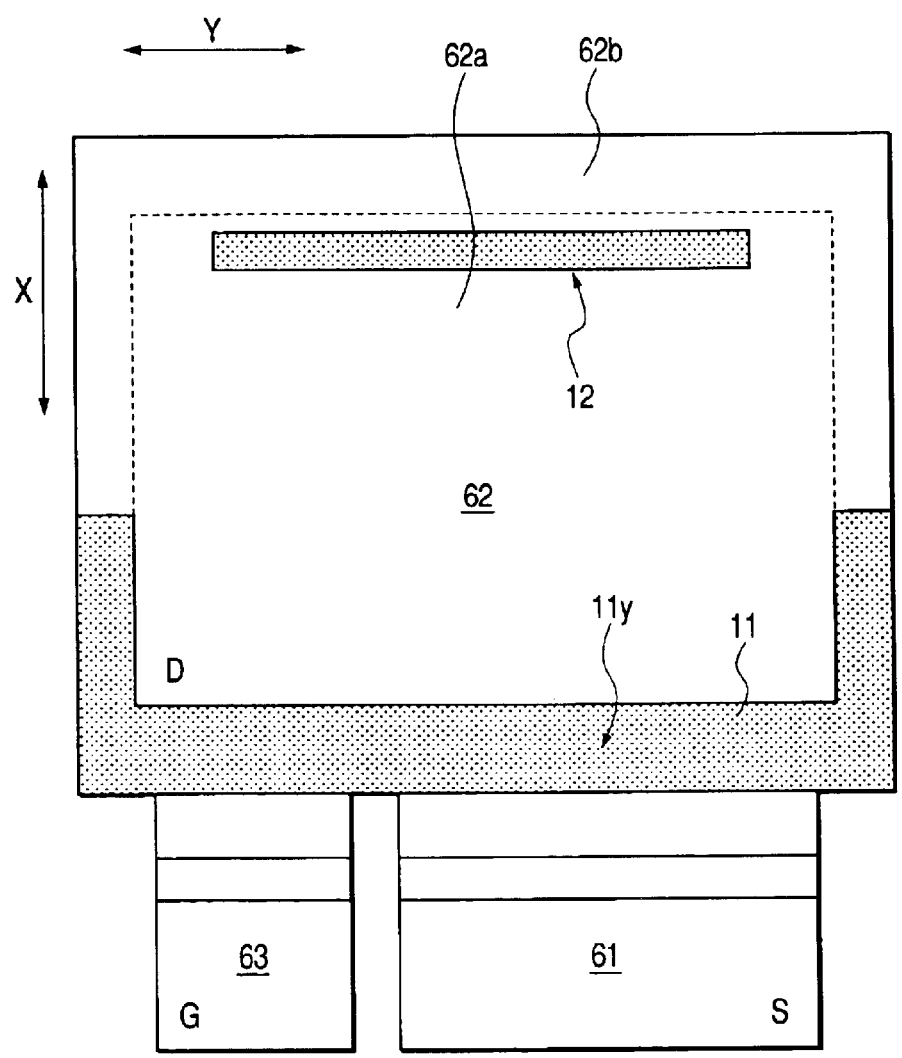
FIG. 39 is a bottom view (underside view) showing an appearance of the power transistor of the fourth embodiment.
Figure 40:
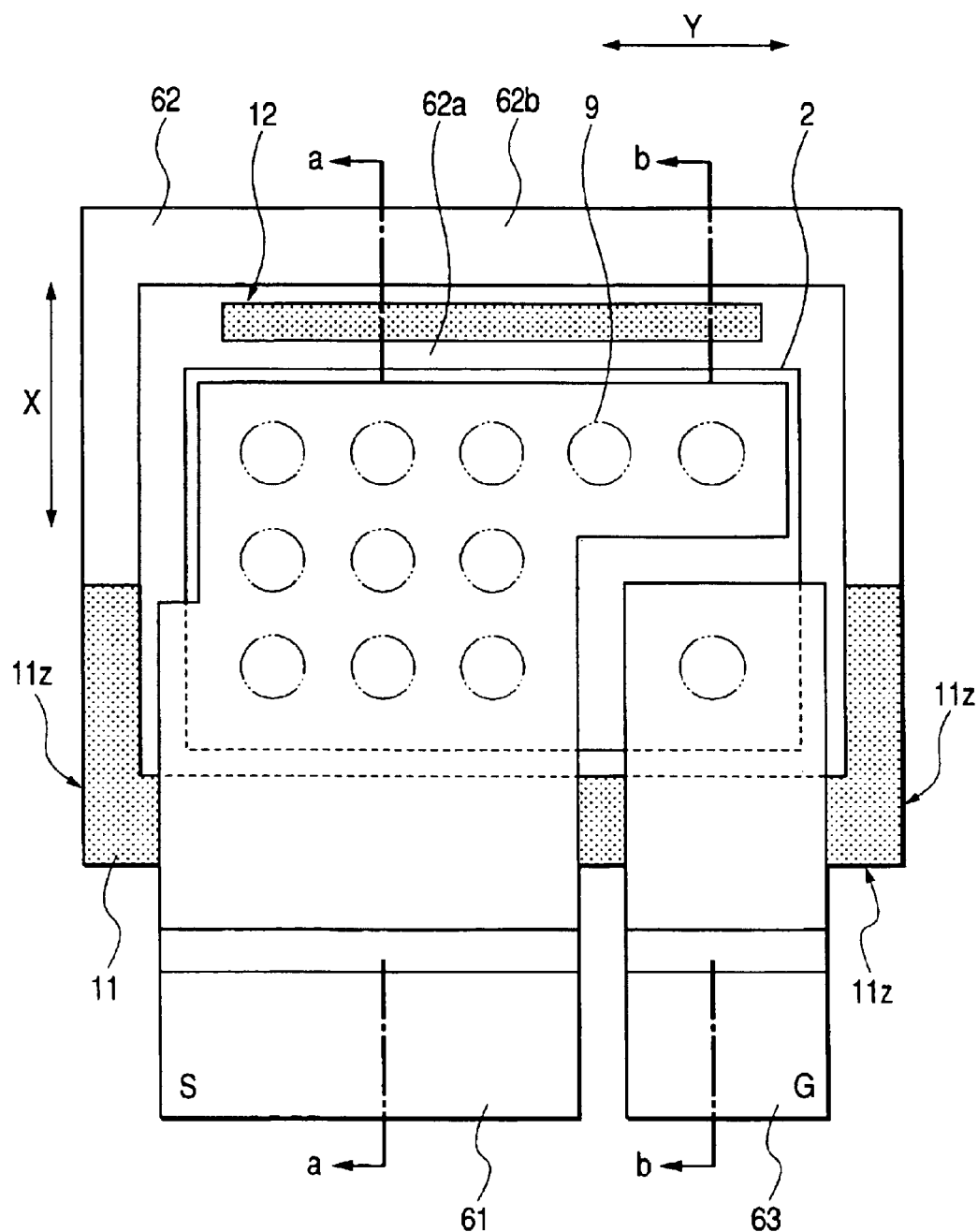
FIG. 40 is a plan view showing an internal structure of the power transistor of the fourth embodiment.
Figure 41:
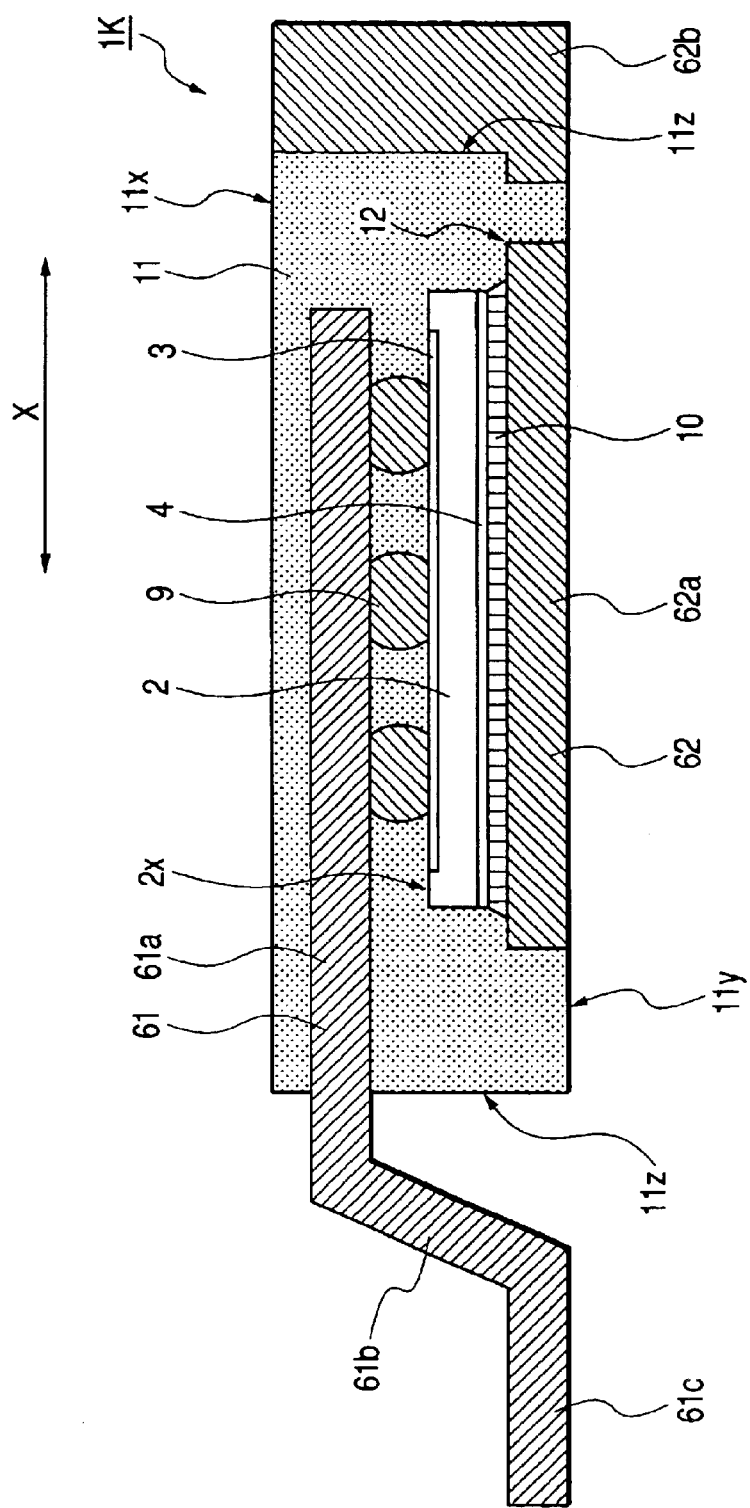
FIG. 41 is an enlarged sectional view taken along line a—a in FIG. 40.
Figure 42:
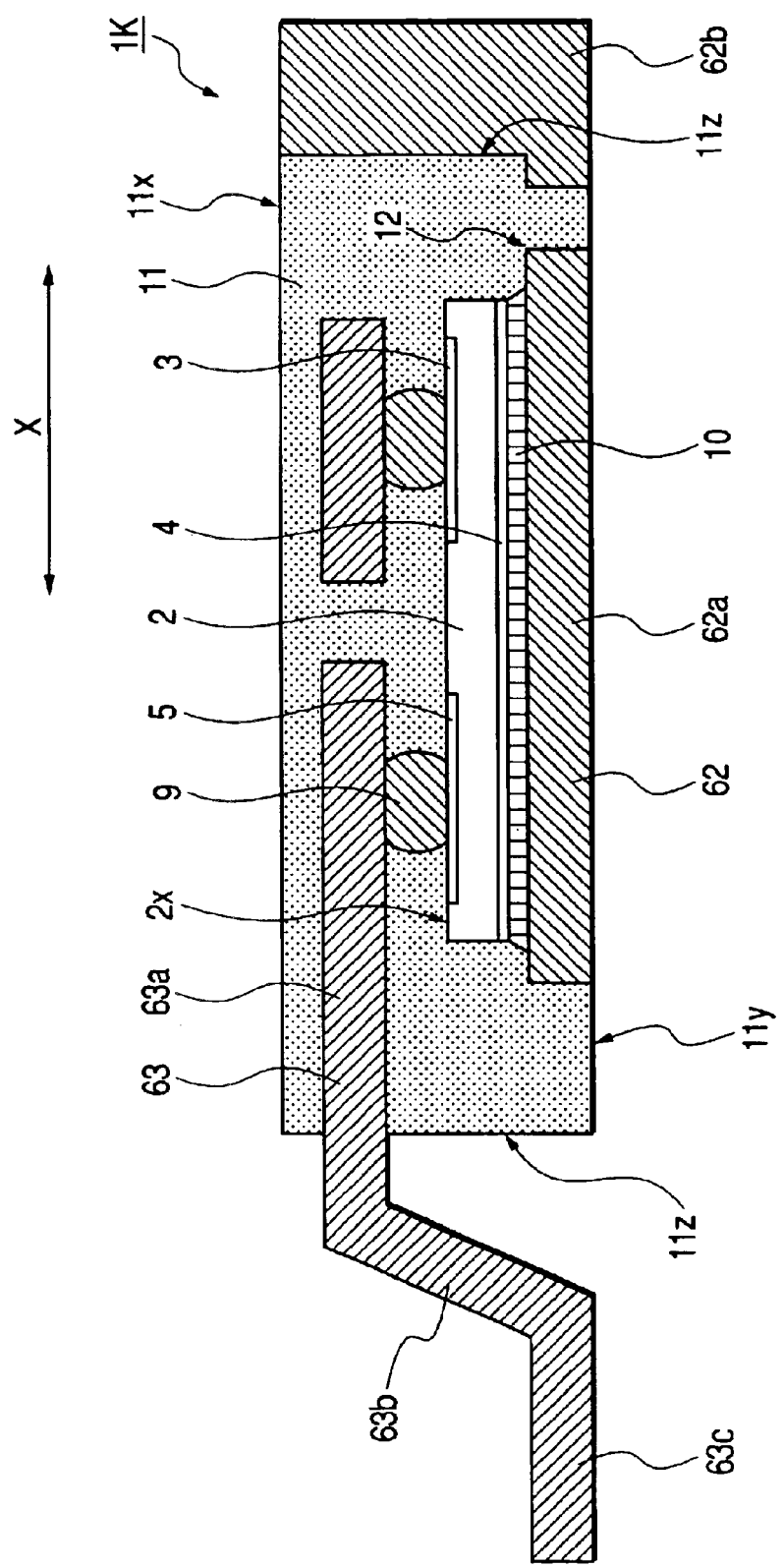
FIG. 42 is an enlarged sectional view taken along line b—b in FIG. 40.

FIG. 38 is a plan view (top view) showing an appearance of a power transistor according to a fourth embodiment of the present invention, FIG. 39 is a bottom view (underside view) of the power transistor of the fourth embodiment, FIG. 40 is a plan view showing an internal structure of the power transistor of the fourth embodiment, FIG. 41 is an enlarged sectional view taken along line a—a in FIG. 40, and FIG. 42 is an enlarged sectional view taken along line b—b in FIG. 40.

As shown in FIGS. 38 to 42, a power transistor 1K of this fourth embodiment is basically of the same construction as the first embodiment and is different in the following points from the first embodiment.

A header 62 has a first portion 62a to which the semiconductor chip 2 is adhesively fixed and a second portion 62b formed integrally with the first portion 62a and having a thikness greater than the first portion 62a.

The first portion 62a of the header 62 is exposed from the back surface 11y of the resin sealing member 11, while the second portion 62b of the header 62 is exposed from the main surface 11x of the resin sealing member. Moreover, the second portion 62b of the header 62 is exposed from the second side face 11z of the resin-sealing member 11 and is further exposed from both third and fourth side faces 11z of the resin sealing member 11 which side faces are positioned on mutually opposite sides in Y direction.

A first portion 61a of a lead 61 projects from the first side face 11z of the resin sealing member 11, while a second portion 61b and a third portion 61c of the lead 61 are positioned outside the first side face 11z of the resin sealing member 11.

A first portion 63a of the lead 63 projects from the first side face 11z of the resin sealing member 11, while a second portion 63b and a third portion 63c of the lead 63 are positioned outside the first side face 11z of the resin sealing member 11.

Also by the power transistor 1K of this fourth embodiment there are obtained the same effects as in the first embodiment.

Further, since the first portion 62a of the header 62 in this fourth embodiment is exposed from three side faces (second to fourth side faces) of the resin sealing member 11 exclusive of the first side face 11z of the resin sealing member, so that the heat dissipating property can be further enhanced.

(Fifth Embodiment)

Figure 43:
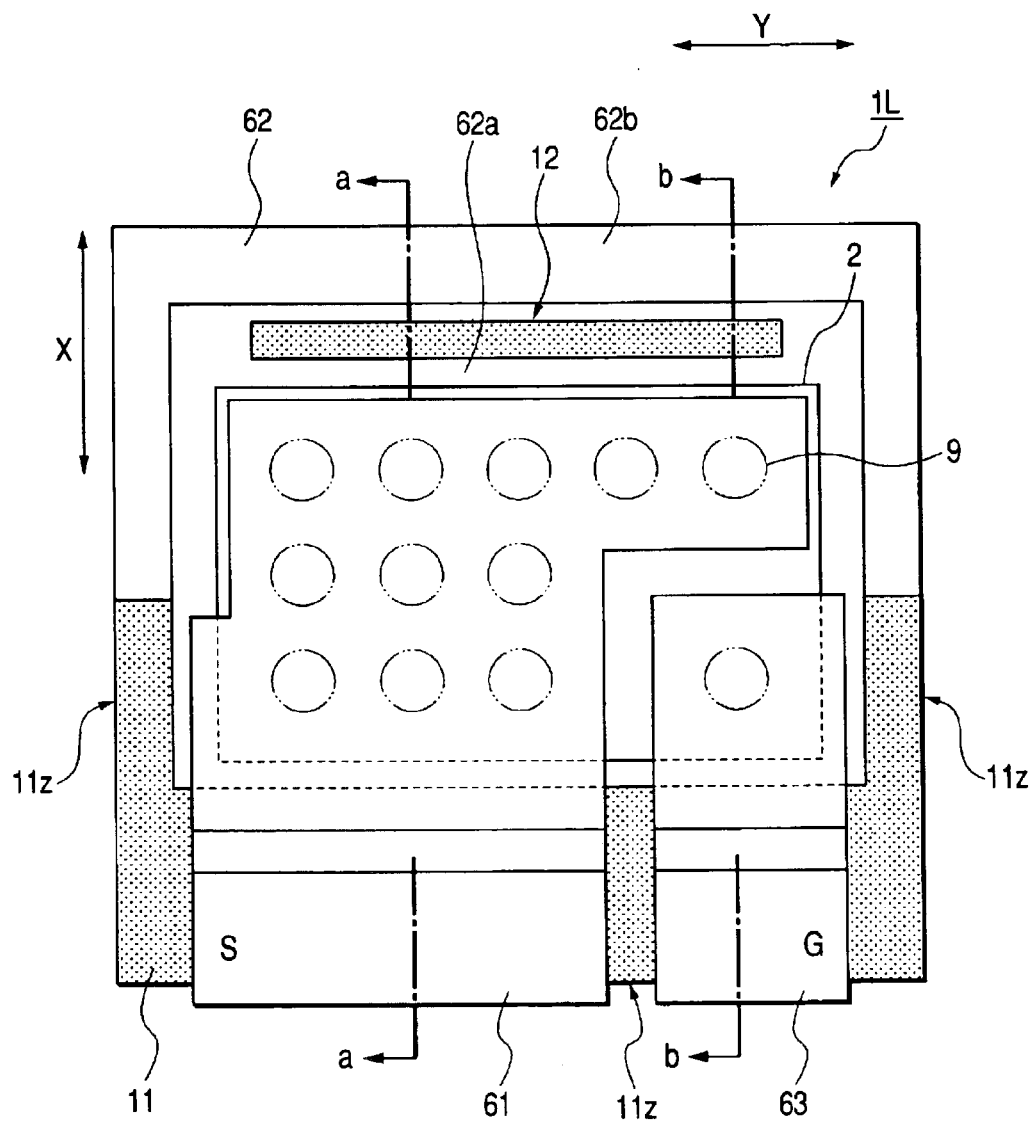
FIG. 43 is a plan view showing an internal structure of a power transistor according to a fifth embodiment of the present invention.
Figure 44A:
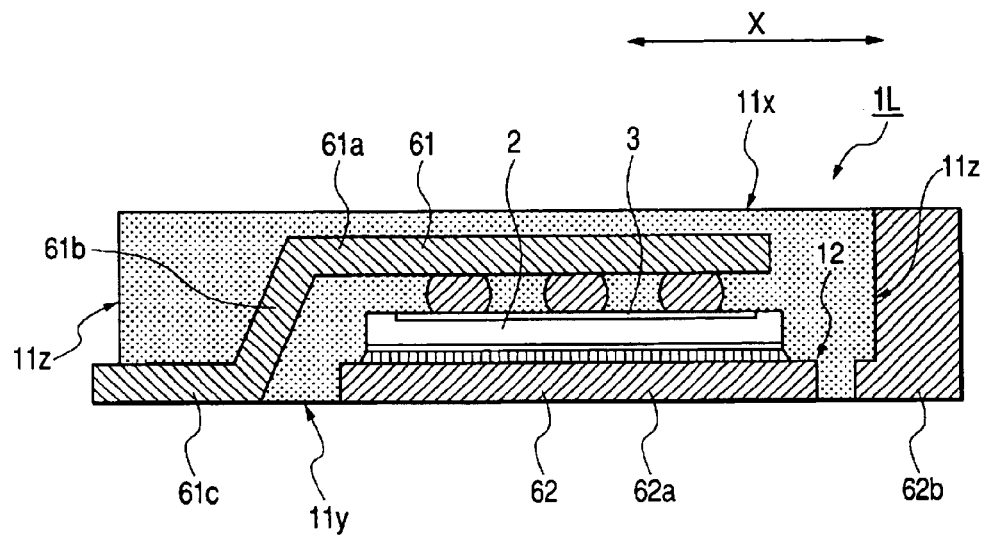
Figure 44B:
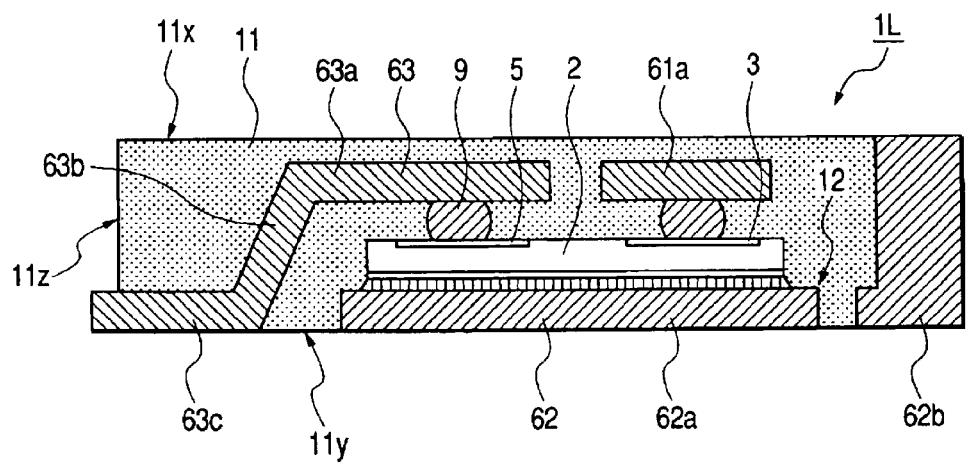

FIG. 43 is a plan view showing an internal structure of a power transistor according to a fifth embodiment of the present invention, and FIGS. 44(a) and 44(b) illustrate an internal structure of the power transistor of the fifth embodiment, in which FIG. 44(a) is a sectional view taken along line a—a in FIG. 43 and FIG. 44(b) is a sectional view taken along line b—b in FIG. 43.

A power transistor 1L of this fifth embodiment is basically of the same construction as the fourth embodiment and is different in the following points from the fourth embodiment.

As shown in FIGS. 43 and 44, the first portion 61a and second portion 61b of the lead 61 are positioned in the interior of the resin sealing member 11, while the third portion 61c of the lead 61 is exposed from both back surface 11y and first side face 11z of the resin sealing member 11. Likewise, the first portion 63a and second portion 63b of the lead 63 are positioned in the interior of the resin sealing member 11, while the third portion 63c of the lead 63 is exposed from both back surface 11y and first side face 11z of the resin sealing member 11.

Also by the power transistor 1L of this fifth embodiment there are obtained the same effects as in the first embodiment.

(Sixth Embodiment)

Figure 45:
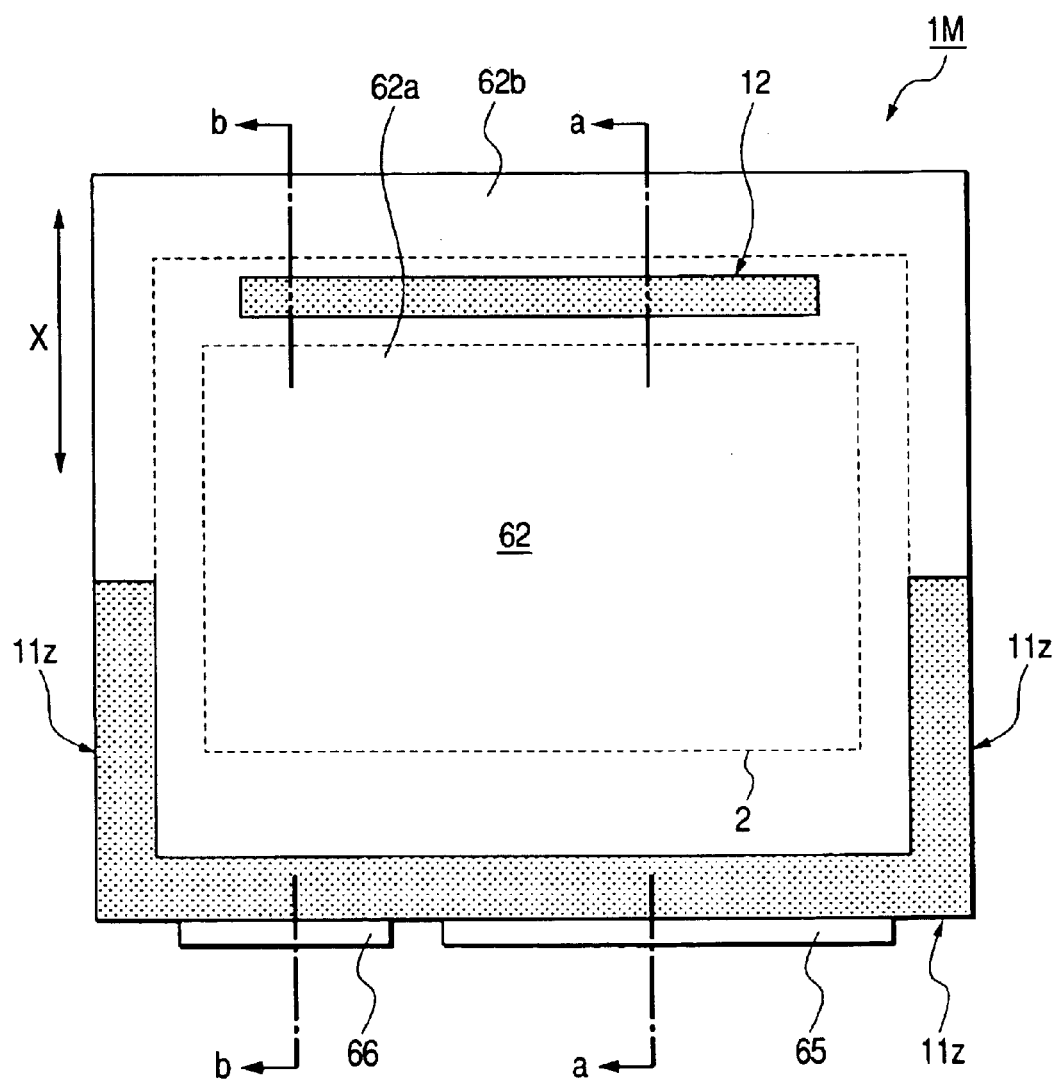
FIG. 45 is a plan view showing an appearance of a power transistor according to a sixth embodiment of the present invention.
Figure 46:
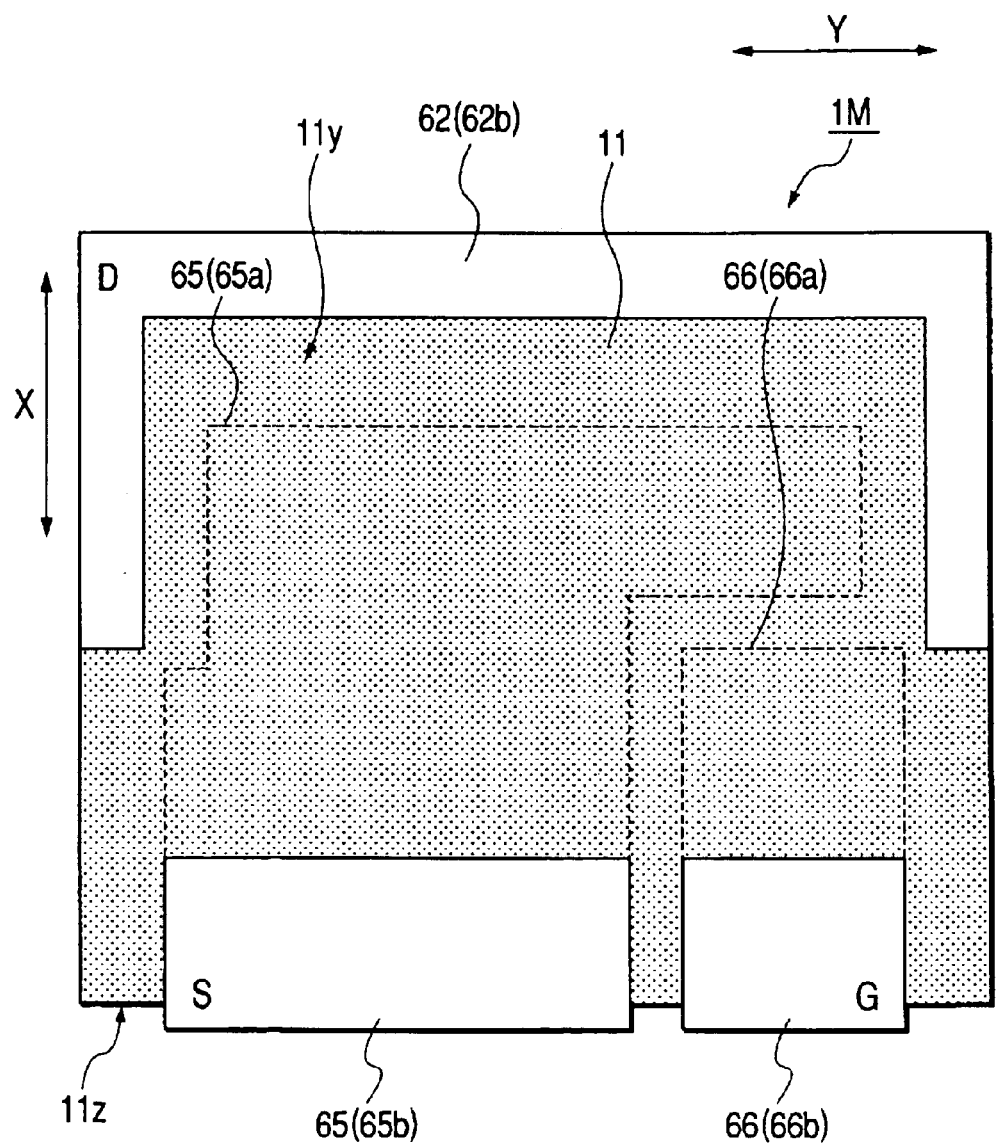
FIG. 46 is a bottom view showing an appearance of the power transistor of the sixth embodiment.
Figure 47A:
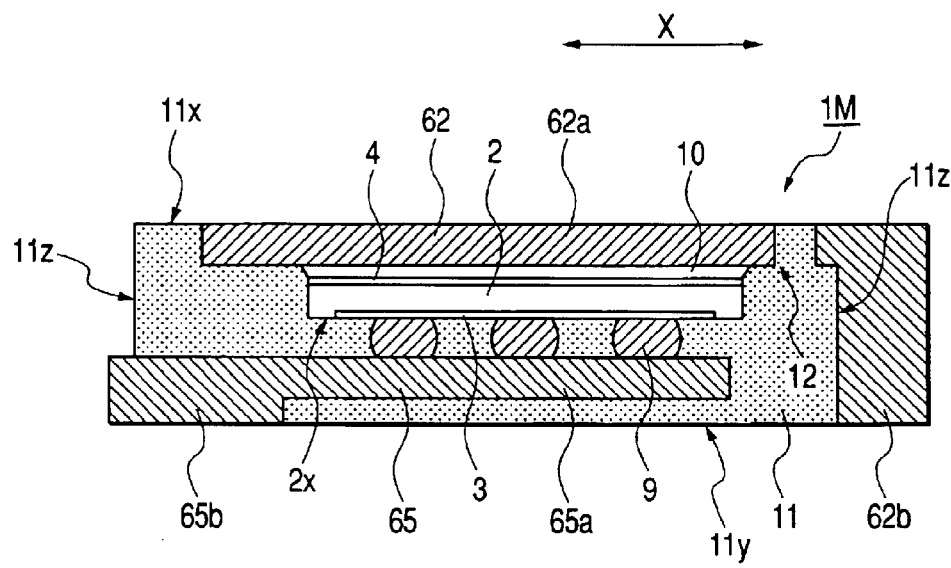
Figure 47B:
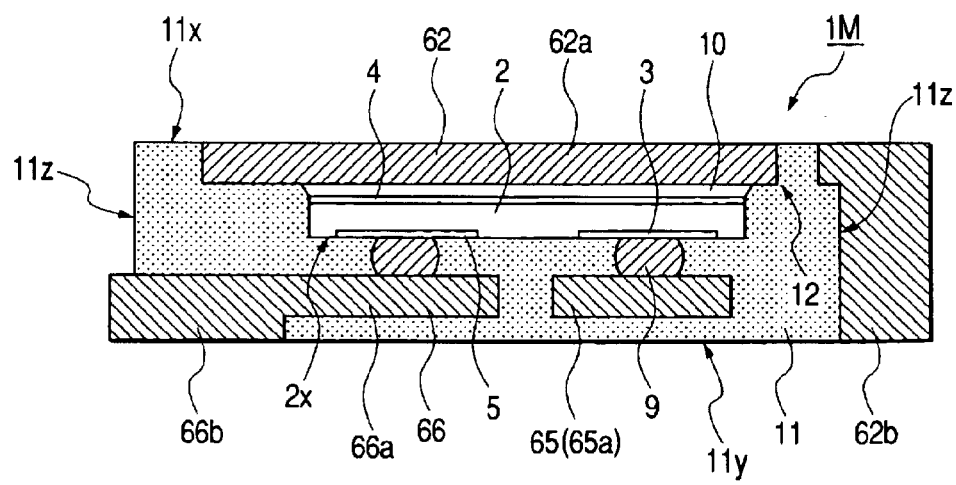
Figure 28A:
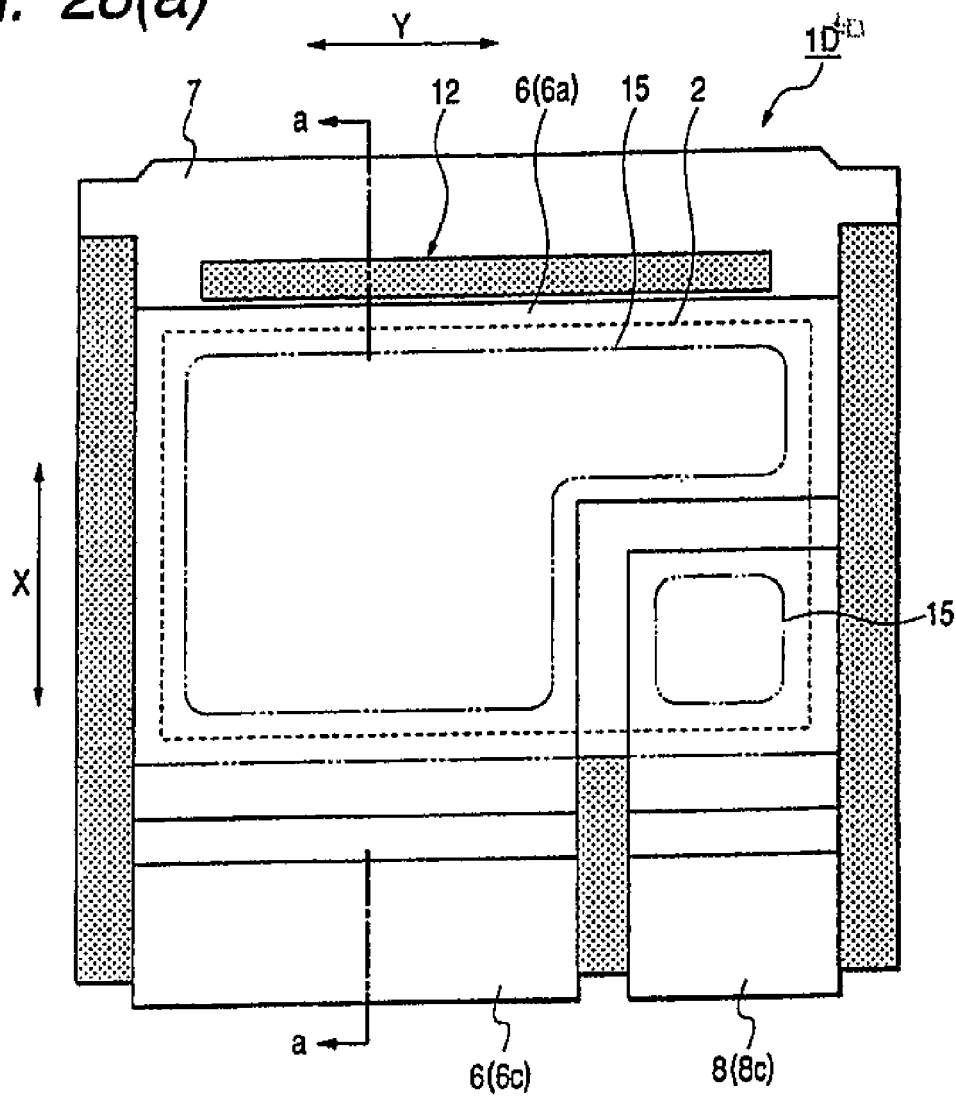
Figure 28B:
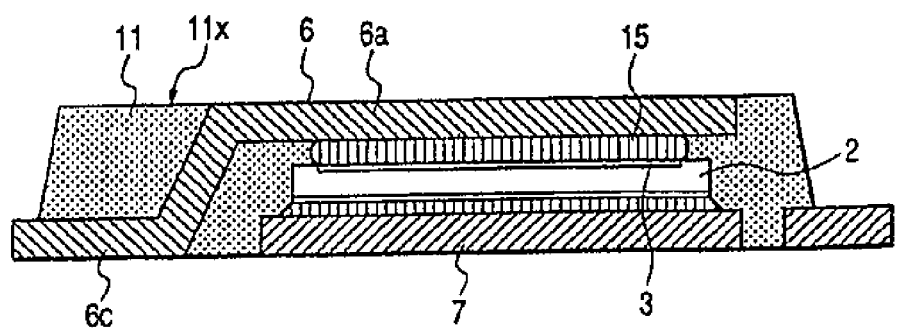

FIG. 45 is a plan view showing an appearance of a power transistor according to a sixth embodiment of the present invention, FIG. 46 is a bottom view showing an appearance of the power transistor of the sixth embodiment, and FIGS. 47(a) and 47(b) illustrate an internal structure of the power transistor of the sixth embodiment, in which FIG. 47(a) is a sectional view taken along line a—a n FIG. 45 and FIG. 47(b) is a sectional view taken along line b—b in FIG. 45.

A power transistor 1M of this sixth embodiment is different from the power transistor of the previous fifth embodiment in that the upper and lower surfaces of the semiconductor chip 2 are inverted. That is, the main surface 2x of the semiconductor chip 2 is positioned on the back surface 11y side of the resin sealing member 11, while the back surface 2y of the semiconductor chip is positioned on the main surface 11x side of the resin sealing member.

The first portion 62a of the header 62 is exposed from the main surface 11x of the resin sealing member 11, while the second portion 62b of the header is exposed from the back surface 11y of the resin sealing member.

A lead 65 has a first portion 65a and a second portion 65b formed integrally with and thicker than the first portion 65a. The first portion 65a of the lead 65 is connected electrically and mechanically to the source electrode 3 on the main surface 2x of the semiconductor chip 2 through salient electrodes 9 and is positioned in the interior of the resin sealing member 11. The second portion 65b of the lead 65 is exposed from both back surface 11y and first side face 11z of the resin sealing member 11.

A lead 66 has a first portion 66a and a second portion 66b formed integrally with and thicker than the first portion 66a. The first portion 66a of the lead 66 is connected electrically and mechanically to the gate electrode 5 on the main surface 2x of the semiconductor chip 2 through a salient electrode 9 and is positioned in the interior of the resin sealing member 11. The second portion 66b of the lead 66 is exposed from both back surface 11y and first side face 11z of the resin sealing member 11.

Thus, also by the power transistor 1M of this sixth embodiment there are obtained the same effects as in the first embodiment.

Although the present invention has been described concretely by way of the above embodiments, it goes without saying that the invention is not limited to the above embodiments, but that various changes may be made within the scope not departing from the gist of the invention.

The following is a brief description of effects obtained by typical modes of the invention as disclosed herein.

It is possible to provide a novel semiconductor device high in both heat dissipating property and connection reliability in mounting.

It is possible to provide a novel semiconductor device high in heat dissipating property and permitting visual inspection of whether soldering is good or bad in mounting.

It is possible to provide a novel semiconductor device high in both heat dissipating property and reliability.

It is possible to provide a novel semiconductor device high in heat dissipating property.

It is possible to provide an electronic device high in reliability.

What is claimed is:

1. A semiconductor device comprising:

a semiconductor chip having first and second main surfaces positioned on mutually opposite sides, a first electrode formed over the first main surface, and a second electrode formed over the second main surface;

a resin sealing member sealing the semiconductor chip, and having first and second main surfaces positioned on mutually opposite sides, the first main surface being positioned on the first main surface side of the semiconductor chip, and the second main surface being positioned on the second main surface side of the semiconductor chip;

a first conductive member in which one end side is positioned over the first electrode of the semiconductor chip and connected to the first electrode of the semiconductor chip through a first connecting means, and the other end side opposite to the one end side is positioned on the second main surface side of the resin sealing member relative to the one end side and exposed from the resin sealing member; and a second conductive member connected to the second electrode of the semiconductor chip through a second connecting means, wherein the one end side of the first conductive member is exposed from the first main surface of the resin sealing member, wherein the second conductive member is exposed from the second main surface and side faces of the resin sealing member, and wherein the one end side of the first conductive member and the other end side of the first conductive member are integral portions of the first conductive member.

2. A semiconductor device according to claim 1, wherein the second conductive member projects from side faces of the resin sealing member.

3. A semiconductor device according to claim 1,
wherein the other end side of the first conductive member is positioned on a first side-face side of the resin sealing member, and
wherein the second conductive member is exposed from a second side face opposite to the first side face of the resin sealing member.

4. A semiconductor device according to claim 1,
wherein the other end side of the first conductive member is exposed from the second main surface and a first side face of the resin sealing member, and
wherein the second conductive member is exposed from a second side face opposite to the first side face of the resin sealing member.

5. A semiconductor device according to claim 1,
wherein the first conductive member has a first portion a part of which is positioned over the first electrode of the semiconductor chip and another part of which projects to the outside of the semiconductor chip, a second portion formed integrally with the first portion, and a third portion positioned on the second main surface side of the resin sealing member relative to the first portion,
wherein the first portion is exposed from the first main surface of the resin sealing member, and
wherein the third portion is exposed from the resin sealing member.

6. A semiconductor device according to claim 5, wherein the second portion is an offset portion for spacing the first portion and the third portion from each other in the thickness direction of the resin sealing member.

7. A semiconductor device according to claim 1,
wherein the first conductive member has a first portion a part of which is positioned over the first electrode of the semiconductor chip and another part of which projects to the outside of the semiconductor chip, a second portion which is bent from the first portion to the second main surface side of the resin sealing member, and a third portion extending from the second portion in the same direction as the projecting direction of the first portion,
wherein the first portion is exposed from the first main surface of the resin sealing member, and
wherein the third portion is exposed from the resin sealing member.

8. A semiconductor device according to claim 1,
wherein the first electrode of the semiconductor chip is a source electrode, and
wherein the second electrode of the semiconductor chip is a drain electrode.

9. A semiconductor device according to claim 1,
wherein the first electrode of the semiconductor chip is a drain electrode, and
wherein the second electrode of the semiconductor chip is a source electrode.

10. A semiconductor device according to claim 1, wherein the first connecting means is a salient electrode or an electrically conductive adhesive.

11. A semiconductor device according to claim 1, wherein the second connecting means is a salient electrode or an electrically conductive adhesive.

12. A semiconductor device comprising:
a semiconductor chip having an electrode over a main surface thereof;
a conductive member positioned over the electrode of the semiconductor chip and having a connecting portion connected to the electrode of the semiconductor chip through a plurality of salient electrodes; and
a resin sealing member for sealing the semiconductor chip, the plural salient electrodes, and the conductive member,
wherein the connecting portion of the conductive member has one or plural slits.

13. A semiconductor device comprising:
a semiconductor chip having an electrode over a main surface thereof;
a conductive member positioned over the electrode of the semiconductor chip and having a connecting portion connected to the electrode of the semiconductor chip through a plurality of salient electrodes; and
a resin sealing member for sealing the semiconductor chip, the plural salient electrodes, and the conductive member,
wherein the connecting portion of the conductive member has one or plural grooves in a portion other than the area where the plural salient electrodes are connected.

14. A semiconductor device comprising:
a semiconductor chip having first and second main surfaces positioned on mutually opposite sides, a first electrode formed over the first main surface, and a second electrode formed over the second main surface;
a resin sealing member sealing the semiconductor chip, and having first and second main surfaces positioned on mutually opposite sides, the first main surface being positioned on the first main surface side of the semiconductor chip, and the second main surface being positioned on the second main surface side of the semiconductor chip;
a first conductive member positioned over the first electrode of the semiconductor chip and connected to the first electrode of the semiconductor chip through a first connecting member, the first conductive member having a first portion exposed from the first main surface of the resin sealing member, a second portion formed integrally with the first portion and positioned in the interior of the resin sealing member, and a third portion formed integrally with the second portion and exposed from the second main surface of the resin sealing member; and
a second conductive member connected to the second electrode of the semiconductor chip through a second connecting means and exposed from the second main surface of the resin sealing member,
wherein the one end side of the first conductive member and the other end side of the first conductive member are integral portions of the first conductive member, and
wherein the first, second and third portions of the first conductive member are integral portions of the first conductive member.

15. A semiconductor device according to claim 14,
wherein the third portion of the first conductive member is exposed from a first side face of the resin sealing member, and
wherein the second conductive member is exposed from a second side face opposite to the first side face of the resin sealing member.

16. A semiconductor device according to claim 14, wherein the second portion is an offset portion for spacing the first portion and the second portion from each other in the thickness direction of the resin sealing member.

17. A semiconductor device according to claim 14,
wherein the first electrode of the semiconductor chip is a source electrode, and
wherein the second electrode of the semiconductor chip is a drain electrode.

18. A semiconductor device according to claim 14,
wherein the first electrode of the semiconductor chip is a drain electrode, and
wherein the second electrode of the semiconductor chip is a source electrode.

19. A semiconductor device comprising:
a semiconductor chip including a MISFET;
a drain electrode of the MISFET formed on a top surface of the semiconductor chip;
a gate electrode and a source electrode formed on a bottom surface of the semiconductor chip;
a drain lead positioned over the drain electrode and electrically connected with the drain electrode;
a source lead positioned under the source electrode and electrically connected with the source electrode;
a gate lead positioned under the gate electrode and electrically connected with the gate electrode;
a sealing member sealing the semiconductor chip and the drain, source and gate leads,
wherein the source lead is exposed from a bottom surface of the sealing member;
the drain lead is comprised of a first portion, second portion and a third portion;
the first portion of the drain lead is exposed from a top surface of the sealing member;
the second portion of the drain lead is positioned inside the sealing member;
the third portion of the drain lead is positioned below the semiconductor chip; and
the first, second and third portions of the drain leads are integral portions of a single conductive member.

20. A semiconductor device according claim 19, the gate lead and the third portion of the drain lead are exposed from the bottom surface of the sealing member.

21. A semiconductor device comprising:
a semiconductor chip including a MISFET;
a first electrode of the MISFET formed on a top surface of the semiconductor chip;
a second electrode formed on a bottom surface of the semiconductor chip;
a first lead positioned over the first electrode and electrically connected with the first electrode;
a second lead positioned under the second electrode and electrically connected with the second electrode;
a sealing member sealing the semiconductor chip and the first and second leads,
wherein the second lead is exposed from a bottom surface of the sealing member;
the first lead is comprised of a first portion, a second portion and a third portion;
the first portion of the first lead is exposed from a top surface of the sealing member;
the second portion of the first lead is positioned inside the sealing member
the third portion of the first lead is positioned below the semiconductor chip;
the first, second and third portions of the first lead are integral portions of a single conductive member;
the first lead and the first electrode are connected by a first conductive adhesive; and
the second lead and the second electrode are connected by a second conductive adhesive.

22. A semiconductor device according claim 21, the first and second conductive adhesive are solder materials.

* * * * *

UNITED STATES PATENT AND TRADEMARK OFFICE
CERTIFICATE OF CORRECTION

| | | |
|---|---|---|
| PATENT NO. | : 6,992,385 B2 | Page 1 of 2 |
| APPLICATION NO. | : 10/755375 | |
| DATED | : January 31, 2006 | |
| INVENTOR(S) | : Y. Satou et al. | |

It is certified that error appears in the above-identified patent and that said Letters Patent is hereby corrected as shown below:

SHEET 27 of 46

Please replace Figs. 28(a) and 28(b) with the attached replacement sheet of Figs. 28(a) and 28(b)

Signed and Sealed this

Twelfth Day of December, 2006

JON W. DUDAS
*Director of the United States Patent and Trademark Office*